(12) United States Patent
Kunikiyo et al.

(10) Patent No.: US 7,230,435 B2
(45) Date of Patent: Jun. 12, 2007

(54) CAPACITANCE MEASUREMENT CIRCUIT

(75) Inventors: Tatsuya Kunikiyo, Tokyo (JP); Tetsuya Watanabe, Tokyo (JP); Toshiki Kanamoto, Tokyo (JP); Kyoji Yamashita, Kyoto (JP)

(73) Assignees: Renesas Technology Corp., Tokyo (JP); Matsushita Electric Industrial Co., Ltd., Kadoma-shi (JP)

( * ) Notice: Subject to any disclaimer, the term of this patent is extended or adjusted under 35 U.S.C. 154(b) by 19 days.

(21) Appl. No.: 10/760,449

(22) Filed: Jan. 21, 2004

(65) Prior Publication Data
US 2004/0207412 A1 Oct. 21, 2004

(30) Foreign Application Priority Data
Jan. 21, 2003 (JP) .............................. 2003-011967
Jan. 13, 2004 (JP) .............................. 2004-005857

(51) Int. Cl.
G01R 27/26 (2006.01)
G01R 27/02 (2006.01)

(52) U.S. Cl. ........................ 324/658; 324/679; 324/663

(58) Field of Classification Search ................ 324/658, 324/686, 679, 663
See application file for complete search history.

(56) References Cited

U.S. PATENT DOCUMENTS

| 5,999,010 | A | 12/1999 | Arora et al. | |
|---|---|---|---|---|
| 6,300,765 | B1 | 10/2001 | Chen | |
| 6,366,098 | B1 * | 4/2002 | Froment | 324/678 |
| 6,404,222 | B1 * | 6/2002 | Fan et al. | 324/765 |
| 6,414,498 | B2 * | 7/2002 | Chen | 324/678 |
| 6,597,191 | B2 * | 7/2003 | Oosawa et al. | 324/763 |
| 6,624,651 | B1 * | 9/2003 | Fried et al. | 324/765 |
| 6,870,387 | B2 * | 3/2005 | Huang et al. | 324/765 |
| 6,934,669 | B1 * | 8/2005 | Suaya et al. | 703/14 |

OTHER PUBLICATIONS

Jai-Hoon Sim, et al., 1998 Symposium on VLSI Technology Digest of Technical Papers, pp. 32-33, "The Impact of Isolation Pitch Scaling on $V_{th}$ Fluctuation in DRAM Cell Transistors Due to Neighboring Drain/Source Electric Field Penetration," Jun. 9-11, 1998.

(Continued)

*Primary Examiner*—Andrew H. Hirshfeld
*Assistant Examiner*—John Zhu
(74) *Attorney, Agent, or Firm*—Oblon, Spivak, McClelland, Maier & Neustadt, P.C.

(57) ABSTRACT

A CBCM circuit is capable of separately measuring each component of a measuring target capacitance. A node (N1) is electrically connected to a terminal (P2) between the drains of PMOS and NMOS transistors (MP2, MN2). As a target capacitance forming part, a coupling capacitance ($C_c$) is formed between the node (N1) and a node (N2). The node (N2) is connected to a pad (58) through the terminal (P2) and an NMOS transistor (MN3), and a node (N3) is connected to a terminal (P3) between the drains of PMOS and NMOS transistors (MP1, MN1). A reference capacitance ($C_{ref}$) is formed at the node (N3) as a dummy capacitance. Currents ($I_r$, $I_t$) supplied from a power source to the nodes (N3, N1) are measured with current meters (61, 62), respectively and a current ($I_m$) induced from the node (N2) and flowing to a ground level is measured with a current meter (63).

8 Claims, 56 Drawing Sheets

OTHER PUBLICATIONS

James C. Chen, et al., Technical Digest of IEDM, pp. 69-72, "An On-Chip, Attofarad Interconnect Charge-Based Capacitance Measurement (CBCM) Technique," 1996.

K. Yamada, et al., 2003 Symposium on VLSI Technology Digest of Technical Papers, pp. 111-112, "Accurate Modeling Method for Deep Sub-Micron Cu Interconnect," Jun. 10-12, 2003/Kyoto.

U.S. Appl. No. 10/355,068, filed Jan. 31, 2003, Yamashita et al.
U.S. Appl. No. 10/232,689, filed Sep. 3, 2002, Kunikiyo et al.
U.S. Appl. No. 10/287,537, filed Nov. 5, 2002, Okagaki et al.
U.S. Appl. No. 10/760,449, filed Jan. 21, 2004, Kunikiyo et al.

* cited by examiner

F I G. 1
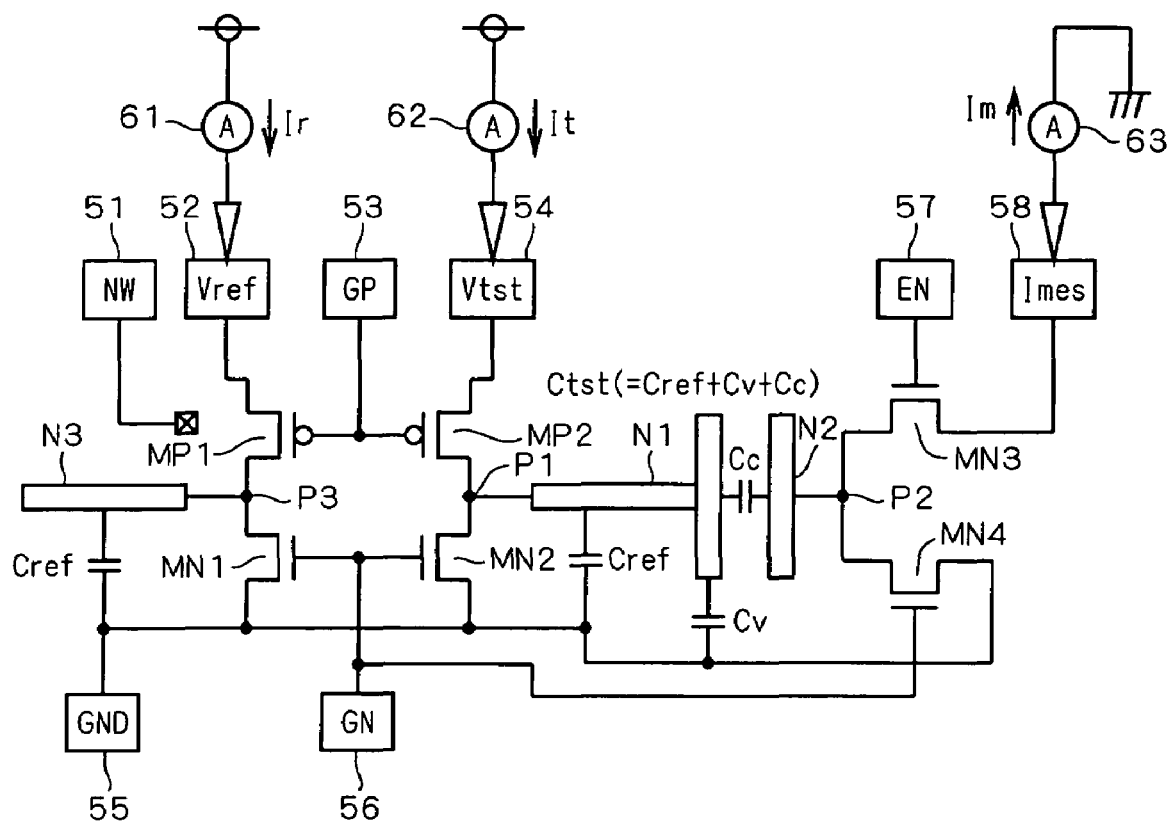

F I G . 6 7

|  | V1 | V2 | V3 | V4 | V5 | V6 | V7 | V8 | V9 | V10 |
|---|---|---|---|---|---|---|---|---|---|---|
| INTERCONNECT STRUCTURE 1 | -1 | -1 | 0 | 0 | -1 | 0 | -1 | 0 | 0 | 0 |
| INTERCONNECT STRUCTURE 2 | 1 | -1 | 0 | 0 | -1 | 0 | -1 | 0 | 0 | 0 |
| INTERCONNECT STRUCTURE 3 | -1 | 1 | 0 | 0 | -1 | 0 | -1 | 0 | 0 | 0 |
| INTERCONNECT STRUCTURE 4 | 1 | 1 | 0 | 0 | -1 | 0 | -1 | 0 | 0 | 0 |
| INTERCONNECT STRUCTURE 5 | -1 | -1 | 0 | 0 | 1 | 0 | -1 | 0 | 0 | 0 |
| INTERCONNECT STRUCTURE 6 | 1 | -1 | 0 | 0 | 1 | 0 | -1 | 0 | 0 | 0 |
| INTERCONNECT STRUCTURE 7 | -1 | 1 | 0 | 0 | 1 | 0 | -1 | 0 | 0 | 0 |
| INTERCONNECT STRUCTURE 8 | 1 | 1 | 0 | 0 | 1 | 0 | -1 | 0 | 0 | 0 |
| ... | ... | ... | ... | ... | ... | ... | ... | ... | ... | ... |
| ... | ... | ... | ... | ... | ... | ... | ... | ... | ... | ... |
| ... | ... | ... | ... | ... | ... | ... | ... | ... | ... | ... |

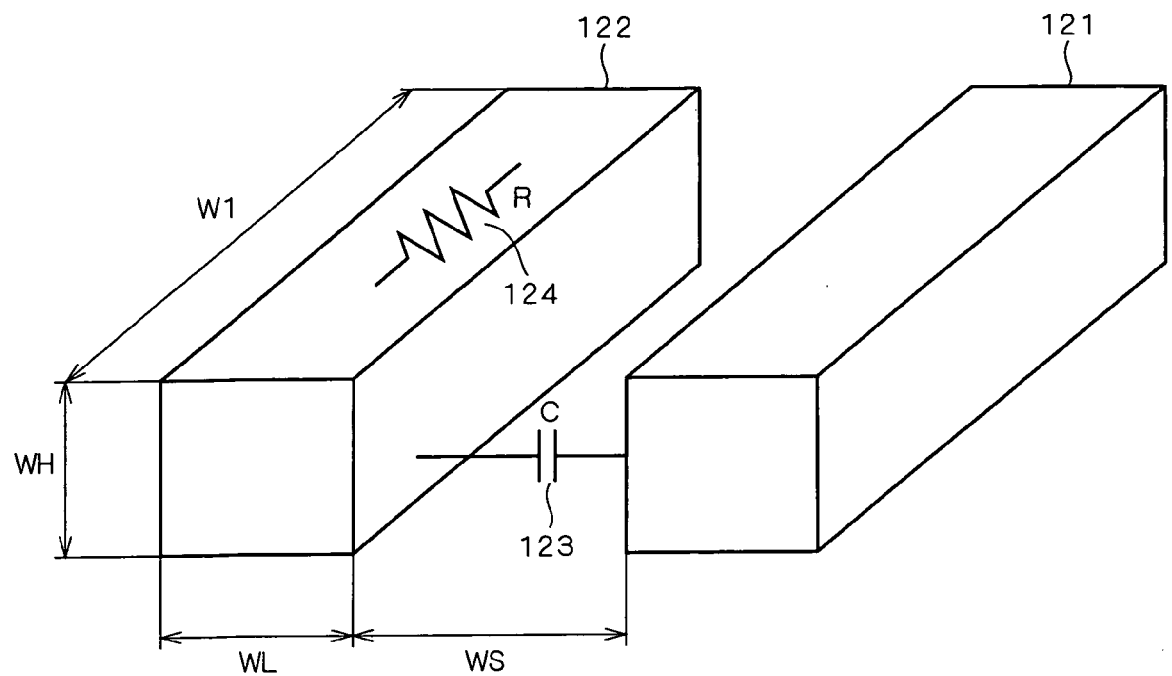
F I G . 6 8

CAPACITANCE MEASUREMENT CIRCUIT

BACKGROUND OF THE INVENTION

1. Field of the Invention

The present invention relates to a CBCM (Charge-Based Capacitance Measurement) circuit using a CBCM technique, and a capacitance measurement technique using the CBCM circuit.

2. Description of the Background Art

The CBCM circuit is a capacitance measurement circuit with sub-fF ($10^{-15}$ F or less) sensitivity that is difficult to achieve with AC current meters such as an LCR meter with sufficient accuracy, and is disclosed in James C. Chen et. al., "An On-Chip Attofarad Interconnect Charge-Based Capacitance Measurement (CBCM) Technique," IEDM Technical Digest, 1996, pp. 69–72. Further, an improved CBCM circuit that is capable of separately measuring parts of capacitance in an interconnect configuration is disclosed in U.S. Pat. No. 6,300,765.

In the conventional and improved CBCM circuits, a measuring target capacitance is predetermined; for example, a total capacitance or parts of capacitance in an interconnect configuration, etc. Thus, it is difficult to separately measure each component of the measuring target capacitance.

SUMMARY OF THE INVENTION

An object of the present invention is to provide a capacitance measurement circuit that is capable of separately measuring each component of a measuring target capacitance.

According to an aspect of the present invention, the capacitance measurement circuit includes first to third terminals, first to third current detectors and a target capacitance forming section. The first terminal is accompanied by a first capacitance including first and second capacitance components to be measured and a non-target capacitance component not to be measured, and the third terminal is accompanied by a dummy capacitance having the same capacitance value as the non-target capacitance component. The first current detector detects a first current supplied to the first terminal, the second current detector detects a second current induced from the second terminal, and the third current detector detects a third current supplied to the third terminal. The target capacitance forming section is formed between the first terminal and the second terminal so that the first terminal is accompanied by the first capacitance component. The target capacitance forming section, the first to third terminals and the first to third current detectors constitute a capacitance measurement section.

Based on the values of the first to third currents detected with the first to third current detectors, the first capacitance can be separated into the first and second capacitance components and the non-target capacitance component, which allows separate measurements of the first and second capacitance components.

According to another aspect of the present invention, the capacitance measurement circuit includes a first terminal, a predetermined number of second terminals, first and second current detectors, a target capacitance forming section, and a selector. The first terminal is accompanied by a first capacitance including first and second capacitance components, the first capacitance component including a predetermined number of first capacitance components. The first current detector detects a first current supplied to the first terminal, and the second current detector detects a second current obtained from a common signal line. The target capacitance forming section is formed between the first terminal and the predetermined number of second terminals so that the first terminal is accompanied by the first capacitance component. The target capacitance forming section has the predetermined number of first capacitance components formed between the first terminal and the predetermined number of second terminals. The selector selects one of the predetermined number of second terminals as a selected terminal in response to an external signal whose bit number is smaller than the predetermined number, and transmits the second current induced from the selected terminal to the common signal line.

Based on the values of the first and second currents detected with the first and second current detectors, the first capacitance can be separated into the predetermined number of first capacitance components and the second capacitance component, which allows separate measurements of each component. At this time, since the current obtained from the predetermined number of second terminals can be detected as one second current obtained from the common signal line, only a single external pad for detection of the second current is necessary.

According to still another aspect of the present invention, the capacitance measurement circuit includes first and second terminals, a current detector, a terminal state changer, and a target capacitance forming section. The current detector detects a supply current supplied to the first terminal. The terminal state changer selects either a first state in which the second terminal is connected to a fixed potential or a second state in which the first and second terminals are short-circuited. The target capacitance forming section is formed between the first and second terminals and has a measuring target capacitance including first and second capacitance components. The target capacitance forming section, the first and second terminals, the current detector and the terminal state changer constitute a capacitance measurement section.

The first and second capacitance components can be measured based on the values of the supply current obtained in the first and second states. Thus, by only detecting one supply current, the first and second capacitance components of the measuring target capacitance can be measured independently.

According to a further aspect of the present invention, the capacitance measurement circuit includes first and second terminals, first and second pads, first and second current detectors, and a ring load section. The first current detector detects a first current supplied to the first terminal. The second current detector detects a second current supplied to the second terminal. The ring load section is electrically connected to the first terminal, and includes first and second inverters connected in series in the order named. The first inverter includes a first transistor of a first conductivity type, and a second transistor of a second conductivity type. The first transistor has a first electrode, a second electrode and a control electrode, and the first and control electrodes of the first transistor are electrically connected in common to the first pad. The second transistor has a first electrode, a second electrode and a control electrode, and the first and control electrodes of the second transistor are electrically connected in common to the second pad. The control electrodes of the first and second transistors are electrically isolated from each other. The second electrodes of the first and second transistors are electrically connected in common to the first terminal.

The capacitance accompanying the first terminal is measured by applying fixed potentials which reliably turn off the first and second transistors respectively to the first and second pads. This allows leakage current flowing through the first and second transistors during the capacitance measurement to be set at substantially zero.

As a result, the capacitance of the ring load section accompanying the first terminal is detected accurately. Therefore, the AC verification accuracy of a circuit simulator using a ring oscillator is improved, based on the accurately measured capacitance of the ring load section.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a configuration of a CBCM circuit according to a first preferred embodiment of the present invention;

FIG. 67 illustrates an experiment program;

FIG. 68 illustrates adjacent interconnect models;

DESCRIPTION OF THE PREFERRED EMBODIMENTS

FIRST PREFERRED EMBODIMENT

Figure 2:
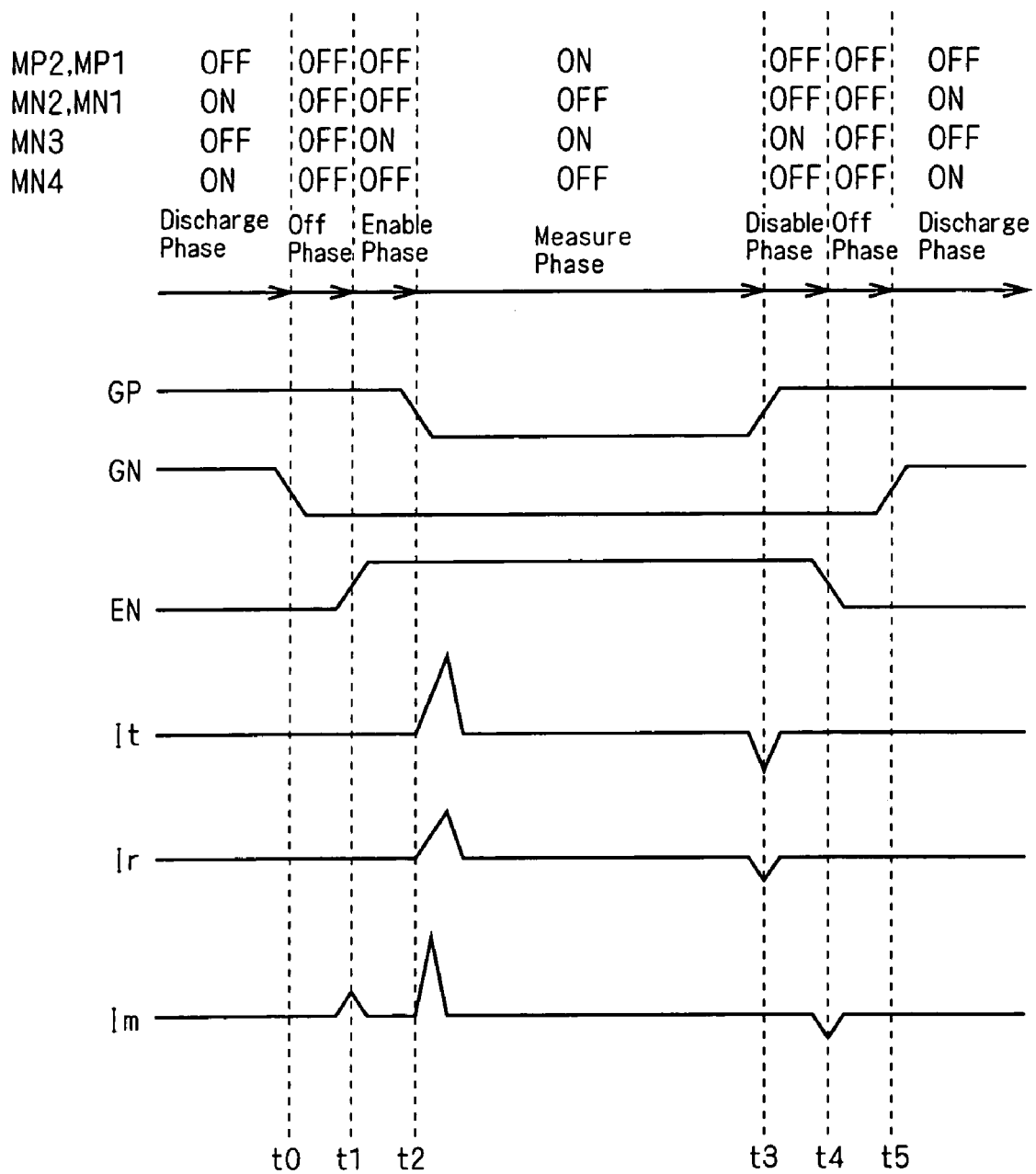
FIG. 2 is a timing chart showing the operation of the CBCM circuit according to the first preferred embodiment.

FIG. 1 is a circuit diagram showing a configuration of a CBCM circuit according to a first preferred embodiment of the present invention. As shown in the drawing, a PMOS transistor MP1 and an NMOS transistor MN1 are connected in series, and a PMOS transistor MP2 and an NMOS transistor MN2 are connected in series. The source of the PMOS transistor MP1 is connected to a pad 52, the source of the PMOS transistor MP2 is connected to a pad 54, and the sources of the NMOS transistors MN1 and MN2 are connected in common to a pad 55. The gates of the PMOS transistors MP1 and MP2 are connected to a pad 53, a well region serving as a back gate is connected to a pad 51, and the gates of the NMOS transistors MN1 and MN2 are connected to a pad 56. A node N3 is connected to a terminal P3 between the drains of the PMOS transistor MP1 and the NMOS transistor MN1.

Further, a node N1 is electrically connected to a terminal P1 between the drains of the PMOS transistor MP2 and the NMOS transistor MN2, and a coupling capacitance $C_c$ is formed in a target capacitance forming part between the node N1 and a node N2. The node N2 is connected through a terminal P2 and an NMOS transistor MN3 to a pad 58 and is also connected through the terminal P2 and an NMOS transistor NM4 to the pad 55. The gates of the NMOS transistors MN3 and MN4 are connected to the pads 57 and 56, respectively.

In the specification of the present invention, the "nodes" refer to not only normal electrical contacts but also to conductive layers such as interconnect layers, electrodes of capacitances and gate electrodes of transistors which are electrically connected to electrical contacts.

The pads 51, 52, 53, 54, 55, 56 and 57 are applied with a potential NW, a reference potential $V_{ref}$, a PMOS gate potential GP, a test potential $V_{tst}$, a potential GND, an NMOS gate potential GN and an enable voltage EN, respectively. The pads 52 and 54 are supplied with power, and current meters 61 and 62 measure currents $I_r$ and $I_t$ supplied from the power source to the nodes N3 and N1, respectively. The pad 58 is connected to a ground level, and a current $I_m$ derived from the node N2 and flowing to the ground level is measured with a current meter 63.

The potential NW is a potential for setting the potentials of the well regions of the PMOS transistors MP1 and MP2, and the potential GND is applied as a source potential to active regions (not shown) of the NMOS transistors MN1, MN2 and MN4.

The PMOS transistors MP1 and MP2 and the NMOS transistors MN1 and MN2 are pairs of transistors having the same gate length, the same gate width and the same film thickness of gate insulating film. The NMOS transistors MN3 and MN4 are also a pair of transistors having the same gate length, the same gate width and the same film thickness of gate insulating film.

A test capacitance $C_{tst}$ of the node N2 is obtained by adding a coupling capacitance (first capacitance component) $C_c$ formed between the nodes N1 and N2 and an interconnect capacitance (second capacitance component) $C_v$ excluding the coupling capacitance $C_c$ of the node N1 to a reference capacitance $C_{ref}$ (interconnect capacitance of the node N1 which is a measuring target interconnect line); that is, $C_{tst}=C_{ref}+C_v+C_c$. The node N3 is provided with a dummy capacitance having the same capacitance value as a reference capacitance (third capacitance component) $C_{ref}$.

FIG. 2 is a timing chart showing the operation of the CBCM circuit according to the first preferred embodiment shown in FIG. 1. Hereinbelow, capacitance measurement by the CBCM circuit according to the first preferred embodiment is described with reference to the drawing.

The reference potential $V_{ref}$, the test potential $V_{tst}$ and the potential NW are fixed at a power source potential $V_{dd}$ and the potential GND is fixed at a ground potential $V_{ss}$. As shown in the drawing, the input voltage waveforms of the PMOS gate potential GP and the NMOS gate potential GN are provided such that only either the NMOS transistors MN1, MN2 or the PMOS transistors MP1, MP2 are turned on at any given time. Thus, no short circuit current is generated from the PMOS transistor MP1 to the NMOS transistor MN1 or from the PMOS transistor MP2 to the NMOS transistor MN2.

As shown in FIG. 2, during a discharge phase before time t0, the PMOS gate potential GP and the NMOS gate potential GN are high (at a "H" level) and the enable voltage EN is low (at a "L" level). This leaves the PMOS transistors MP1, MP2 and the NMOS transistor MN3 in their off state and turns on the NMOS transistors MN1, MN2 and MN4. Thus, the nodes N1 to N3 are all discharged to "L".

During an off phase between time t0 and t1, the NMOS gate potential GN transitions to "L". Thus, the PMOS transistors MP1, MP2 and the NMOS transistors MN1 through MN4 are turned off.

During an enable phase between time t1 and t2, the enable voltage EN transitions to "H". This allows the current meter 63 to monitor the current $I_m$.

During a measure phase between time t2 and t3, the PMOS gate potential GP transitions to "L". This turns on the PMOS transistors MP1 and MP2, so that the currents $I_r$ and $I_t$ flow and the nodes N3 and N1 transition to "H". Accordingly, charge is accumulated in all the capacitances ($C_{tst}$) that accompany the node N1 and in all the capacitances ($C_{ref}$) that accompany the node N3. In this specification, the term "accompany" is used to mean that a capacitance includes a parasitic capacitance and a capacitance other than a parasitic capacitance connected to a node.

At this time, the currents $I_r$ and $I_t$ are measured with the current meters 61 and 62, respectively and the current $I_m$ induced on a current path from the node N2 through the pad 58 to the ground level is measured with the current meter 63.

During a disable phase between t3 and t4, the PMOS gate potential GP transitions to "H".

During an off phase between time t4 and t5, the enable voltage EN transitions to "L". Thus, the PMOS transistors MP1, MP2 and the NMOS transistors MN1 to MN4 are all turned off.

Subsequently, the NMOS gate potential GN transitions to "H" at time t5 and the discharge phase starts again. This time between t5 and t0 is the discharge phase.

The above sequence of operation corresponds to one cycle T (a time period between t0, t5 and t0) and this operation is repeated thereafter. The CBCM circuit observes a time-averaged value of the currents $I_r$, $I_t$ and $I_m$. Now, if f (=1/T) is the frequency of the gate input waveforms (GP, GN, EN), the following equation (1) is true and the coupling capacitance $C_c$ can be expressed by the following equation (2):

$$I_m = C_c \times V_{dd} \times f \tag{1}$$

$$C_c = I_m/(V_{dd} \times f) \tag{2}$$

A difference between the currents $I_t$ and $I_r$ is given by the following equation (3):

$$\begin{aligned} I_t - I_r &= C_{tst} \times V_{dd} \times f - C_{ref} \times V_{dd} \times f \\ &= (C_{ref} + C_v + C_c) \times V_{dd} \times f - C_{ref} \times V_{dd} \times f \\ &= (C_v + C_c) \times V_{dd} \times f \end{aligned} \tag{3}$$

From the equations (2) and (3), the interconnect capacitance $C_v$ is given by the following equation (4):

$$\begin{aligned} C_v &= (I_t - I_r)/(V_{dd} \times f) - C_c \\ &= (I_t - I_r - I_m)/(V_{dd} \times f) \end{aligned} \tag{4}$$

Accordingly, the unnecessary reference capacitance $C_{ref}$ is removed and the coupling capacitance $C_c$ and the interconnect capacitance $C_v$ that accompany the node N2 are obtained with accuracy.

Figure 3:
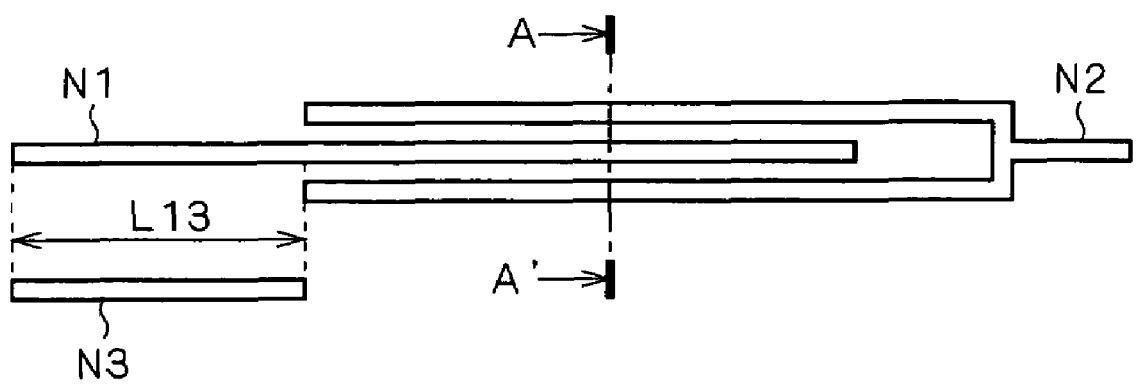
FIG. 3 is a plan view showing a concrete example of target interconnect lines or dummy interconnect lines.
Figure 4:
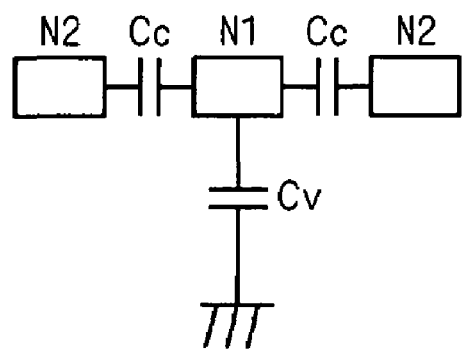
FIG. 4 is a cross-sectional view taken along line A–A' of FIG. 3.

FIG. 3 is a plan view showing a concrete example of the nodes N1 to N3 as target or dummy interconnect lines. FIG. 4 is a cross-sectional view taken along line A–A' of FIG. 3.

As shown in these drawings, the node N2 serving as one electrode of capacitance is spaced at predetermined intervals on both sides of the node N1 serving as the other electrode of the capacitance. And, as shown in FIG. 4, two coupling capacitances $C_c$ are formed between the nodes N1 and N2 and an interconnect capacitance $C_v$ is formed between the node N1 and a substrate (or lower interconnect line) therebelow. The node N3 is formed to a length that corresponds to a length L13 of a portion of the node N1 which does not form the coupling capacitance $C_c$ with the node N2.

In the configuration of FIGS. 3 and 4, the coupling capacitance $C_c$ and the interconnect capacitance $C_v$ are measured. In the present example, each of the capacitances formed between the nodes N1 and N2 is referred to as a coupling capacitance $C_c$.

In the same manner as in the equation (2), the coupling capacitance $C_c$ is given by the following equation (5):

$$C_c = I_m/(V_{dd} \times f \times 2) \tag{5}$$

The difference between the currents $I_t$ and $I_r$ is given by the following equation (6):

$$I_t - I_r = C_{tst} \times V_{dd} \times f - C_{ref} \times V_{dd} \times f \qquad (6)$$
$$= (C_{ref} + C_v + 2 \times C_c) \times V_{dd} \times f - C_{ref} \times V_{dd} \times f$$
$$= (C_v + 2 \times C_c) \times V_{dd} \times f$$

From the equations (5) and (6), the interconnect capacitance $C_v$ is given by the following equation (7):

$$C_v = (I_t - I_r)/(V_{dd} \times f) - 2 \times C_c \qquad (7)$$
$$= (I_t - I_r - I_m)/(V_{dd} \times f)$$

In the circuit configuration shown in FIG. 1, since the NMOS gate potential GN is applied in common to the gates of the NMOS transistors MN1, MN2 and MN4, the adoption of the NMOS transistor MN3 does not increase the number of pads.

Besides, using the above equations (1) to (4) (or (5) to (7)), the test capacitance $C_{tst}$ which is a measuring target capacitance can be separated into the coupling capacitance $C_c$ and the interconnect capacitance $C_v$ for measurement. This avoids the necessity to prepare a layout pattern that is required for each capacitance component of a measuring target capacitance in the conventional techniques, thereby reducing the area of circuit layout.

(Other Forms)

For decrease in subthreshold current in the PMOS transistors MP1, MP2 and the NMOS transistors MN1 to MN4, it is desirable to employ transistors with greater gate lengths than used in common logic circuits (core logics). For example, the gate length should be equivalent to that of I/O (input/output) transistors (which operate at relatively high power supply voltages such as 3.3V, 2.5V or 1.8V). This achieves the effect of reducing a difference of measured current resulting from subthreshold current leakage. The core logic transistor is described in, for example, "International Technology Roadmap for Semiconductors (ITRS) 2001 Edition, Process Integration, Device, And Structures And Emerging Research Devices."

Similar effects can also be achieved by forming a gate insulating film thicker than in core transistors or by setting the operating power higher than in core transistors. For example, the film thickness of gate insulating film may be set to about the same as that for I/O transistors.

As above described, the MOS transistors employed in the CBCM circuit should desirably be such transistors that are less apt to cause leakage current as compared to ordinary transistors constituting a logic circuit.

SECOND PREFERRED EMBODIMENT

Figure 5:
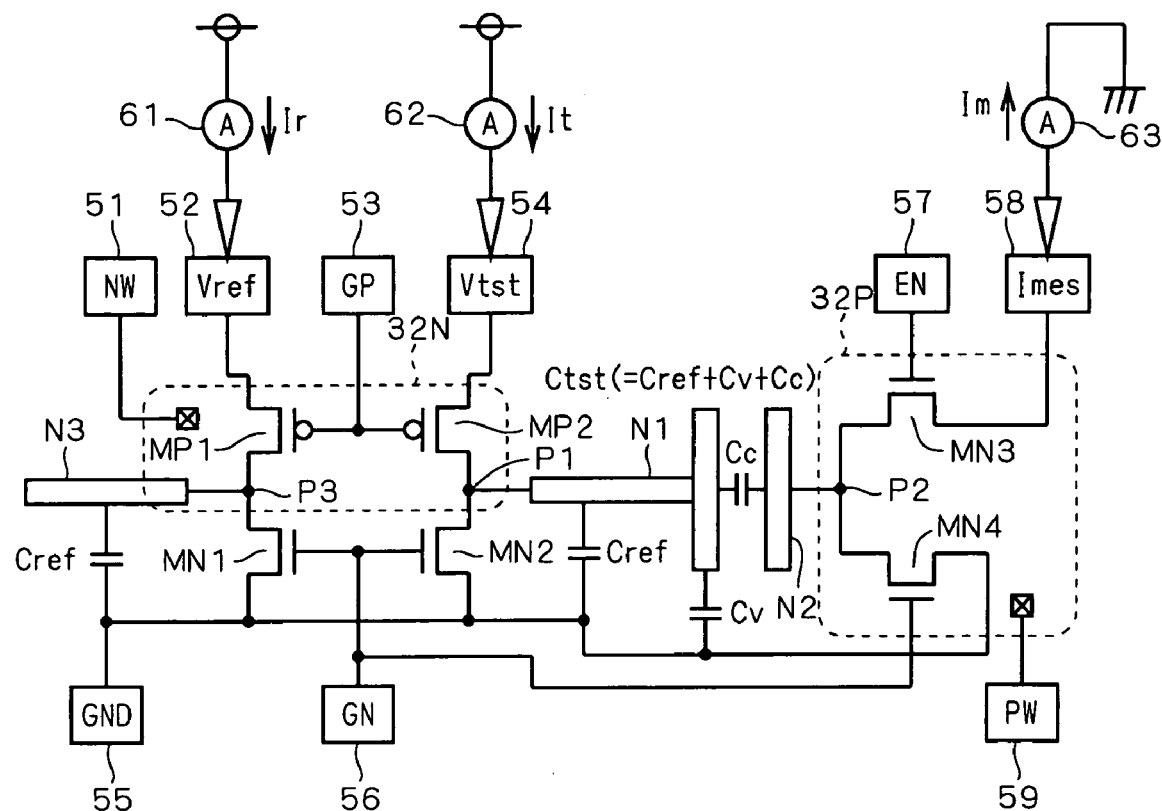
FIG. 5 is an explanatory diagram schematically showing, in relation to a well region, a configuration of a CBCM circuit according to a second preferred embodiment of the present invention.

FIG. 5 is an explanatory diagram schematically showing, in relation to a well region, a configuration of a CBCM circuit according to a second preferred embodiment of the present invention. As shown in the drawing, the PMOS transistors MP1 and MP2 are formed in an N well region 32N, and the NMOS transistors MN3 and MN4 are formed in a P well region 32P. The potential of the P well region 32P is fixed at a P well ground potential PW by the pad 59. The other parts of the configuration are identical to those in the first preferred embodiment shown in FIG. 1 and thus not described herein.

Figure 6:
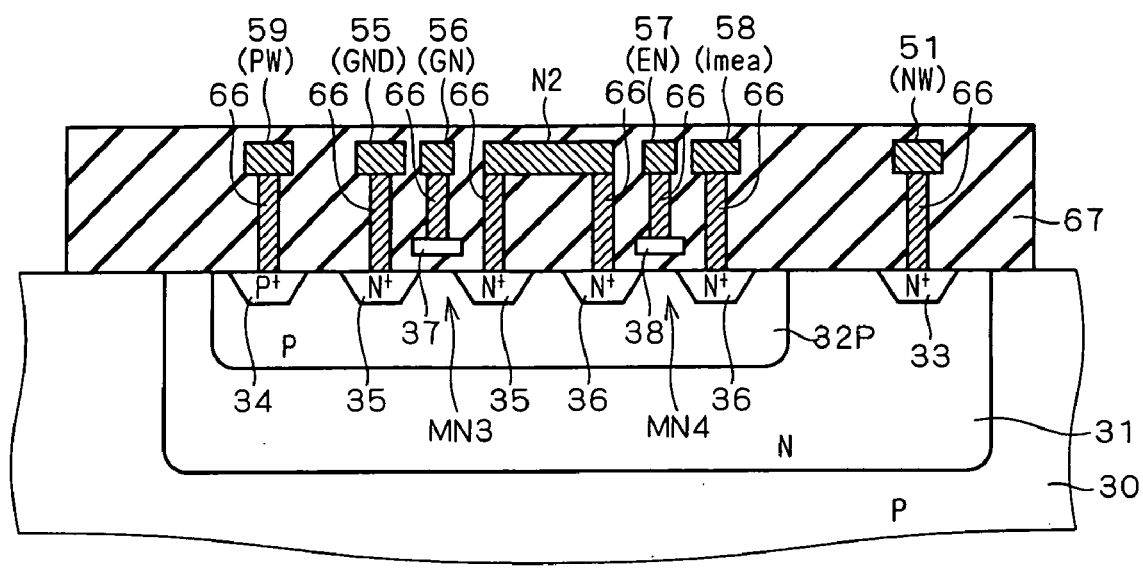
FIG. 6 is a cross-sectional view showing, in section, an NMOS transistor structure employed in the CBCM circuit of FIG. 5.
Figure 7:
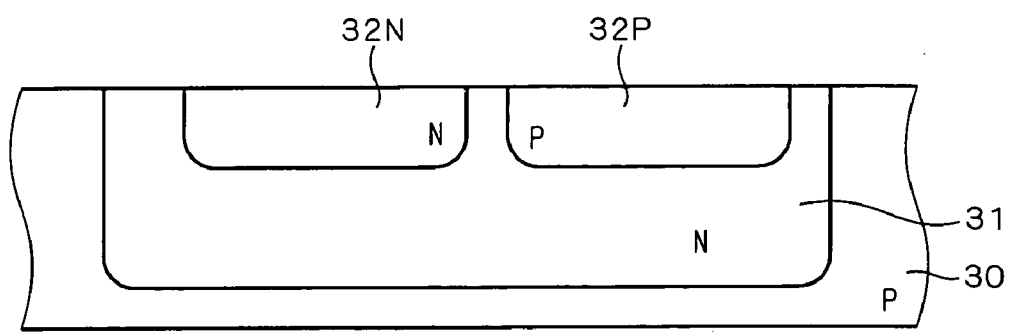
FIG. 7 is an explanatory diagram simply showing a well structure of FIG. 6.

FIG. 6 is a cross-sectional view showing cross-sectional configurations of the NMOS transistors MN3 and MN4 employed in the CBCM circuit of FIG. 5. FIG. 7 is an explanatory diagram simply illustrating a well structure of FIG. 6.

As shown in these drawings, a bottom N well region 31 is formed in the upper layer of a P-type substrate 30, and the P well region 32P and the N well region 32N (not shown in FIG. 6) are formed in the upper layer of the bottom N well region 31. Thus, the bottom N well region 31, the N well region 32N and the P well region 32P form a triple well structure.

In the surface of the P well region 32P, a $P^+$ diffusion region 34 and $N^+$ diffusion regions 35 and 36 are selectively formed and in the surface of the bottom N well region 31, an $N^+$ diffusion region 33 is formed. A gate electrode 37 is formed above the P well region 32P between the $N^+$ diffusion regions 35, which forms the NMOS transistor MN3, and a gate electrode 38 is formed above the p well region 32P between the $N^+$ diffusion regions 36, which forms the NMOS transistor MN4.

The $P^+$ diffusion region 34 is electrically connected through a contact hole 66 to the pad 59, the $N^+$ diffusion region 35 (on the source side) is electrically connected through a contact hole 66 to the pad 55, the gate electrode 37 is electrically connected through a contact hole 66 to the pad 56, the $N^+$ diffusion region 35 (on the drain side) is electrically connected through a contact hole 66 to the node N2 which serves as an interconnect layer, the $N^+$ diffusion region 36 (on the drain side) is electrically connected through a contact hole 66 to the node N2, the gate electrode 38 is electrically connected through a contact hole 66 to the pad 57, and the $N^+$ diffusion region 36 (on the source side) is electrically connected through a contact hole 66 to the pad 58. The $N^+$ diffusion region 33 is electrically connected through a contact hole 66 to the pad 51. As a matter of course, an insulating layer 67 provides isolation between the gate electrodes 37, 38 and the P well region 32P, between the contact holes 66, between the pads, and the like. In subsequent drawings, a layer corresponding to the insulating layer 67 is not shown.

By in this way forming the NMOS transistors MN3 and MN4 in the P well region 32P having the triple well structure, the occurrence of junction leakage currents in the NMOS transistors MN3 and MN4 can effectively be reduced.

Further, if a current meter is connected to the pad 59 to monitor junction leakage currents and to correct the current $I_m$, the accuracy of capacitance measurement can further be improved.

While the P-type substrate 30 is shown in the example of FIGS. 5 and 6, a similar effect can also be achieved with an N-type substrate.

THIRD PREFERRED EMBODIMENT

Figure 8:
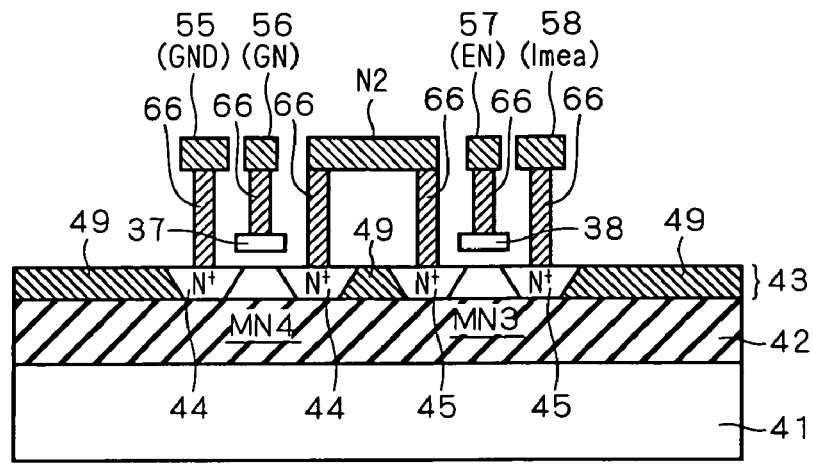
FIG. 8 is a cross-sectional view showing a transistor structure employed in a CBCM circuit according to a third preferred embodiment of the present invention.

FIG. 8 is a cross-sectional view showing a transistor structure employed in a CBCM circuit according to a third preferred embodiment of the present invention. As shown in the drawing, the NMOS transistors MN3 and MN4 are formed in an SOI (Silicon-On-Insulator) layer 43 of an SOI substrate which is formed of a P-type substrate 41, a buried oxide film 42 and the SOI layer 43.

In the SOI layer 43, $N^+$ diffusion regions 44 and 45 are selectively formed. The gate electrode 37 is formed above the SOI layer 43 between the $N^+$ diffusion regions 44, and the gate electrode 38 is formed above the SOI layer 43 between the N+ diffusion regions 45. The N+ diffusion regions 44 and the gate electrode 37 form the NMOS transistor MN4, and the N+ diffusion regions 45 and the gate electrode 38 form the NMOS transistor MN3.

The N+ diffusion region 44 (on the source side) is electrically connected through a contact hole 66 to the pad 55, the gate electrode 37 is electrically connected through a contact hole 66 to the pad 56, the N+ diffusion region 44 (on the drain side) is electrically connected through a contact hole 66 to the node N2, the N+ diffusion region 45 (on the drain side) is electrically connected through a contact hole 66 to the node N2, the gate electrode 38 is electrically connected through a contact hole 66 to the pad 57, and the N+ diffusion region 45 (on the source side) is electrically connected through a contact hole 66 to the pad 58.

Although not shown in FIG. 8, an STI (Shallow Trench Isolation) region 49 which extends from the surface of the SOI layer 43 to the buried oxide film 42 is formed around the NMOS transistors MN3 and MN4 in order to completely isolate the NMOS transistors MN3 and MN4 from other transistors.

Since in this way the NMOS transistors MN3 and MN4 formed on the SOI substrate are completely isolated from other elements, the presence of the buried oxide film 42 prevents the occurrence of junction leakage in the NMOS transistors MN3 and MN4. This brings about the effect of achieving high-precision capacitance measurement.

Similarly, if the PMOS transistors MP1 and MP2 and the NMOS transistors MN1 and MN2 are completely isolated from other elements by the STI region formed in the SOI layer of the SOI substrate, no junction leakage occurs in those MOS transistors. This achieves high-precision capacitance measurement.

Especially a greater effect of reducing junction leakage is achieved when PMOS transistors and NMOS transistors of different conductivity types are completely isolated by the STI region in the SOI layer.

FOURTH PREFERRED EMBODIMENT

Figure 9:
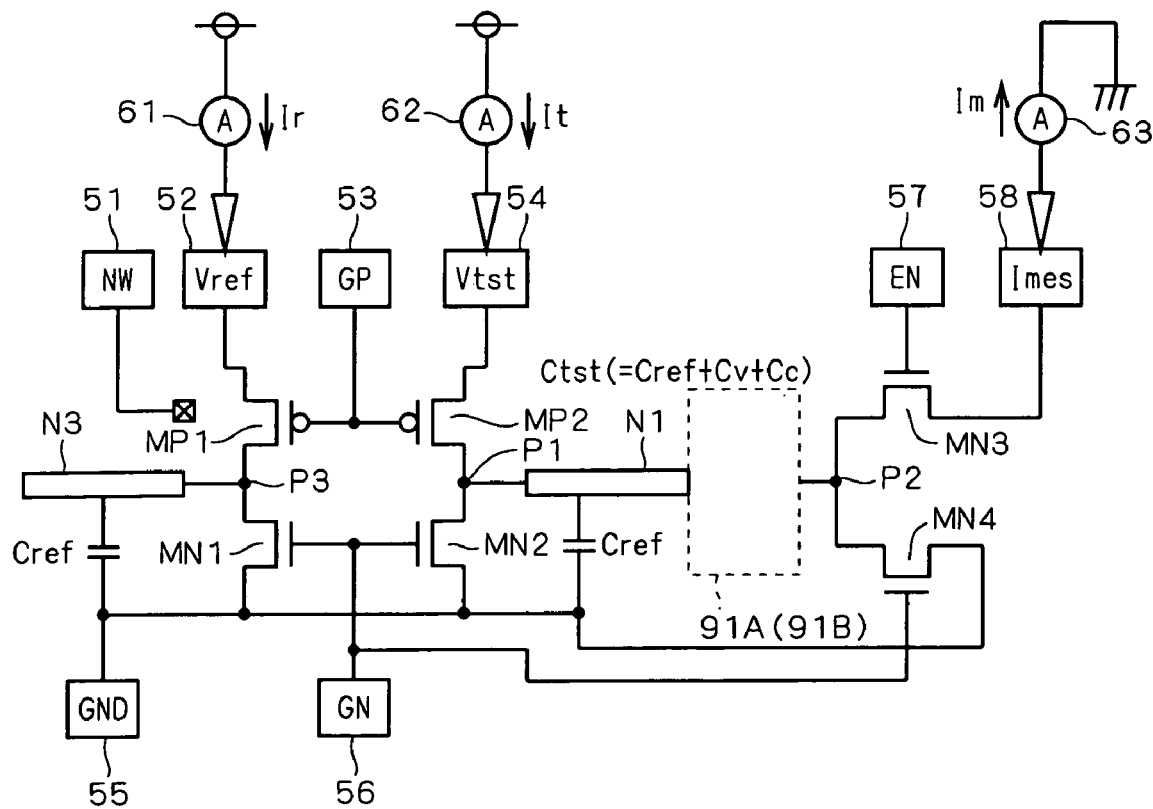
FIG. 9 is a circuit diagram showing a target capacitance forming part of a first circuit in a CBCM circuit according to a fourth preferred embodiment of the present invention.

FIG. 9 is a circuit diagram showing a configuration of a first circuit in a CBCM circuit according to a fourth preferred embodiment of the present invention. As shown in the drawing, a target capacitance forming part 91A for measurement of contact-to-gate capacitance is formed between the nodes N1 and N2. The other parts of the configuration are identical to those in the first preferred embodiment shown in FIG. 1 and thus not described herein.

Figure 10:
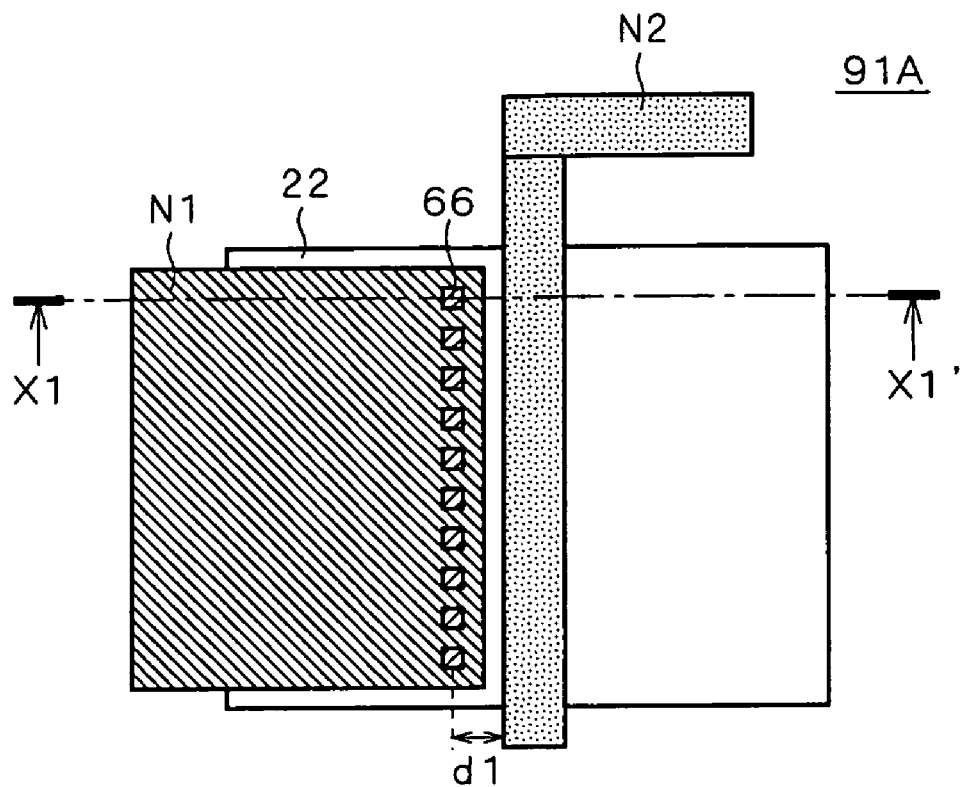
FIG. 10 is a plan view showing an internal structure of the target capacitance forming part of the first circuit according to the fourth preferred embodiment.
Figure 11:
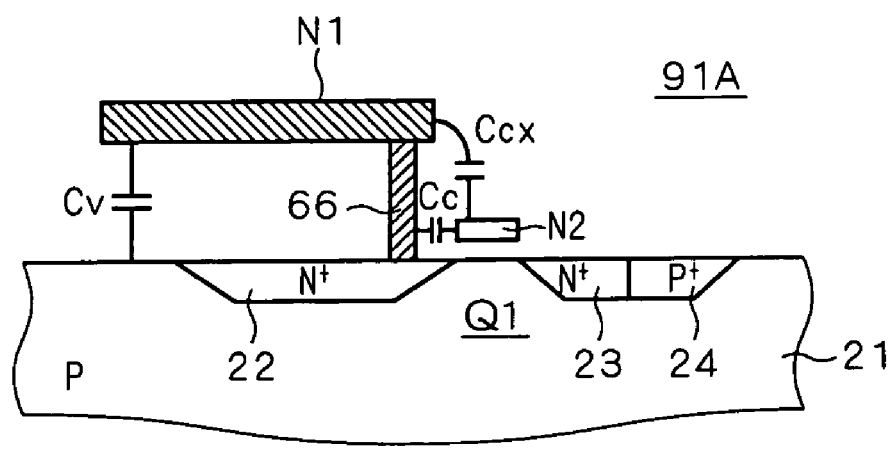
FIG. 11 is a cross-sectional view taken along line X1–X1' of FIG. 10.

FIG. 10 is a plan view showing an internal structure of the target capacitance forming part 91A according to the fourth preferred embodiment. FIG. 11 is a cross-sectional view taken along line X1–X1' of FIG. 10.

As shown in these drawings, in the target capacitance forming part 91A, N+ diffusion regions 22, 23 and a P+ diffusion region 24 are selectively formed in the surface of a P well region 21, and the node N2 serving as a gate electrode is formed above the P well region 21 between the N+ diffusion regions 22 and 23. These N+ diffusion regions 22, 23 and the node N2 form an NMOS transistor Q1 for measurement. The node N1 serving as an interconnect line is formed as an interconnect layer in a higher position than the node N2.

The node N1 is electrically connected through a contact hole 66 to the N+ diffusion region 22. Since in an actual MOS transistor, the contact holes 66 are located as close as possible to the gate electrode, a distance between the node N2 and the contact holes 66 is set to a minimum distance d1.

Here, what we actually want to measure is a coupling capacitance $C_c$ formed between the node N2 and the contact hole 66 for the node N1. However, because the node N1 is formed close to the node N2 which is the gate electrode, a coupling capacitance $C_{cx}$ is also formed between the nodes N1 and N2. Further, an interconnect capacitance $C_v$ is formed between the node N1 and the P well region 21.

Figure 12:
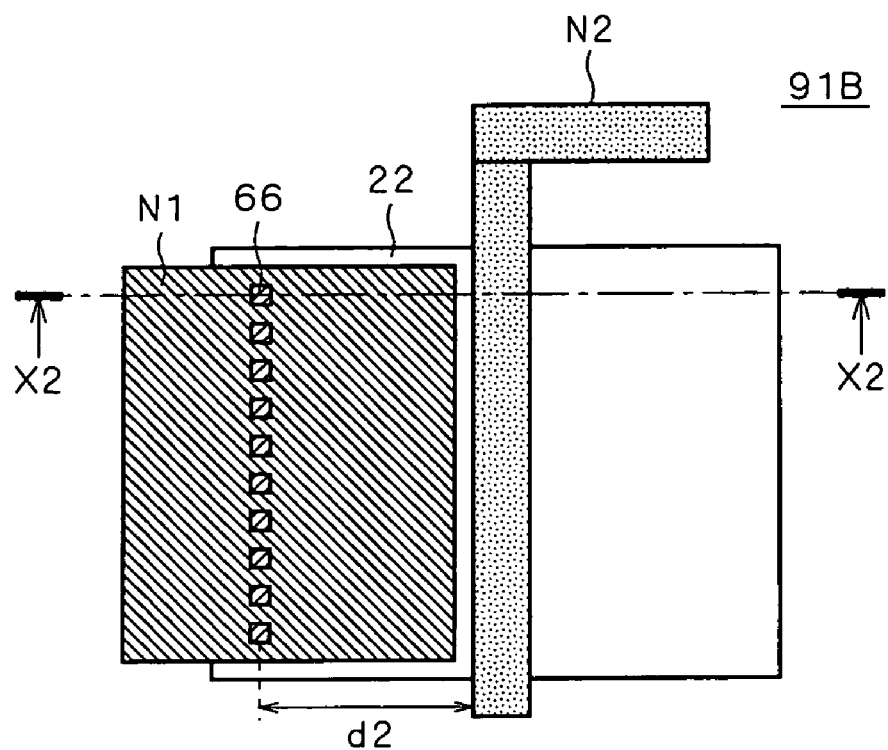
FIG. 12 is a plan view showing the structure of a target capacitance forming part of a second circuit in the CBCM circuit according to the fourth preferred embodiment.
Figure 13:
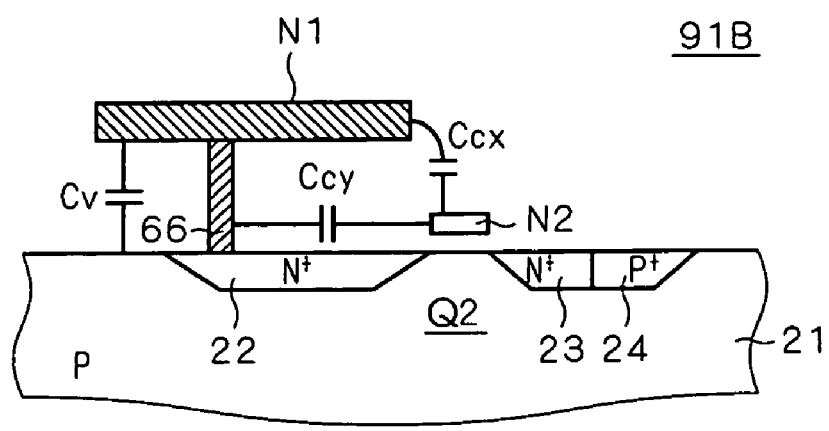
FIG. 13 is a cross-sectional view taken along line X2–X2' of FIG. 12.

FIG. 12 is a plan view showing the structure of a target capacitance forming part 91B of a second circuit in the CBCM circuit according to the fourth preferred embodiment. FIG. 13 is a cross-sectional view taken along line X2–X2' of FIG. 12. The circuit configuration itself is identical to that of the first circuit except that the target capacitance forming part 91A is replaced by the target capacitance forming part 91B.

In the target capacitance forming part 91B, an NMOS transistor Q2 for measurement is defined by the N+ diffusion regions 22 and 23 and the node N2, wherein, unlike ordinary MOS transistors, the distance between the node N2 and the contact holes 66 is set to a distance d2 (about 10 times the distance d1) where the coupling capacitance $C_{cy}$ between the node N2 and the contact hole 66 for the node N1 can be ignored. The other parts of the configuration are identical to those shown in FIGS. 10 and 11.

Hereinbelow, we describe a method of measuring the coupling capacitance $C_c$ and the interconnect capacitance $C_v$ using the first and second circuits in the CBCM circuit according to the fourth preferred embodiment.

By measuring currents $I_m[A]$ and $I_m[B]$ in the first and second circuits, respectively, the following equations (8) and (9) are derived:

$$I_m[A] = (C_{cx} + C_c) \times V_{dd} \times f \tag{8}$$

$$I_m[B] = (C_{cx} + C_{cy}) \times V_{dd} \times f \tag{9}$$
$$= C_{cx} \times V_{dd} \times f$$

In the equation (9), the coupling capacitance $C_{cy}$ shall be a negligible amount of value.

As a result, the coupling capacitance $C_{cx}$ and the coupling capacitance $C_c$ are given by the following equations (10) and (11):

$$C_{cx} = I_m[B]/(V_{dd} \times f) \tag{10}$$

$$C_c = (I_m[A] - I_m[B])/(V_{dd} \times f) \tag{11}$$

Then, by measuring currents $I_t[A]$ and $I_t[B]$ in the first and second circuits, respectively, the following equations (12) and (13) are derived:

$$I_t[A] = C_{tst}[A] \times V_{dd} \times f \tag{12}$$
$$= (C_v + C_c + C_{cx}) \times V_{dd} \times f$$

$$I_t[B] = C_{tst}[B] \times V_{dd} \times f \tag{13}$$
$$= (C_v + C_c + C_{cx}) \times V_{dd} \times f$$
$$= (C_v + C_{cx}) \times V_{dd} \times f$$

In the equation (13), the coupling capacitance $C_{cy}$ shall be a negligible amount of value. Consequently, the interconnect capacitance $C_v$ can be obtained from the equations (10) to (13).

By in this way employing the first and second circuits including the target capacitance forming parts 91A and 91B of different layout structures in the CBCM circuit, each component of the contact-to-gate capacitance can be measured separately.

FIFTH PREFERRED EMBODIMENT

Figure 14:
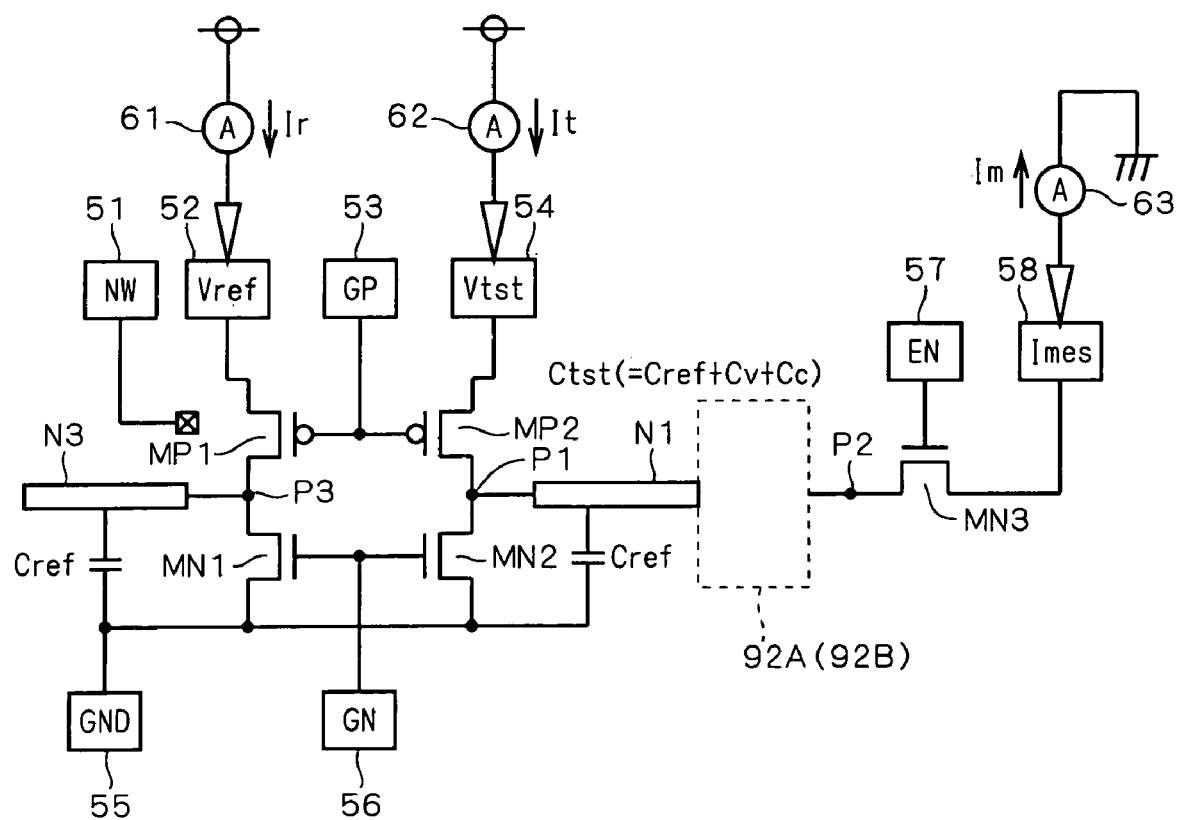
FIG. 14 is a circuit diagram showing a circuit configuration of a first circuit in a CBCM circuit according to a fifth preferred embodiment of the present invention.

FIG. 14 is a circuit diagram showing a circuit configuration of a first circuit in a CBCM circuit according to a fifth preferred embodiment. As shown in the drawing, a target capacitance forming part 92A for measurement of contact-to-contact capacitance is formed between the nodes N1 and N2. The NMOS transistor MN4 is not shown because it is formed within the target capacitance forming part 92A. The other parts of the circuit configuration are identical to those in the first preferred embodiment shown in FIG. 1.

Figure 15:
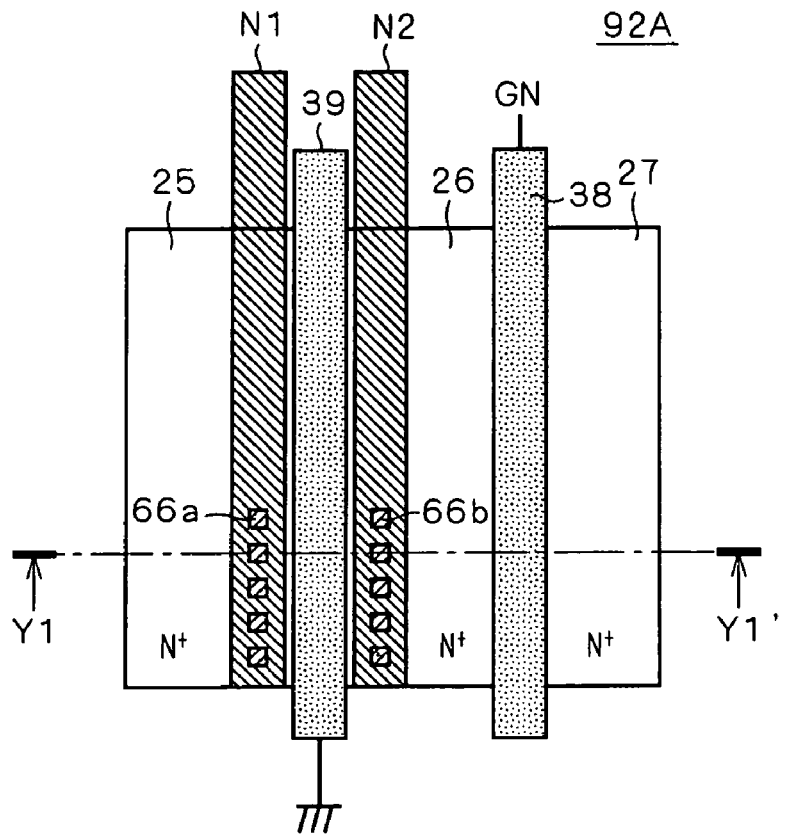
FIG. 15 is a plan view showing the structure of a target capacitance forming part of the first circuit according to the fifth preferred embodiment.
Figure 16:
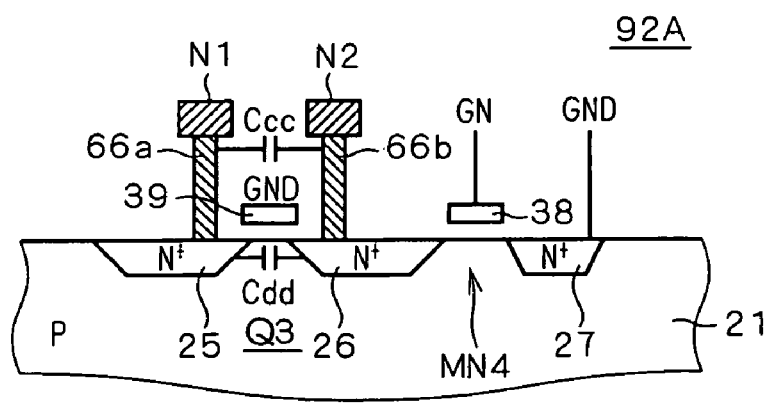
FIG. 16 is a cross-sectional view taken along line Y1–Y1' of FIG. 15.

FIG. 15 is a plan view showing the structure of the target capacitance forming part 92A according to the fifth preferred embodiment. FIG. 16 is a cross-sectional view taken along line Y1–Y1' of FIG. 15.

As shown in these drawings, N$^+$ diffusion regions 25, 26 and 27 are selectively formed in the surface of the P well region 21, and a gate electrode 39 is formed above the P well region 21 between the N$^+$ diffusion regions 25 and 26. The N$^+$ diffusion regions 25, 26 and the gate electrode 39 form an NMOS transistor Q3 for measurement.

The nodes N1 and N2 serving as interconnect layers are formed at a level above the gate electrode 39 and at about the same level as each other. They are electrically connected through contact holes (first and second contact holes) 66a and 66b to the N$^+$ diffusion regions 25 and 26, respectively.

A gate electrode 38 is formed above the P well region 21 between the N$^+$ diffusion regions 26 and 27. The N$^+$ diffusion regions 26, 27 and the gate electrode 38 form the NMOS transistor MN4. The gate electrode 38 is applied with the NMOS gate potential GN, and the N$^+$ diffusion region 27 and the gate electrode 39 are applied with the potential GND.

Here, what we actually want to measure is a coupling capacitance $C_{cc}$ formed between the contact holes 66a and 66b of the nodes N1 and N2. At this time, a junction capacitance $C_{dd}$ is formed in the P well region 21 between the N$^+$ diffusion regions 25 and 26.

Figure 17:
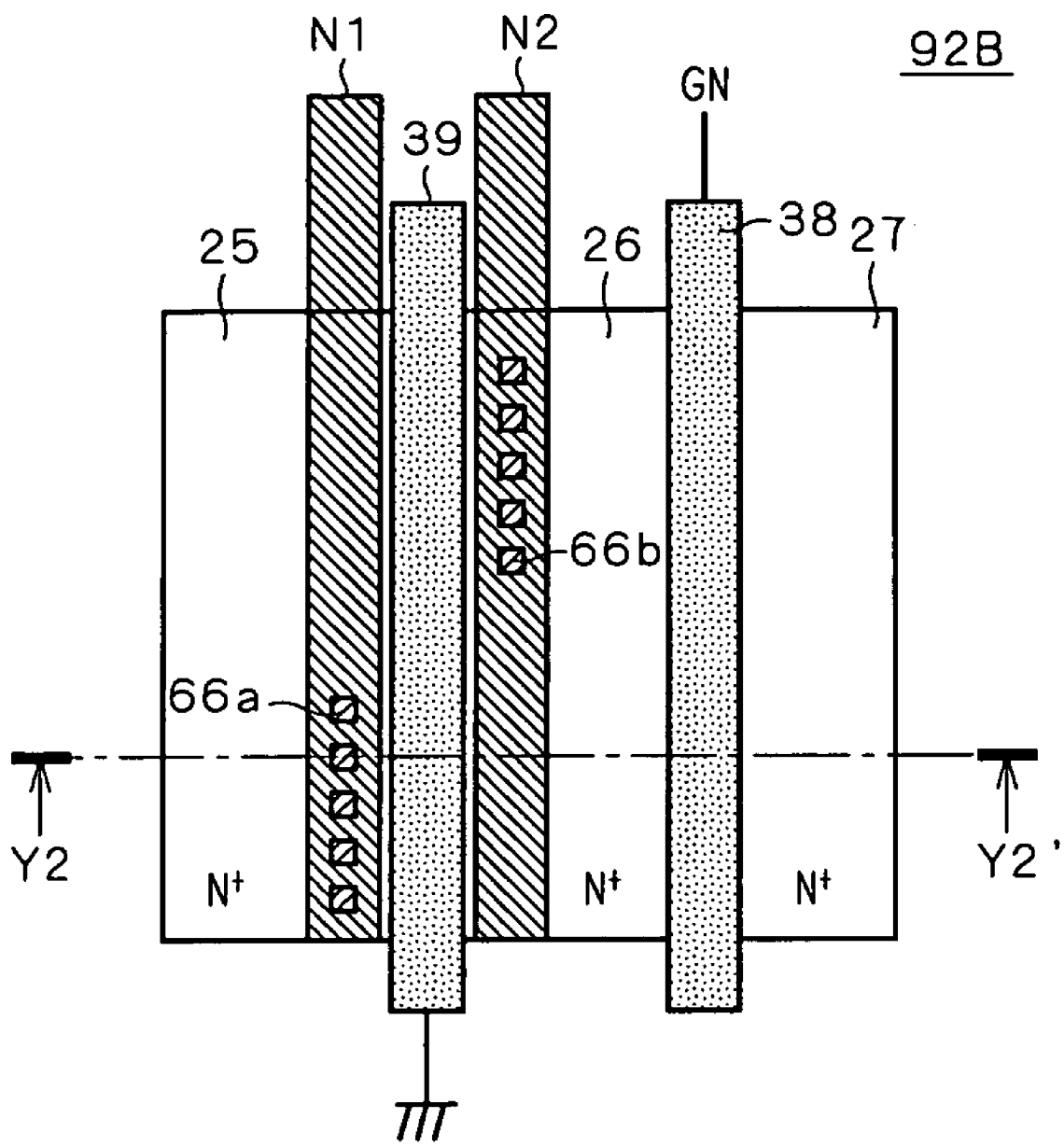
FIG. 17 is a plan view showing the structure of a target capacitance forming part of a second circuit according to the fifth preferred embodiment.
Figure 18:
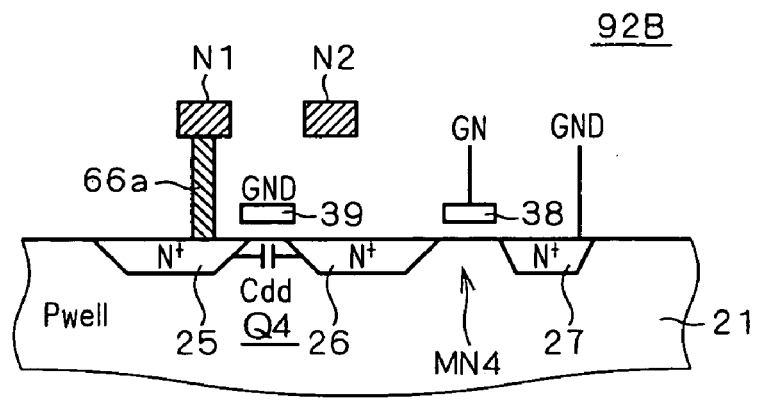
FIG. 18 is a cross-sectional view taken along line Y2–Y2' of FIG. 17.

FIG. 17 is a plan view showing the structure of a target capacitance forming part 92B of a second circuit in the CBCM circuit according to the fifth preferred embodiment. FIG. 18 is a cross-sectional view taken along line Y2–Y2' of FIG. 17. The circuit configuration itself is identical to that of the first circuit except that the target capacitance forming part 92A is replaced by the target capacitance forming part 92B.

As shown in FIG. 17, in an NMOS transistor Q4 for measurement which is equivalent to the NMOS transistor Q3 for measurement, the contact holes 66a of the node N1 and the contact holes 66b of the node N2 are formed such that not a single one of them are opposed to each other, whereby a contact-to-contact capacitance becomes zero. The other parts of the configuration are identical to those of the target capacitance forming part 92A and thus not described herein.

Hereinbelow, we describe a method of measuring the coupling capacitance $C_{cc}$ using the first and second circuits in the CBCM circuit of the fifth preferred embodiment.

By measuring the currents $I_m[A]$ and $I_m[B]$ in the first and second circuits, respectively, the following equations (14) and (15) are derived:

$$I_m[A] = (C_{cc} + C_{dd} + C_{xx}) \times V_{dd} \times f \quad (14)$$

$$I_m[B] = (C_{dd} + C_{xx}) \times V_{dd} \times f \quad (15)$$

Where $C_{xx}$ is any other capacitance (not shown in FIGS. 15–17) that accompanies the node N2.

As a result, the coupling capacitance $C_{cc}$ is given by the following equation (16):

$$C_{cc} = (I_m[A] - I_m[B])/(V_{dd} \times f) \quad (16)$$

Then, by measuring the currents $I_t[A]$ and $I_t[B]$ in the first and second circuits, respectively, the following equations (17) and (18) are derived:

$$I_t[A] = C_{tst}[A] \times V_{dd} \times f \quad (17)$$
$$= (C_{yy} + C_{cc} + C_{dd}) \times V_{dd} \times f$$

$$I_t[B] = C_{tst}[B] \times V_{dd} \times f \quad (18)$$
$$= (C_{yy} + C_{dd}) \times V_{dd} \times f$$

Where $C_{yy}$ is any other capacitance (not shown in FIGS. 15–17) that accompanies the node N2.

From the equations (16) to (18), the coupling capacitance $C_{cc}$ is given by the following equation (19):

$$C_{cc} = (I_t[A] - I_t[B])/(V_{dd} \times f) \quad (19)$$

By in this way employing the first and second circuits including the target capacitance forming parts 92A and 92B of different layout structures in the CBCM circuit, each component of the contact-to-contact capacitance can be measured separately.

(Other Forms)

Figure 19:
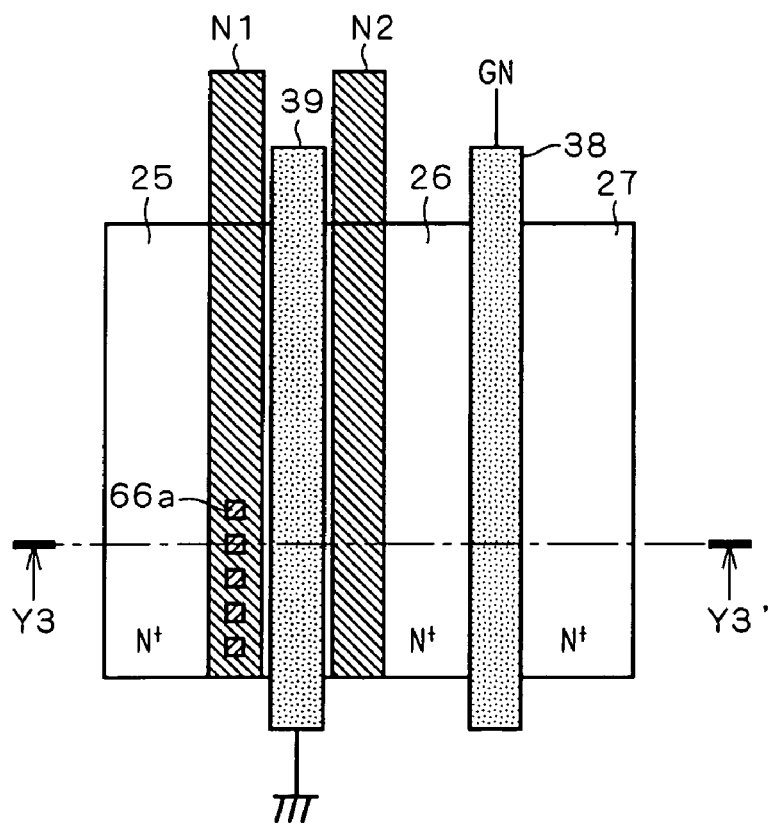
FIG. 19 is a plan view showing another preferred form of the target capacitance forming part of the first circuit according to the fifth preferred embodiment.

FIG. 19 is a plan view showing another form of the target capacitance forming part 92B according to the fifth preferred embodiment. FIG. 18 corresponds also to a cross-sectional configuration taken along line Y3–Y3' of FIG. 19.

As shown in FIG. 19, only the contact holes 66a are formed in the node N1 and no contact hole 66b is formed in the node N2. Thereby, the contact-to-contact capacitance becomes zero. The other parts of the configuration are identical to those shown in FIGS. 17 and 18 and thus not described herein.

By using the structure shown in FIG. 19 for the second circuit and applying the method of measuring the, coupling capacitance $C_{cc}$ using the above equations (14) to (19), the same effect can be achieved.

SIXTH PREFERRED EMBODIMENT

Figure 20:
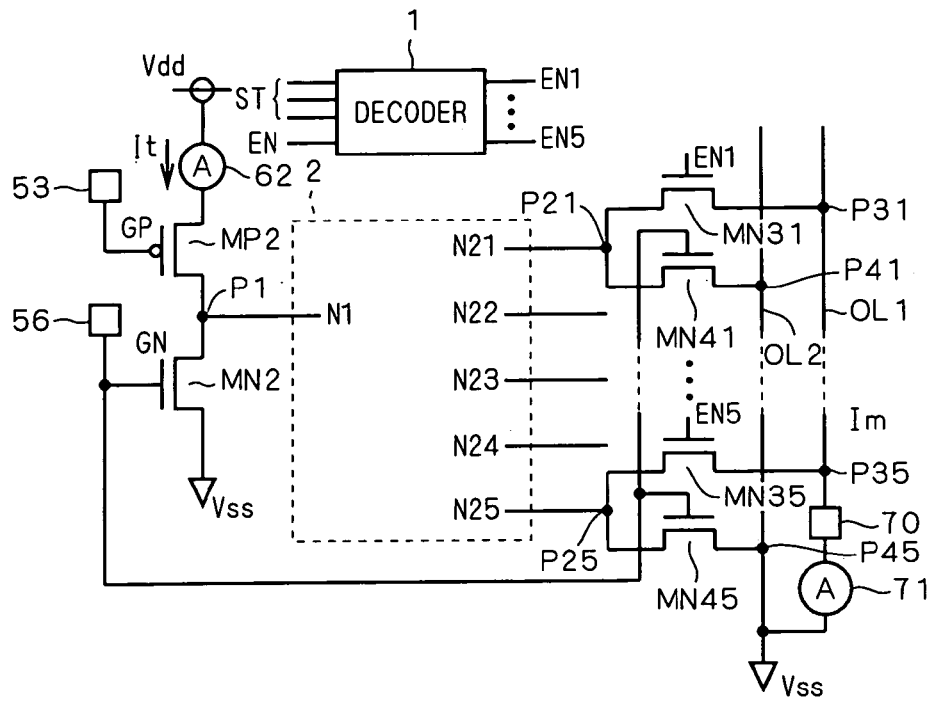
FIG. 20 is a circuit diagram showing a configuration of a CBCM circuit according to a sixth preferred embodiment of the present invention.

FIG. 20 is a circuit diagram showing a configuration of a CBCM circuit according to a sixth preferred embodiment of the present invention. The PMOS transistor MP2 and the NMOS transistor MN2 are connected in series. The source of the PMOS transistor MP2 is applied with the power supply voltage $V_{dd}$, and the source of the NMOS transistor MN2 is grounded. The gate of the PMOS transistor MP2 is connected to the pad 53 and the gate of the NMOS transistor MN2 is connected to the pad 56.

The node N1 (serving as an interconnect layer) is connected to the terminal P1 between the drains of the PMOS transistor MP2 and the NMOS transistor MN2. The node N1 and nodes N21 through N25 (all serving as interconnect layers) are located at predetermined intervals in a target capacitance forming part 2. Coupling capacitances $C_{c1}$, $C_{c2}$, $C_{c3}$, $C_{c4}$ and $C_{c5}$ are formed between the node N1 and the nodes N21 to N25, respectively. The nodes N21 to N25 are connected to terminals P21 to P25, respectively. Thus, the target capacitance forming part 2 is formed between the terminal P1 and the terminals P21 to P25.

The terminals P21 to P25 are connected through NMOS transistors MN31 to MN35 to terminals P31 to P35, respectively and they are also connected through NMOS transistors MN41 to MN45 to terminals P41 to P45, respectively.

The gates of the NMOS transistors MN31 to MN35 are applied with enable voltages EN1 to EN5, respectively and the gates of the NMOS transistors MN41 to MN45 are connected to the pad 56.

The terminals P31 to P35 are connected to a common output line OL1 which is connected to a pad 70. A current meter 71 is inserted between the pad 70 and the ground level so as to be capable of measuring a current $I_m$ flowing from the pad 70 to the ground level. The terminals P41 to P45 are connected to a common output line OL2 which is grounded.

A decoder 1 receives a 3-bit selection signal ST and a 1-bit enable voltage EN and on the basis of the selection signal ST, outputs the enable voltage EN as either one of the enable voltages EN1 to EN5. That is, the decoder 1 serves as a selector which selects one of the terminals P21 to P25 by outputting the input enable voltage EN as either one of the enable voltages EN1 to EN5 on the basis of the selection signal ST, and then transmits a current induced from the selected terminal to the output line OL1.

Figure 21:
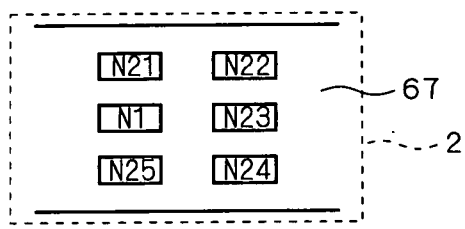
FIG. 21 is a cross-sectional view showing an example of a target capacitance forming part according to the sixth preferred embodiment.

FIG. 21 is a cross-sectional view showing an example of the target capacitance forming part 2. As shown in the drawing, the nodes N21 and N22 are formed as upper interconnect layers, the nodes N1 and N23 as middle interconnect layers, and the nodes N25 and N24 as lower interconnect layers. These nodes N1 and N21 to N25 are isolated from each other by the insulating layer 67.

More specifically, the node N21 is located directly above the node N1, the node N25 directly below the node N1, the node N23 beside the node N1, the node N22 angularly above the node N1, and the node N24 angularly below the node N1.

Figure 22:
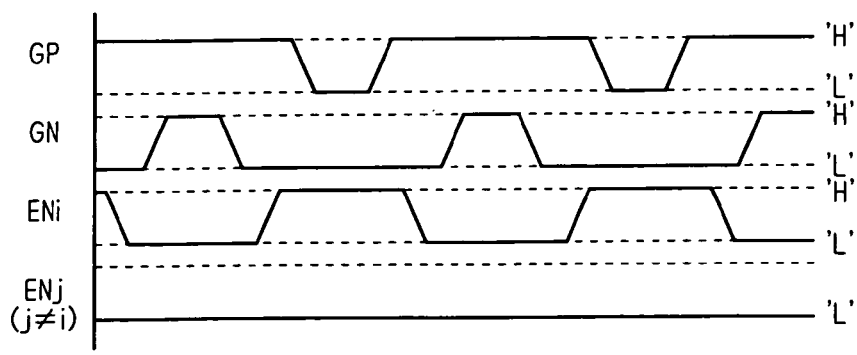
FIG. 22 is a timing chart showing the operation of the CBCM circuit according to the sixth preferred embodiment.

FIG. 22 is a timing chart showing the operation of the CBCM circuit according to the sixth preferred embodiment. As shown in the drawing, the PMOS gate potential GP and the NMOS gate potential GN are applied such that the PMOS transistor MP2 and the NMOS transistor MN2 are alternately turned on without overlapping and that before the PMOS transistor MP2 is turned on (i.e., the PMOS gate potential GP transitions to "L"), a selected enable voltage ENi (i is any number between 1 and 5) out of the enable voltages EN1 to EN5 transitions to "H".

Thus, when the PMOS gate potential GP is low, the current meter 62 can detect the current $I_t$ and the current meter 71 can detect the current $I_m$ which is obtained through the NMOS transistor MN3i and the pad 70.

The enable voltages ENj (j is any number between 1 and 5 except i) not selected are fixed at "L" and the NMOS transistors MN4j are kept in the off state.

As a result, the coupling capacitance $C_{ci}$ between the node N1 and the node N2i and the like can be calculated based on the currents $I_m$ and $I_t$ which are obtained using the CBCM circuit according to the sixth preferred embodiment.

Figure 23:
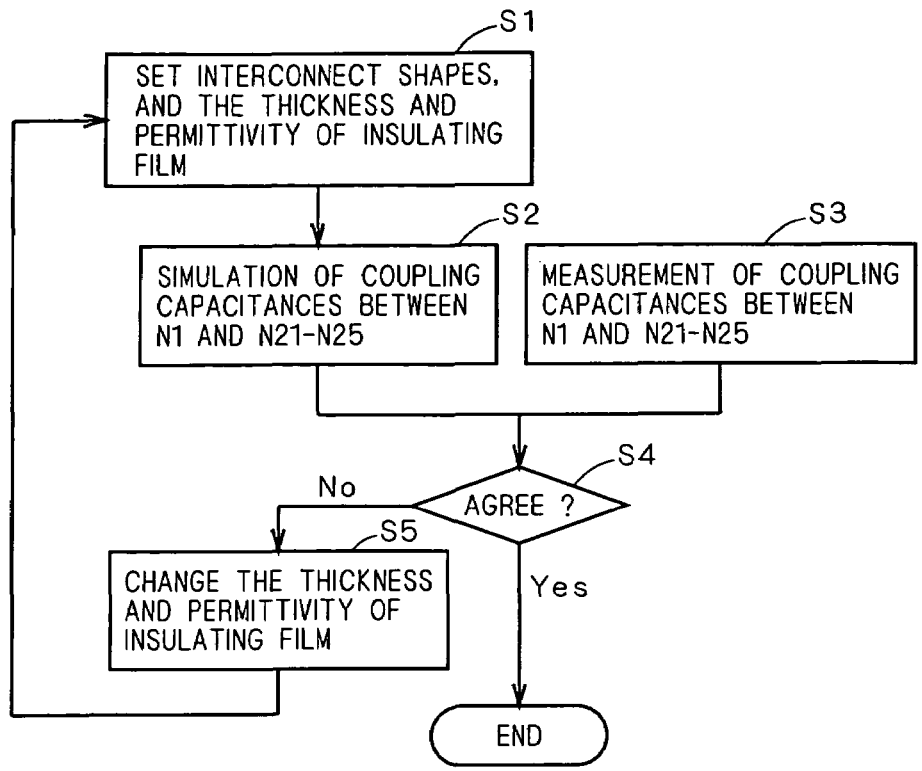
FIG. 23 is a flow chart showing an interconnection characteristics analysis method using the CBCM circuit according to the sixth preferred embodiment.

FIG. 23 is a flowchart showing a interconnection characteristics analysis method using the CBCM circuit according to the sixth preferred embodiment.

Referring to the drawing, step S1 is to set interconnection characteristics including the interconnect shapes of the nodes N1 and N21 to N25 (including a line-to-line distance between different interconnect lines) and the film thickness and (relative) permittivity of the insulating layer 67 formed between upper and lower interconnect layers, e.g., between the nodes N1 and N21. Although the insulating layer 67 is shown as a single layer in FIG. 21, it usually has a multilayer structure having different insulating layers formed between interconnect layers, and the permittivity of the insulating layer 67 varies depending on the height thereof.

In step S2, a predetermined simulation is performed based on the interconnection characteristics set in step S1 so as to obtain the coupling capacitances $C_{c1}$ to $C_{c5}$ between the node N1 and the nodes N21 to N25, respectively, by means other than measurement.

In step S3, on the other hand, the coupling capacitances $C_{c1}$ to $C_{c5}$ are obtained by measurement in the manner as above described using the CBCM circuit according to the sixth preferred embodiment in which the target capacitance forming part 2 has the multilayer interconnect structure shown in FIG. 21.

In step S4, comparisons are made between the simulated values of the coupling capacitances $C_{c1}$ to $C_{c5}$ obtained in step S2 and the measured values of the coupling capacitances $C_{c1}$ to $C_{c5}$ obtained in step S3.

If the comparison results of step S4 show agreement, the values set in step S1 are judged as being correct and the process is completed. If disagree, the process goes to step S5.

In step S5, the interconnection characteristics such as the film thickness and permittivity of the insulating layer 67 between upper and lower interconnect layers are changed and reset in step S1.

Hereinafter, the steps S1, S2, S4 and S5 are repeated until the comparisons of step S4 result in agreement. The measurement of step S3 should be performed only once.

Accordingly, when agreement is obtained in step S4, accurate estimates of the film thickness and permittivity of the insulating layer 67 can be obtained. This results in high-precision analysis of the interconnection characteristics.

As above described, in the CBCM circuit according to the sixth preferred embodiment, since the sources of the NMOS transistors MN31 to MN35 are connected in common to the output line OL1, only a single pad 70 is required for measurement of the current $I_m$ flowing through the NMOS transistors MN31 to MN35. This reduces the number of pads.

Further, because the decoder 1 outputs 5 bits of the enable voltages EN1 to EN5 based on the 3-bit selection signal ST and the 1-bit enable voltage EN, the number of input bits and the number of pads for the input bits are both one less than when 5 bits of the enable voltages EN1 to EN5 are directly input.

Still further, since only one kind of the enable voltage EN is actually input, the number of signals for the enable voltage is four signals less than when the enable voltages EN1 to EN5 are directly input.

In step S2, instead of performing a simulation, a response surface function may be used. The response surface function means a function for use in a case where interconnect capacitance values which vary with changes in the interconnection characteristics, such as the film thickness and permittivity of the insulating film and the distance between interconnect lines, according to experimental design are previously calculated by special simulations and then, the simulation results are outputted using the above interconnection characteristics as arguments.

SEVENTH PREFERRED EMBODIMENT

Figure 24:
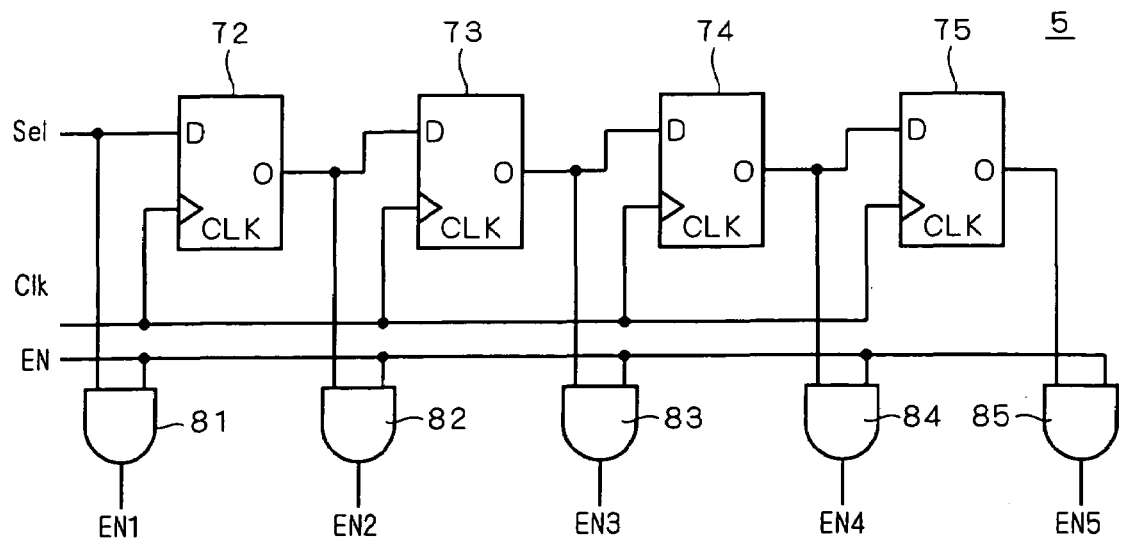
FIG. 24 is a circuit diagram showing the structure of another decoder according to a seventh preferred embodiment of the present invention.

FIG. 24 is a circuit diagram showing the structure of another decoder according to a seventh preferred embodiment of the present invention. As shown in the drawing, a decoder 5 is comprised of four series-connected D-FFs (D-type flip-flops) 72 through 75 and AND gates 81 through 85.

The D-FFs 72 to 75 receive in common a clock signal Clk at their clock inputs CLK and the D-FF 72 receives a 1-bit selection signal Sel at its input D. The selection signal Sel becomes one input of the AND gate 81 and signals obtained from outputs O of the D-FFs 72 to 75 become one inputs of the AND gates 82 to 85, respectively. The enable voltage EN is applied as the other common input to the AND gates 81 to 85.

The output signals of the AND gates 81 to 85 become the enable voltages EN1 to EN5, respectively.

In this structure, based on the selection signal Sel and the clock signal Clk, signal processing is performed either to transition the selection signal Sel to "L" after any one of the D-FFs 72 to 75 is latched into "H" or to transition the selection signal Sel to "H" after all the D-FFs 72 to 75 are latched into "L".

Accordingly, the enable voltage EN is outputted as any one of the enable voltages EN1 to EN5. The decoder 5 can thus perform a function equivalent to that of the decoder 1 shown in FIG. 20.

The decoder 5 according to the seventh preferred embodiment requires only 3 bits for the input signal; thus, the number of input pads is one less than that in the decoder 1 according to the sixth preferred embodiment.

EIGHTH PREFERRED EMBODIMENT

Figure 25:
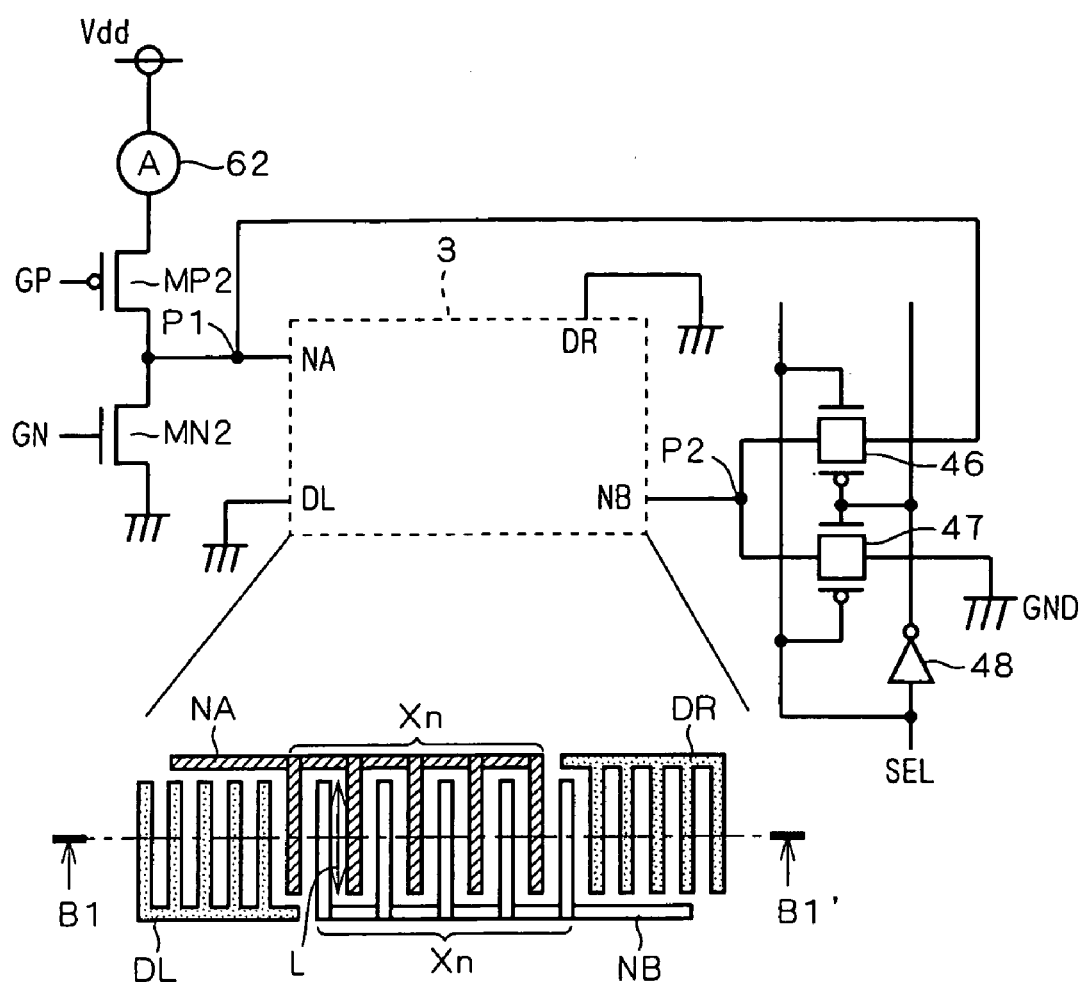
FIG. 25 is an explanatory diagram schematically showing a circuit configuration according to an eighth preferred embodiment of the present invention.

FIG. 25 is an explanatory diagram schematically showing a circuit configuration according to an eighth preferred embodiment of the present invention. As shown in the drawing, the PMOS transistor MP2 and the NMOS transistor MN2 are connected in series. The source of the PMOS transistor MP2 is applied with the power supply voltage $V_{dd}$ and the source of the NMOS transistor MN2 is grounded. Further, the PMOS gate potential GP is applied to the gate of the PMOS transistor MP2 and the NMOS gate potential GN is applied to the gate of the NMOS transistor MN2.

The terminal P1 between the PMOS transistor MP2 and the NMOS transistor MN2 is connected to a measuring target node NA (serving as one electrode of capacitance) in a target capacitance forming part 3. A measuring target node NB (serving as the other electrode of the capacitance) in the target capacitance forming part 3 is connected through the terminal P2 and a transfer gate 46 to the measuring target node NA and connected through the terminal P2 and a transfer gate 47 to ground. In this way, the target capacitance forming part 3 is provided between the terminals P1 and P2.

Further, the current meter 62 is provided between the PMOS transistor MP2 and the power supply $V_{dd}$ for measurement of supply current to the terminal P1.

The selection signal SEL is applied to an NMOS gate of the transfer gate 46 and a PMOS gate of the transfer gate 47, and a signal obtained by transmitting the selection signal SEL through an inverter 48 is applied to a PMOS gate of the transfer gate 46 and an NMOS gate of the transfer gate 47. The transfer gates 46, 47 and the inverter 48 serve as a terminal state changer which changes the state of the terminal P2 (node N2) based on the selection signal SEL.

The target capacitance forming part 3 further includes, in addition to the measuring target nodes NA and NB, dummy nodes DL and DR (serving as dummy electrodes) which are both grounded.

In the target capacitance forming part 3 (illustrated in plan configuration in FIG. 25), the measuring target nodes NA and NB each have a comb-like structure and they are located such that n teeth of the measuring target node NA and n teeth of the measuring target node NB are in opposed spaced relation with predetermined intervals. The dummy nodes DL and DR each having the same comb-like structure as the measuring target nodes NA and NB are provided at the handles of the measuring target nodes NA and NB, respectively. The rightmost teeth of the dummy node DL is spaced at the above predetermined interval from the leftmost teeth of the measuring target node NA, and the leftmost teeth of the dummy node DR is spaced at the above predetermined interval from the rightmost teeth of the measuring target node NB.

Figure 26:
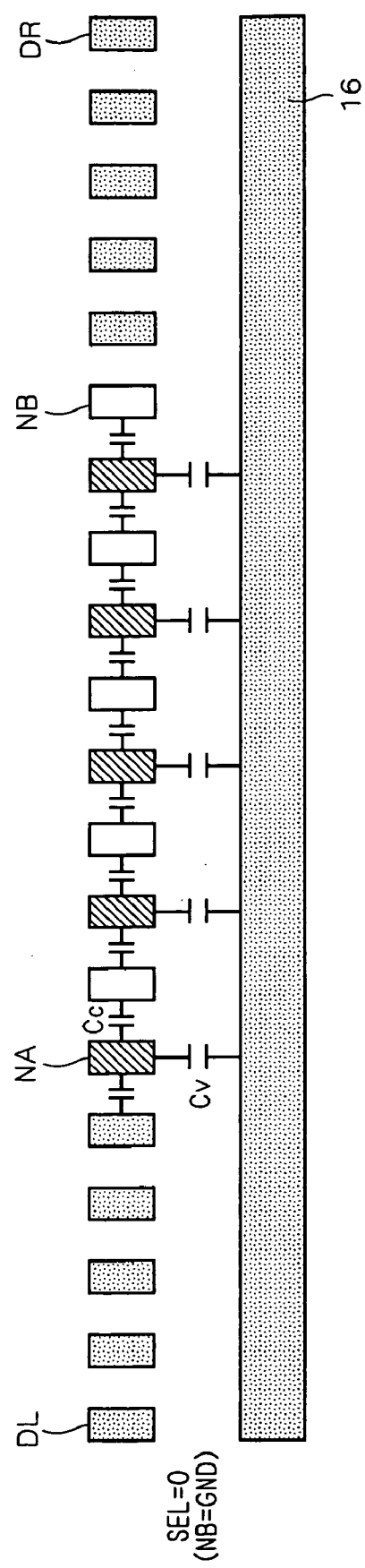
FIG. 26 is a cross-sectional view showing a first state of a target capacitance forming part according to the eighth preferred embodiment.
Figure 27:
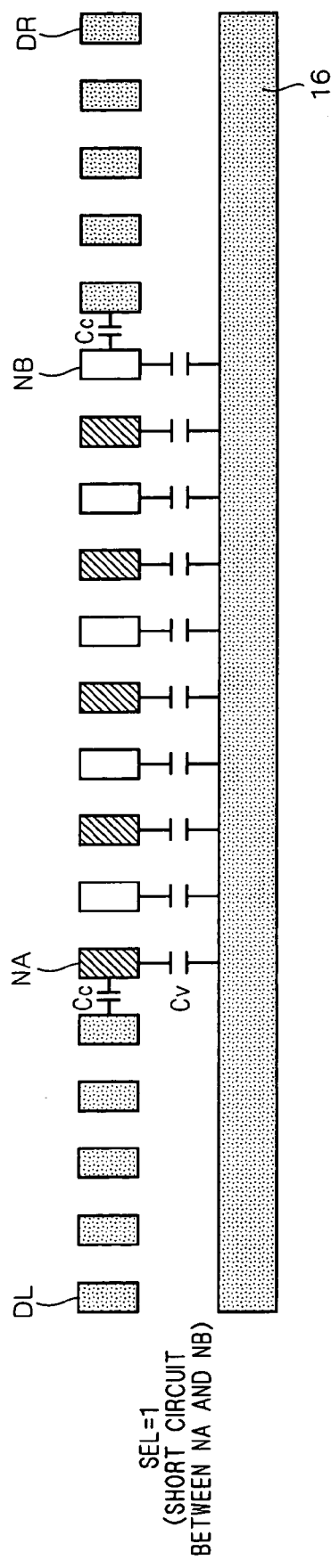
FIG. 27 is a cross-sectional view showing a second state of the target capacitance forming part according to the eighth preferred embodiment.

FIGS. 26 and 27 are cross-sectional views showing cross-sectional configurations taken along line B1–B1' of FIG. 25. FIG. 26 shows the case where the selection signal SEL="0" ("L") and the measuring target node NB is grounded through the transfer gate 47 which is in the on-state, and FIG. 27 shows the case where the selection signal="1" ("H") and the measuring target nodes NA and NB are short-circuited.

As shown in FIG. 26, where the selection signal SEL="0" (first state), (2n-1) coupling capacitances $C_c$ (in the example of FIG. 26, n=5) are formed between respective ones of the teeth of the measuring target nodes NA and NB and one coupling capacitance $C_c$ is formed between the rightmost teeth of the dummy node DL and the leftmost teeth of the measuring target node NA. Thus, a total of 2n coupling capacitances $C_c$ are formed.

Further, n interconnect capacitances $C_v$ are formed between the measuring target node NA and a lower interconnect layer 16. A minor capacitance α described later is also formed. Accordingly, a total capacitance $C_{total}$ is given by the following equation (20):

$$C_{total}=2n \times C_c + n \times C_v + \alpha \quad (20)$$

As shown in FIG. 27, where the selection signal SEL="1" (second state), because the measuring target nodes NA and NB are short-circuited, only one coupling capacitance $C_c$ is formed between the rightmost teeth of the dummy node DL and the leftmost teeth of the measuring target node NA and only one coupling capacitance $C_c$ is formed between the leftmost teeth of the dummy node DR and the rightmost teeth of the measuring target node NA. That is, a total of two coupling capacitances $C_c$ are formed.

Further, 2n interconnect capacitances $C_v$ are formed between the measuring target nodes NA, NB and the lower interconnect layer 16. A minor capacitance β is also formed. Accordingly, the total capacitance $C_{total}$ is given by the following equation (21):

$$C_{total}=2 \times C_c + 2n \times C_v + \beta \quad (21)$$

The minor capacitances α and β refer to capacitances such as parasitic capacitances occurring at connections between the gates of transistors forming the transfer gates 46, 47 and the inverter 48 and occurring at portions other than the teeth.

Consequently, by measuring the current supplied from the drain of the PMOS transistor MP2 to the terminal P1 with the current meter 62 and solving the above equations (20) and (21), the coupling capacitance $C_c$ and the interconnect capacitance $C_v$ can be obtained separately.

At this time, the provision of the dummy nodes DL and DR allows the formation of the coupling capacitances $C_c$ even when the selection signal SEL="1". This improves the accuracy of separation into the coupling capacitance $C_c$ and the interconnect capacitance $C_v$. The formation of the dummy nodes DL and DR further smoothes out a difference in pattern density between the teeth portions of the measuring target nodes NA and NB and other portions. Thus, the teeth portions of the measuring target nodes NA and NB can be formed with accuracy.

Figure 28:
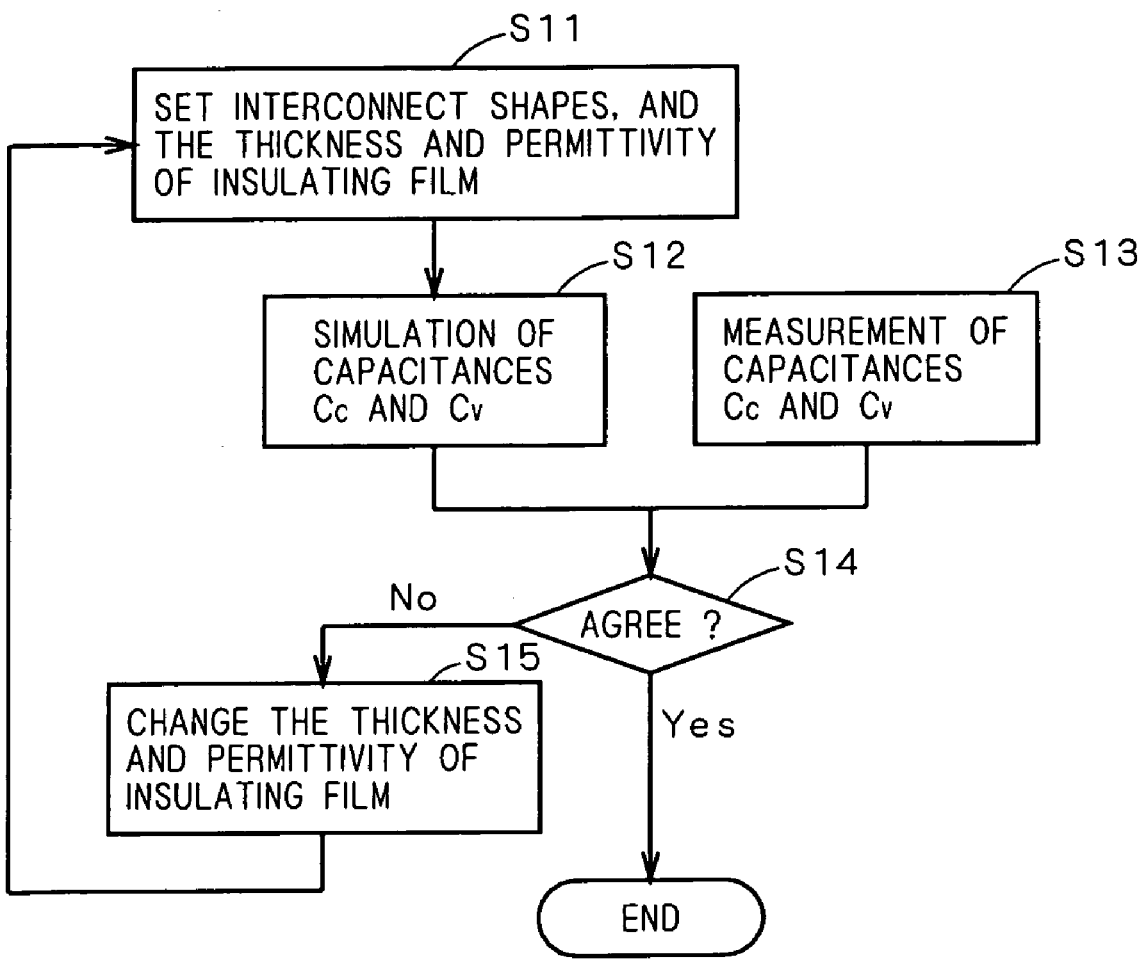
FIG. 28 is a flow chart showing an interconnection characteristics analysis method using the CBCM circuit according to the eighth preferred embodiment.

FIG. 28 is a flowchart showing an interconnection characteristics analysis method using the CBCM circuit according to the eighth preferred embodiment.

Referring to the drawing, step S11 is to set interconnection characteristics such as the interconnect shapes of the measuring target nodes NA and NB (including a distance between adjacent teeth of the nodes NA and NB) and the film thickness and permittivity of an insulating layer formed between the measuring target node NA (NB) and the lower interconnect layer 16.

In step S12, a predetermined simulation is performed based on the interconnection characteristics set in step S11 so as to obtain the coupling capacitance $C_c$ and the interconnect capacitance $C_v$ by means other than measurement.

In step S13, on the other hand, the coupling capacitance $C_c$ and the interconnect capacitance $C_v$ are obtained by measurement in the manner as above described using the CBCM circuit according to the eighth preferred embodiment.

In step S14, comparisons are made between the simulated values of the coupling capacitance $C_c$ and the interconnect capacitance $C_v$ obtained in step S12 and the measured values of the coupling capacitance $C_c$ and the interconnect capacitance $C_v$ obtained in step S13.

If the comparison results of step S14 show agreement, the values set in step S11 are judged as being correct and the process is completed. If disagree, the process goes to step S15.

In step S15, the interconnection characteristics including the aforementioned film thickness and permittivity of the insulating layer are changed and reset in step S11.

Hereinafter, the steps S11, S12, S14 and S15 are repeated until the comparisons of step S14 result in agreement. The measurement of step S13 should be performed only once.

Thus, when agreement is obtained in step S14, accurate estimates of the interconnect characteristics including the film thickness and permittivity of the insulating layer can be obtained. This results in high-precision analysis of the interconnection characteristics.

As in the sixth preferred embodiment, instead of performing a simulation, the response surface function may be used in step S12.

NINTH PREFERRED EMBODIMENT

Figure 29:
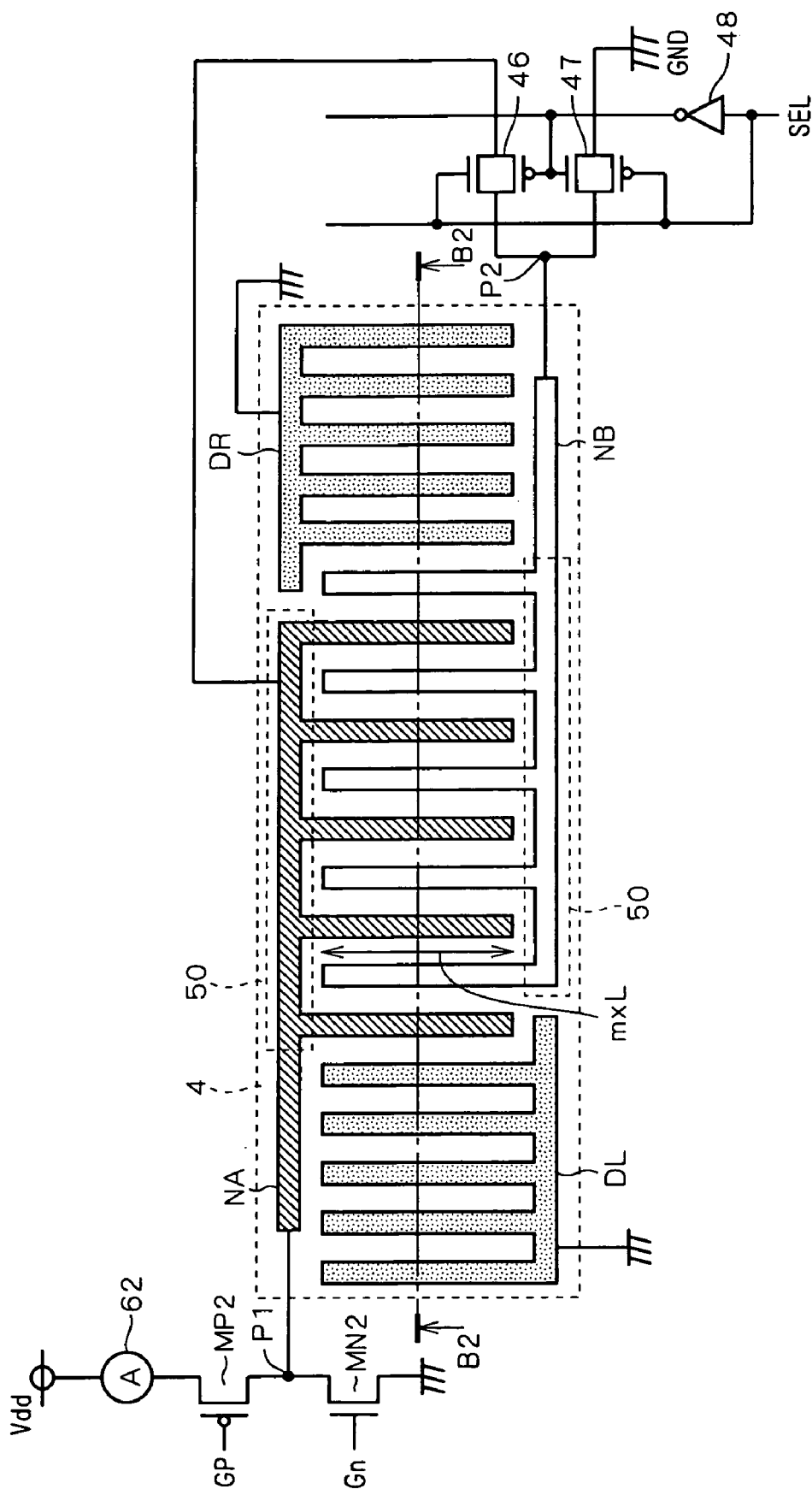
FIG. 29 is an explanatory diagram schematically showing a circuit configuration of an auxiliary CBCM circuit according to a ninth preferred embodiment of the present invention.

FIG. 29 is an explanatory diagram schematically showing a circuit configuration of an auxiliary CBCM circuit in a CBCM circuit according to a ninth preferred embodiment of the present invention. The CBCM circuit according to the ninth preferred embodiment is comprised of the auxiliary CBCM circuit shown in FIG. 29 and the CBCM circuit according to the eighth preferred embodiment shown in FIGS. 25 to 27.

As shown in the drawing, the auxiliary CBCM circuit according to the ninth preferred embodiment differs from the CBCM circuit according to the eighth preferred embodiment in that the target capacitance forming part 3 is replaced by an auxiliary target capacitance forming part 4.

In the auxiliary target capacitance forming part 4 (illustrated in plan configuration in FIG. 29), the measuring target nodes NA and NB serving as one and the other electrodes of capacitance each have a comb-like structure and they are located such that n teeth of the measuring target node NA and n teeth of the measuring target node NB are in opposed spaced relation with predetermined intervals. In the auxiliary target capacitance forming part 4, however, the length of the teeth of the measuring target nodes NA and NB (excluding fringe portions 50, i.e., portions around the roots of the teeth, which are not related to the coupling capacitances) is set to be m times the length L of the teeth, i.e.,(m×L), in the target capacitance forming part 3 according to the eighth preferred embodiment. The other parts of the configuration are identical to those in the eighth preferred embodiment shown in FIG. 25.

Figure 30:
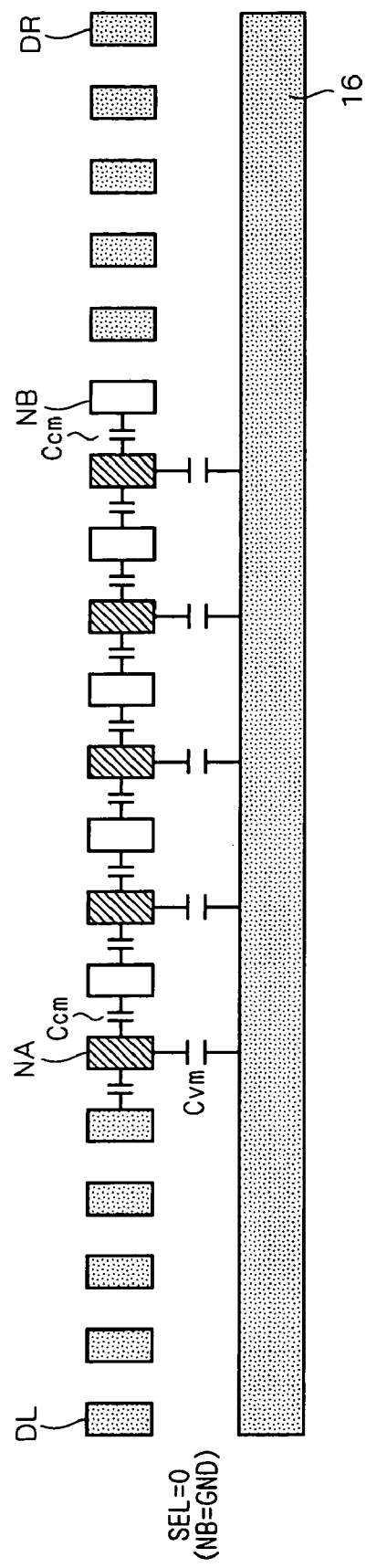
FIG. 30 is a cross-sectional view showing a first state of a target capacitance forming part according to the ninth preferred embodiment.
Figure 31:
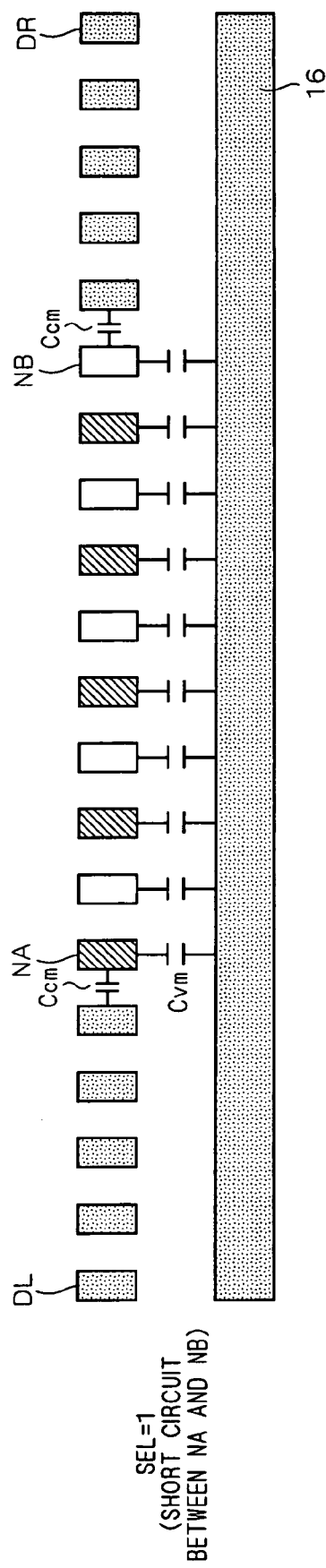
FIG. 31 is a cross-sectional view showing a second state of the target capacitance forming part according to the ninth preferred embodiment.

FIGS. 30 and 31 are cross-sectional views showing cross-sectional configurations taken along line B2—B2 of FIG. 29. FIG. 30 shows the case where the selection signal SEL="0", and FIG. 31 shows the case where the selection signal SEL="1".

As shown in FIG. 30, where the selection signal SEL="0", a total of 2n coupling capacitances $C_{cm}$ (n=5 in FIG. 30) are formed as in the eighth preferred embodiment. Here, the coupling capacitance $C_{cm}$=m×$C_c$.

Further, n interconnect capacitances $C_{vm}$ are formed between the measuring target node NA and the lower interconnect layer 16. Here, the interconnect capacitance $C_{vm}$=m×$C_v$. The minor capacitance α is also formed. Accordingly, the following equation (22) can be generated for the reference capacitance $C_{ref}$:

$$C_{ref}=m\times(2n\times C_c+n\times C_v)+\alpha \qquad (22)$$

As shown in FIG. 31, where the selection signal SEL="1", a total of two coupling capacitances $C_{cm}$ are formed as in the eighth preferred embodiment.

Further, as in the eighth preferred embodiment, 2n interconnect capacitances $C_{vm}$ are formed between the measuring target nodes NA, NB and the lower interconnect layer 16. The minor capacitance β is also formed. Accordingly, the following equation (23) can be generated for the reference capacitance $C_{ref}$:

$$C_{ref}=m\times(2C_c+2n\times C_v)+\beta \qquad (23)$$

Consequently, by measuring the current supplied from the drain of the PMOS transistor MP2 to the terminal P1 with the current meter 62 in the total of four cases described above, i.e., in the "0" and "1" states of the selection signal SEL in both the CBCM circuit according to the eighth preferred embodiment and the auxiliary CBCM circuit according to the ninth preferred embodiment and then solving the above equations (20) through (23), the coupling capacitance $C_c$ and the interconnect capacitance $C_v$ with the minor capacitances α and β removed can be obtained independently and more accurately than in the eighth preferred embodiment.

TENTH PREFERRED EMBODIMENT

Figure 32:
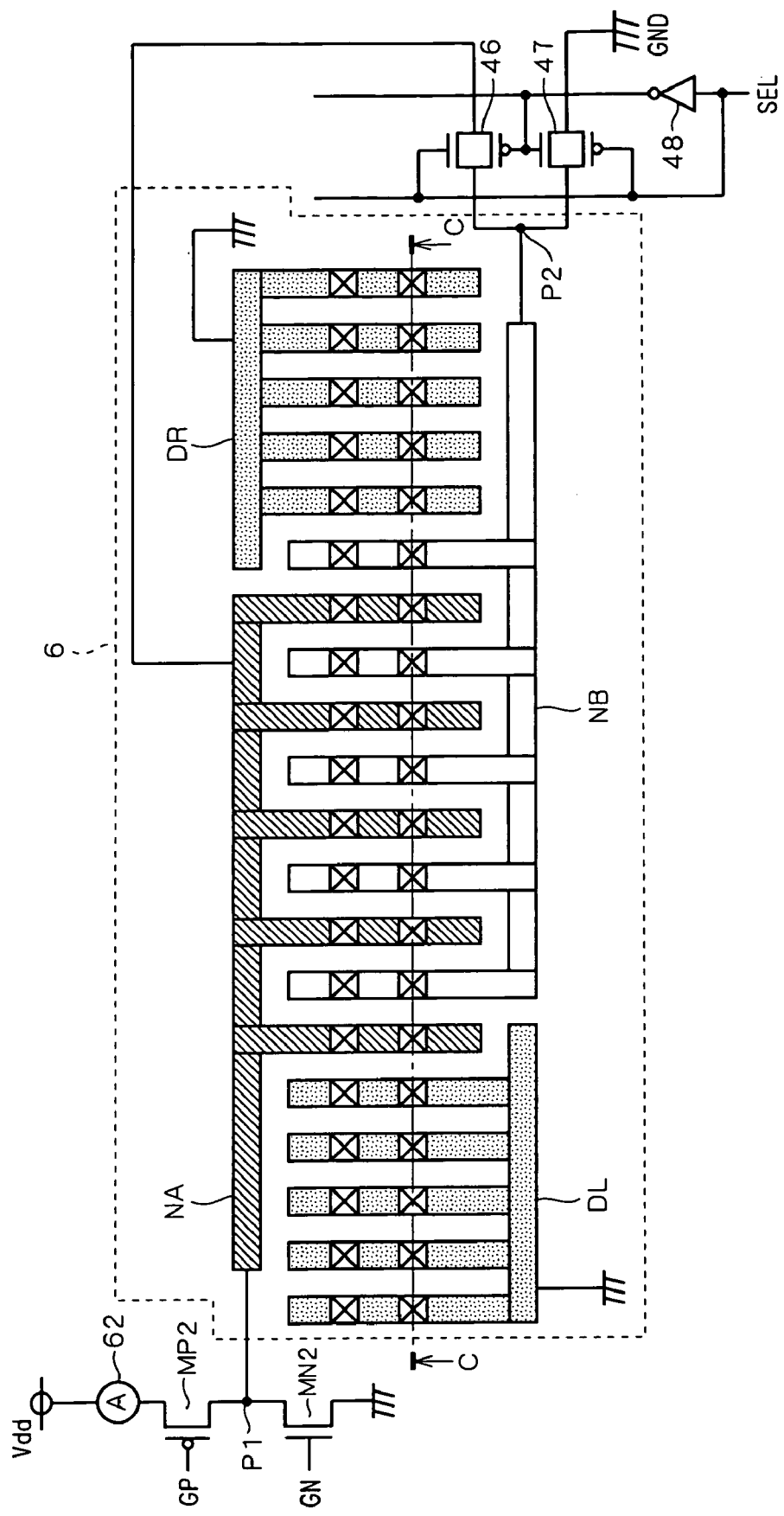
FIG. 32 is an explanatory diagram schematically showing a circuit configuration of a TEST circuit in a CBCM circuit according to a tenth preferred embodiment of the present invention.

FIG. 32 is an explanatory diagram schematically showing a circuit configuration of a TEST circuit (first circuit) in a CBCM circuit according to a tenth preferred embodiment of the present invention.

As shown in the drawing, the TEST circuit according to the tenth preferred embodiment differs from the CBCM circuit according to the eighth preferred embodiment in that the target capacitance forming part 3 is replaced by a target capacitance forming part 6.

In the target capacitance forming part 6 (illustrated in plan configuration in FIG. 32), the measuring target nodes NA and NB serving as one and the other electrodes of capacitance each have a comb-like structure and they are located such that five teeth of the measuring target node NA and five teeth of the measuring target node NB are in opposed spaced relation with predetermined intervals. Further, the dummy nodes DL and DR (serving as dummy electrodes) of the same comb-like structure as the measuring target nodes NA and NB are formed at the handles of the measuring target nodes NA and NB, respectively. The rightmost teeth of the dummy node DL is spaced at the above predetermined interval from the leftmost teeth of the measuring target node NA, and the leftmost teeth of the dummy node DR is spaced at the above predetermined interval from the rightmost teeth of the measuring target node NB. The other parts of the configuration are identical to those of the target capacitance forming part 3 according to the eighth preferred embodiment shown in FIG. 25.

Figure 33:
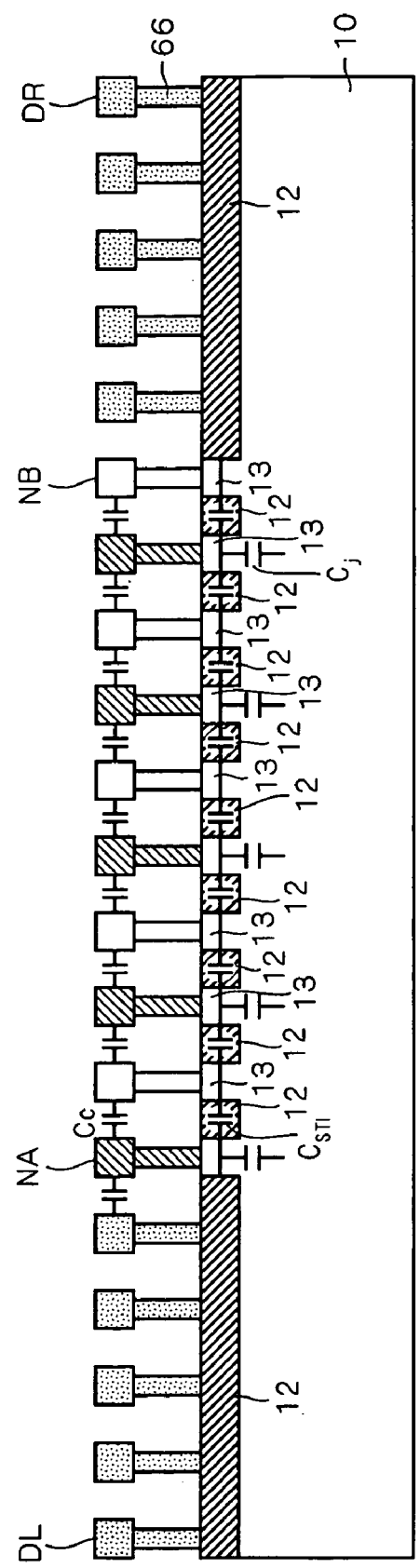
FIG. 33 is a cross-sectional view showing a first state of a target capacitance forming part of the TEST circuit according to the tenth preferred embodiment.
Figure 34:
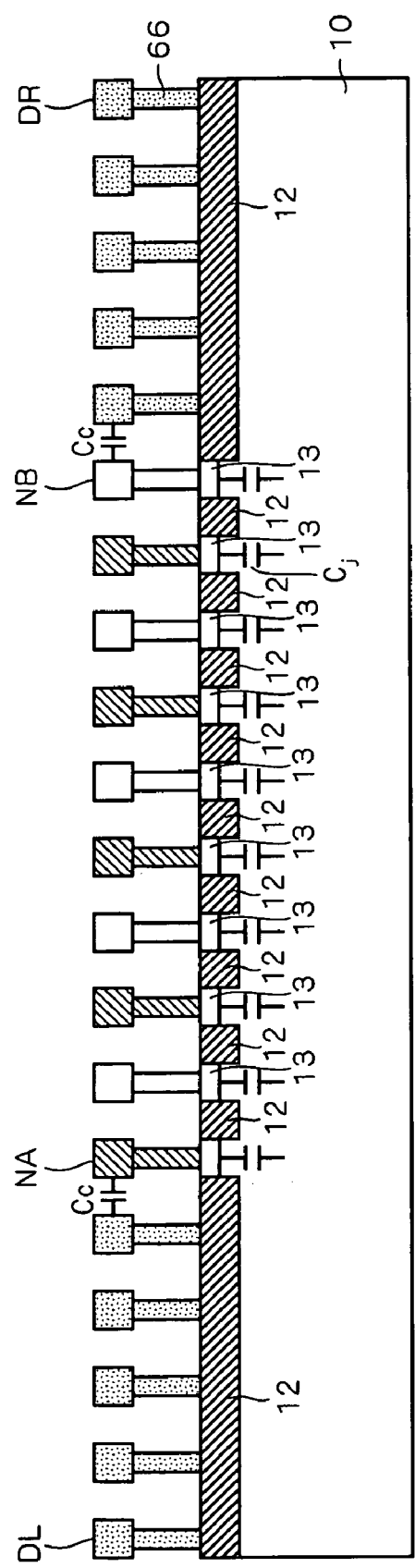
FIG. 34 is a cross-sectional view showing a second state of the target capacitance forming part of the TEST circuit according to the tenth preferred embodiment.

FIGS. 33 and 34 are cross-sectional views showing cross-sectional configurations taken along line C—C of FIG. 32. FIG. 33 shows the case where the selection signal SEL="0" (first state), and FIG. 34 shows the case where the selection signal SEL="1" (second state).

As shown in these drawings, a silicon substrate 10 is provided as a lower interconnect layer of the measuring target nodes NA and NB. Diffusion regions 13 are formed as active regions in a portion of the surface of the silicon substrate 10 which is located below the measuring target nodes NA and NB, and STI regions 12 are formed in the other portion of the surface of the silicon substrate 10 to provide isolation between the diffusion regions 13. The width of each of the diffusion regions 13 and the length of the STI region 12 between adjacent diffusion regions 13 are set equal. Also, each of the diffusion regions 13 has the same area and the same perimeter. The diffusion regions 13 are, for example, n-type diffusion regions.

Contact holes (contact plugs) 66 are formed between the teeth of the measuring target nodes NA, NB and the diffusion regions 13 located therebelow and between the dummy nodes DL and DR and the STI regions 12 located therebelow. As shown in FIG. 32, the teeth of the measuring target nodes NA, NB and the dummy nodes DL, DR each have two contact holes 66.

By forming the dummy nodes DL and DR of the same comb-like structure as the measuring target nodes NA and NB, a difference in pattern density between the teeth portions of the measuring target nodes NA and NB and other portions can be smoothed out and the teeth of the measuring target nodes NA and NB can be formed with accuracy. This improves processing accuracy.

Figure 35:
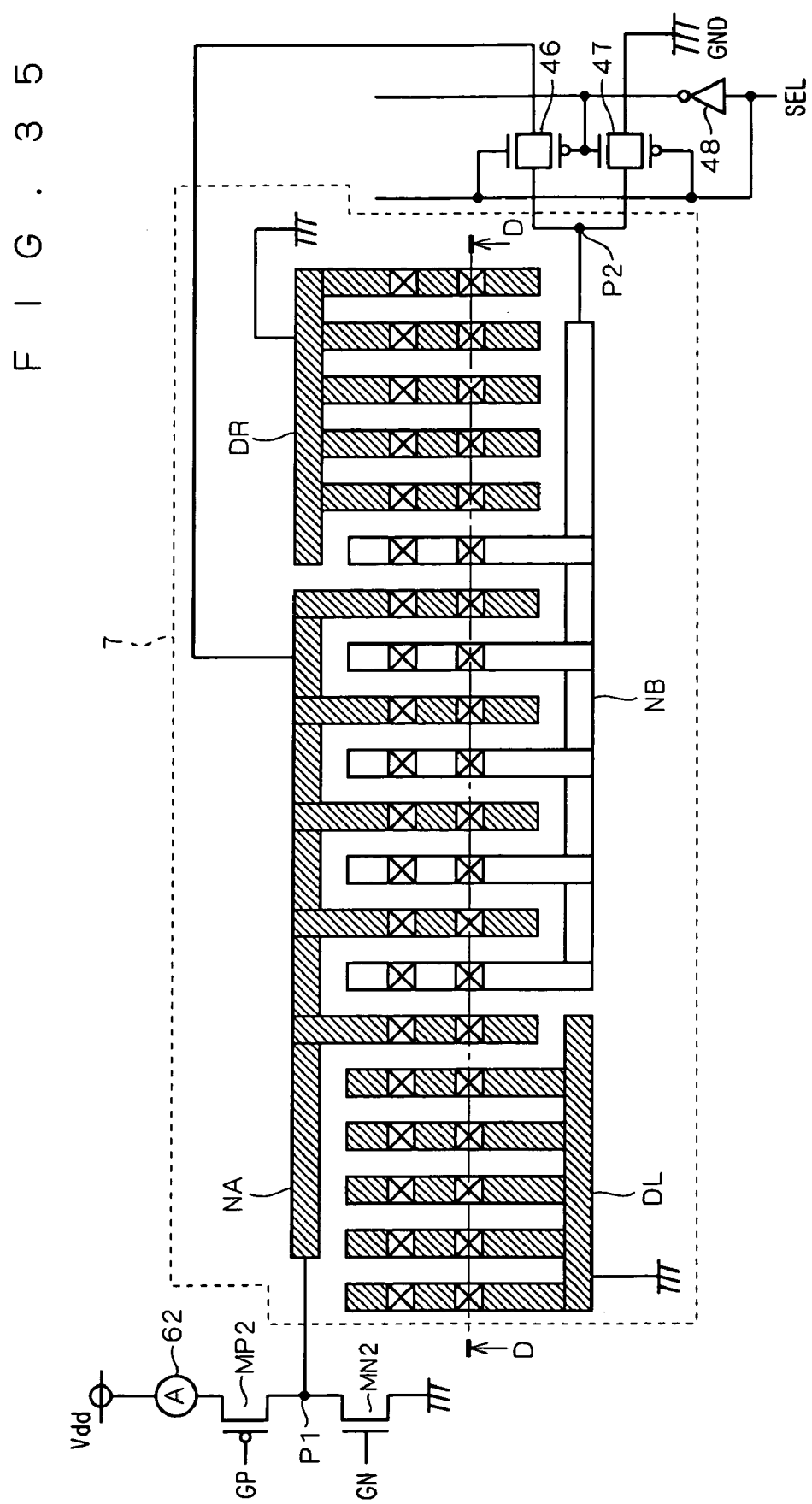
FIG. 35 is an explanatory diagram schematically showing a circuit configuration of a REF circuit according to the tenth preferred embodiment.

FIG. 35 is an explanatory diagram schematically showing a circuit configuration of a REF circuit (second circuit) according to the tenth preferred embodiment of the present invention. This REF circuit is provided in addition to the TEST circuit shown in FIGS. 32 to 34. That is, the CBCM circuit according to the tenth preferred embodiment is comprised of the TEST circuit and the REF circuit.

As shown in the drawing, this REF circuit differs from the TEST circuit shown in FIGS. 32 to 34 in that the target capacitance forming part 6 is replaced by a target capacitance forming part 7.

Figure 36:
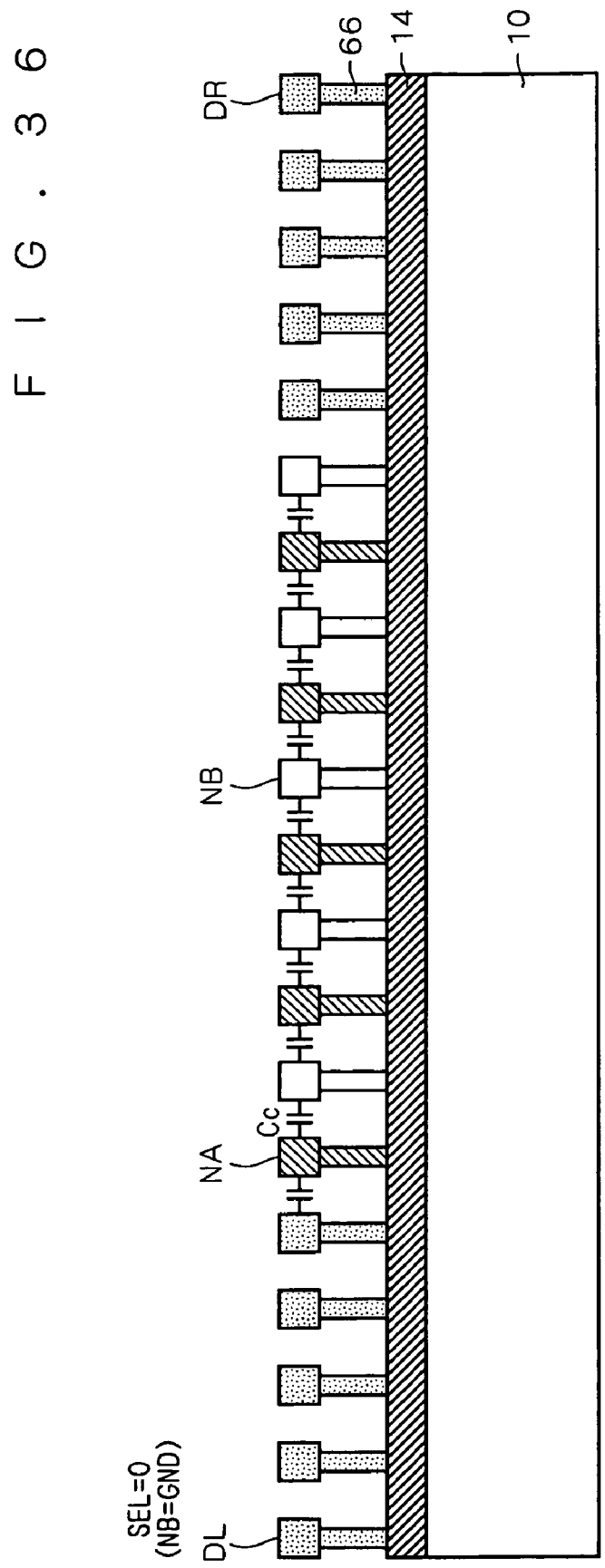
FIG. 36 is a cross-sectional view showing a first state of a target capacitance forming part of the REF circuit according to the tenth preferred embodiment.
Figure 37:
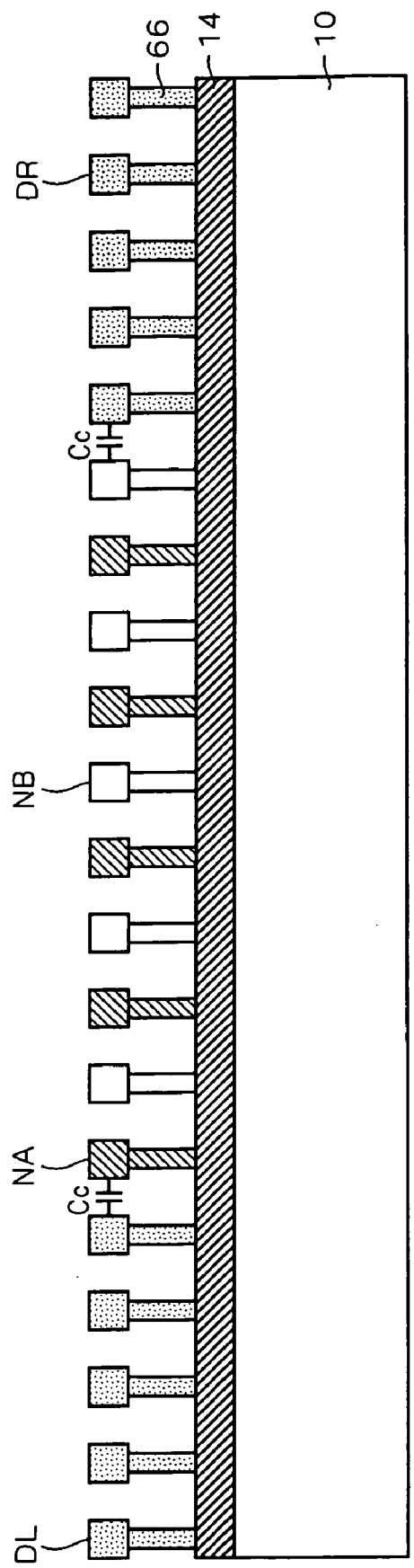
FIG. 37 is a cross-sectional view showing a second state of the target capacitance forming part of the REF circuit according to the tenth preferred embodiment.

FIGS. 36 and 37 are cross-sectional views showing cross-sectional configurations taken along line D—D of FIG. 35. FIG. 36 shows the case where the selection signal SEL="0", and FIG. 37 shows the case where the selection signal SEL="1".

As shown in these drawings, the silicon substrate 10 is provided as a lower interconnect layer of the measuring target nodes NA and NB, and an STI region 14 is formed in the entire surface of the silicon substrate 10 without forming the diffusion regions 13. The other parts of the target capacitance forming part 7 are identical to those of the target capacitance forming part 6.

Hereinbelow, we describe a method of measuring capacitance values using the CBCM circuit (TEST circuit and REF circuit) according to the tenth preferred embodiment. First, measurements using the TEST circuit are carried out.

As shown in FIG. 33, where the selection signal SEL="0", nine coupling capacitances $C_c$ are formed between adjacent teeth of the measuring target nodes NA and NB or between their corresponding contact holes 66, and one coupling capacitance $C_c$ is formed between the rightmost teeth of the dummy node DL and the leftmost teeth of the measuring target node NA or between their corresponding contact holes 66. That is, a total of 10 coupling capacitances $C_c$ are formed.

Further, five junction capacitances $C_j$ are formed in the diffusion regions (first active regions) 13 which are located below the measuring target node NA. The junction capacitance $C_j$ is a capacitance at the PN junction formed between the diffusion region 13 and the silicon substrate 10. Also, a total of nine coupling capacitances $C_{sti}$ are formed in the STI regions 12 which are formed between adjacent ones of the ten diffusion regions 13. Accordingly, a first test capacitance CT1 that can be measured by charge applied from the measuring target node NA can be obtained from the following equation (24):

$$CT1 = 10C_c + 9C_{sti} + 5C_j + \alpha \quad (24)$$

The minor capacitance α refers to parasitic capacitances occurring for example at connections between the gates of transistors forming the transfer gates 46, 47 and the inverter 48 and occurring due to routing of the measuring target node NA (i.e., occurring at portions other than the teeth).

As shown in FIG. 34, where the selection signal SEL="1", because the measuring target nodes NA and NB are short-circuited, only one coupling capacitance $C_c$ is formed between the rightmost teeth of the dummy node DL and the leftmost teeth of the measuring target node NA or between their corresponding contact holes 66, and one coupling capacitance $C_c$ is formed between the leftmost teeth of the dummy node DR and the rightmost teeth of the measuring target node NB or between their corresponding contact holes 66. That is, a total of two coupling capacitances $C_c$ are formed.

Further, a total of 10 junction capacitances $C_j$ are formed; more specifically, five in the diffusion regions (first active regions) 13 which are located below the measuring target nodes NA and five in the diffusion regions (second active regions) 13 which are located below the measuring target node NB. Since the measuring target nodes NA and NB are short-circuit and thereby all the diffusion regions 13 are placed at the same potential, no coupling capacitance $C_{sti}$ is formed between adjacent diffusion regions 13.

Accordingly, a second test capacitance CT2 that can be measured by charge applied from the measuring target node NA can be obtained from the following equation (25):

$$CT2 = 2C_c + 10C_j + \beta \quad (25)$$

The minor capacitance β refers to parasitic capacitances of the same property as the minor capacitance α, but it takes a different value from the minor capacitance α because the measuring target nodes NA and NB are short-circuited.

Next, measurements using the REF circuit are carried out.

As shown in FIG. 36, where the selection signal SEL="0", a total of ten coupling capacitances $C_c$ are formed as in the case of the TEST circuit.

In the REF circuit, however, neither the junction capacitance $C_j$ nor the coupling capacitance $C_{sti}$ is formed because the diffusion regions 13 are not formed. Accordingly, a first reference capacitance CR1 that can be measured by charge applied from the measuring target node NA can be obtained from the following equation (26):

$$CR1=10C_c+\alpha \quad (26)$$

As shown in FIG. 37, where the selection signal SEL="1", because the measuring target nodes NA and NB are short-circuited, a total of two coupling capacitances $C_c$ are formed as in the case of the TEST circuit. Since the diffusion regions 13 are not formed in the REF circuit, neither the junction capacitance $C_j$ nor the coupling capacitance $C_{sti}$ is formed.

Accordingly, a second reference capacitance CR2 that can be measured by charge applied from the measuring target node NA can be obtained from the following equation (27):

$$CR2=2C_c+\beta \quad (27)$$

In the CBCM circuit according to the tenth preferred embodiment, therefore, the above equations (21) to (27) can be generated by measuring the supply current to the terminal P1 with the current meter 62 a total of four times, i.e., in the "0" and "1" states of the selection signal="0" in both the TEST and REF circuits. That is, the above equations (21) to (27) can be generated by measuring four supply currents obtained in the two states of the selection signal SEL in both the TEST and the REF circuits.

The subtraction of the equation (21) from the equation (26) gives the following equation (28):

$$CT1-CR1=9C_{sti}+5C_j \quad (28)$$

Also, the subtraction of the equation (25) from the equation (27) gives the following equation (29):

$$CT2-CR2=10C_j \quad (29)$$

From the equations (28) and (29), the coupling capacitance $C_{sti}$ is given by the following equation (30):

$$C_{sti} = \frac{1}{9}(CT1-CR1) - \frac{1}{18}(CT2-CR2) \quad (30)$$

In this way, the coupling capacitance $C_{sti}$ between adjacent diffusion regions 13 that has been difficult to measure with conventional CBCM circuits can be obtained with accuracy.

While in the example of this preferred embodiment, the measuring target nodes NA and NB each have five teeth, each teeth having two contact holes 66, and ten diffusion regions 13 are formed, such numbers are only provisionally decided for convenience of description and thus to be regarded as illustrative rather than restrictive.

In the above tenth preferred embodiment and subsequent eleventh through sixteenth preferred embodiments described below, the CBCM circuit is comprised of two circuits (TEST and REF circuits). Further, in the tenth preferred embodiment and the subsequent eleventh through fourteenth preferred embodiments described below, the measuring target nodes NA and NB shall serve as one and the other electrodes of the coupling capacitance $C_c$ and the dummy nodes DL and DR shall serve as one and the other dummy electrodes of that capacitance.

ELEVENTH PREFERRED EMBODIMENT

Figure 38:
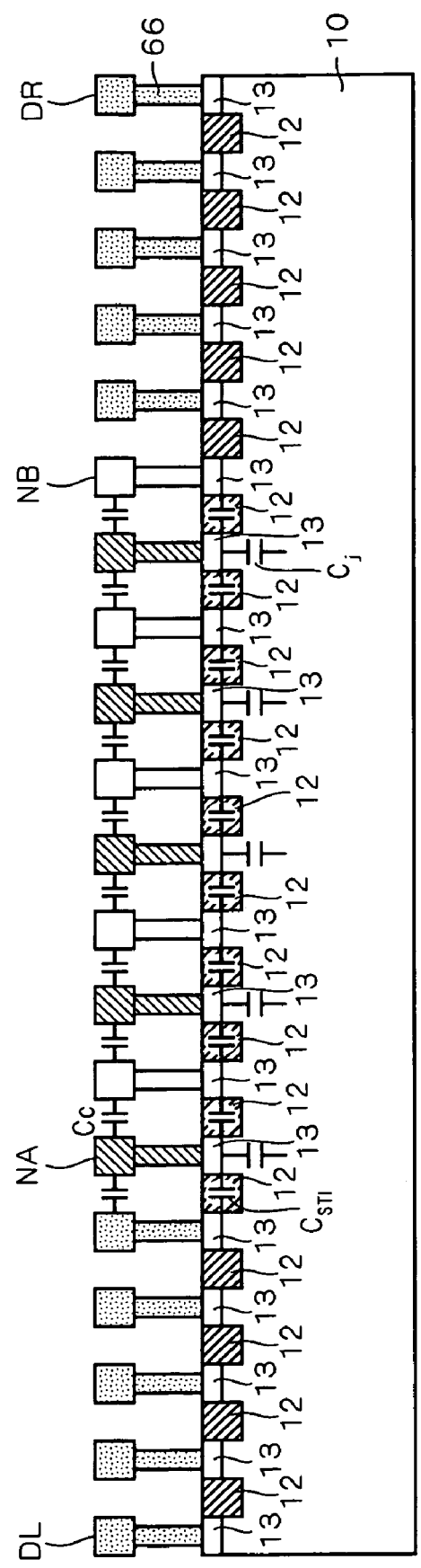
FIG. 38 is a cross-sectional view showing a first state of a target capacitance forming part of a TEST circuit according to an eleventh preferred embodiment of the present invention.
Figure 39:
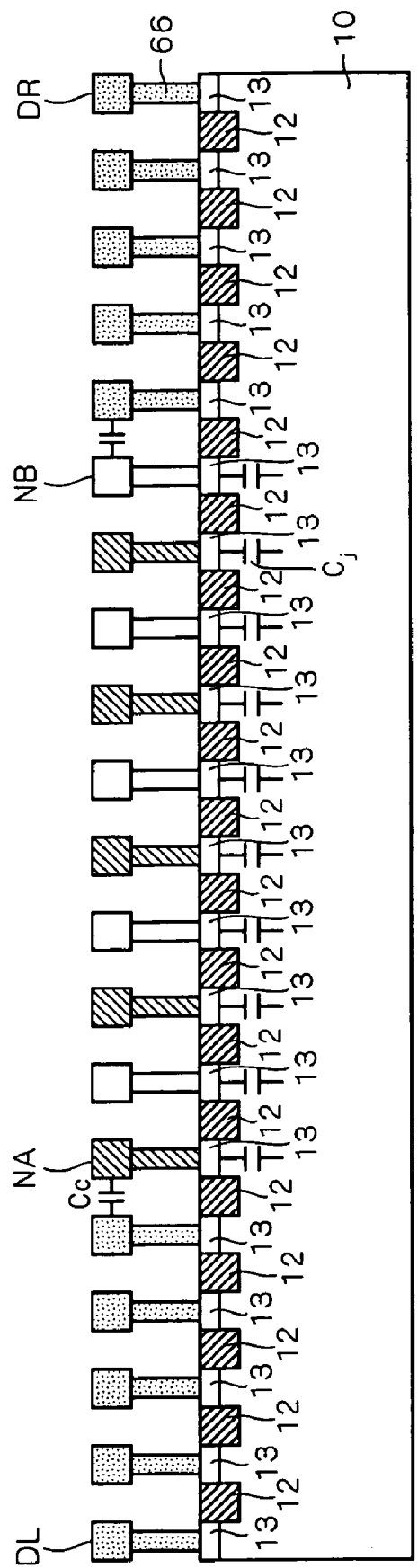
FIG. 39 is a cross-sectional view showing a second state of the target capacitance forming part of the TEST circuit according to the eleventh preferred embodiment.

FIGS. 38 and 39 are cross-sectional views showing a cross-sectional configuration of the TEST circuit in a CBCM circuit according to an eleventh preferred embodiment of the present invention. The plan configuration thereof is identical to that shown in FIG. 32. FIG. 38 and 39 show a cross-section taken along line C—C of FIG. 32; more specifically, FIG. 38 shows the case where the selection signal SEL="0" and FIG. 39 shows the case where the selection signal SEL="1".

As shown in these drawings, the diffusion regions (dummy active regions) 13 are also formed in a portion of the surface of the silicon substrate 10 which is located below the dummy nodes DL and DR outside the portion where the measuring target nodes NA and NB are formed. Correspondingly, contact holes 66 are formed between the dummy nodes DL, DR and the diffusion regions 13. The widths of all the diffusion regions 13 including those located below the dummy nodes DL and DR and the length of the STI region 12 between adjacent diffusion regions 13 are set to equal. Also, each of the diffusion regions 13 has the same area and the same perimeter.

All the diffusion regions 13 including those located below the measuring target nodes NA and NB are isolated from each other by the STI regions 12. The other parts of the configuration are identical to those of the TEST circuit according to the tenth preferred embodiment shown in FIGS. 33 and 34.

By in this way forming the diffusion regions 13 also in the surface of the silicon substrate 10 below the dummy nodes DL and DR, a difference in pattern density of the diffusion regions 13 can be smoothed out. This improves processing accuracy for the diffusion regions 13 formed below the measuring target nodes NA and NB.

Figure 40:
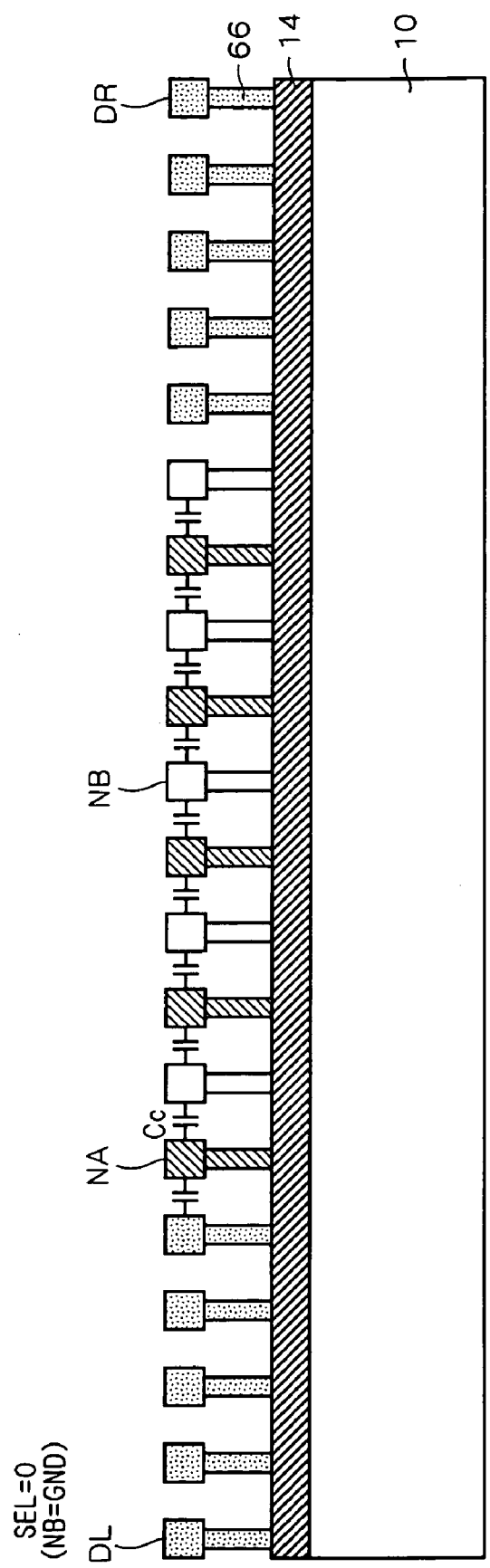
FIG. 40 is a cross-sectional view showing a first state of a target capacitance forming part of a REF circuit according to the eleventh preferred embodiment.
Figure 41:
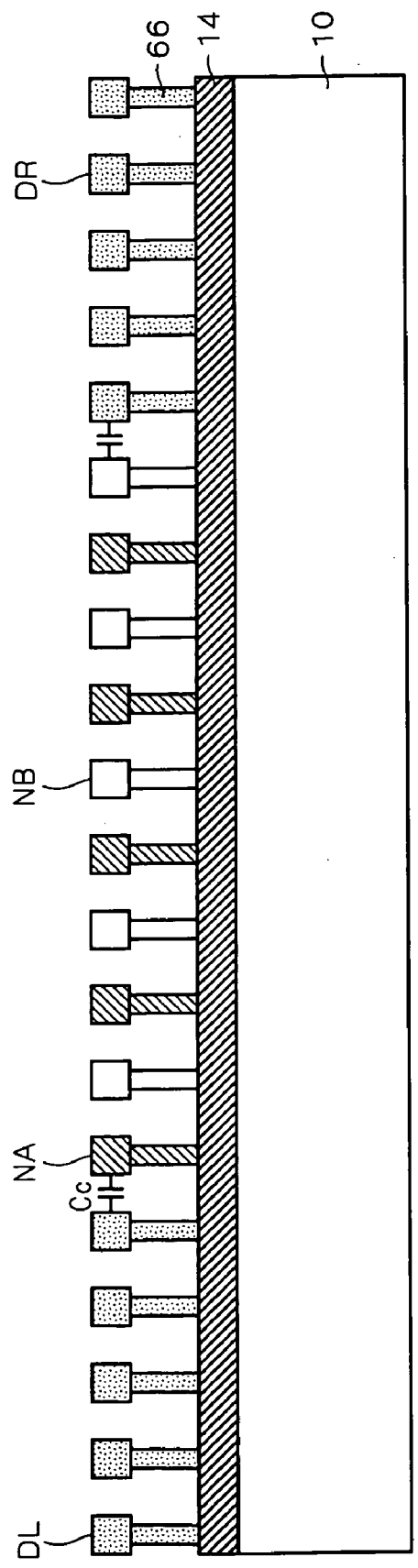
FIG. 41 is a cross-sectional view showing a second state of the target capacitance forming part of the REF circuit according to the eleventh preferred embodiment.

FIGS. 40 and 41 are cross-sectional views showing a cross-sectional configuration of the REF circuit in the CBCM circuit according to the eleventh preferred embodiment. The plan configuration thereof is identical to that shown in FIG. 35. FIG. 40 and 41 show a cross-section taken along line D13 D of FIG. 35; more specifically, FIG. 40 shows the case where the selection signal SEL="0" and FIG. 41 shows the case where the selection signal SEL="1".

As shown in these drawings, the silicon substrate 10 is provided as a lower interconnect layer of the measuring target nodes NA and NB, and the STI region 14 is formed in the entire surface of the silicon substrate 10 without forming the diffusion regions 13. The other parts of the configuration of the target capacitance forming part 7 are identical to those of the target capacitance forming part 6.

Hereinbelow, we describe a method of measuring capacitance values using the CBCM circuit according to the eleventh preferred embodiment. First, measurements using the TEST circuit are carried out.

As shown in FIG. 38, where the selection signal SEL="0", a total of ten coupling capacitances $C_c$ are formed as in the TEST circuit of the tenth preferred embodiment.

Further, five junction capacitances $C_j$ are formed in the diffusion regions 13 which are located below the measuring target nodes NA, and a total of ten coupling capacitances $C_{sti}$ are formed in the STI regions 12 which are located between adjacent ones of the ten diffusion regions 13 below the measuring target nodes NA and NB and in the STI region 12 located between the leftmost diffusion region 13 below the measuring target node NA and the rightmost diffusion region 13 below the dummy node DL. Accordingly, the first test capacitance CT1 can be obtained from the following equation (31):

$$CT1 = 10C_c + 10C_{sti} + 5C_j + \alpha \quad (31)$$

As shown in FIG. 39, where the selection signal SEL="1", as in the TEST circuit of the tenth preferred embodiment, a total of two coupling capacitances $C_c$ are formed and ten junction capacitances $C_j$ are formed in the diffusion regions 13 which are located below the measuring target nodes NA and NB. Accordingly, the second test capacitance CT2 can be obtained from the following equation (32):

$$CT2 = 2C_c + 10C_j + \beta \quad (32)$$

Next, measurements using the REF circuit are carried out.

As shown in FIG. 40, where the selection signal SEL="0", only a total of ten coupling capacitances $C_c$ are formed as in the REF circuit of the tenth preferred embodiment. Accordingly, the first reference capacitance CR1 can be obtained from the following equation (33):

$$CR1 = 10C_c + \alpha \quad (33)$$

As shown in FIG. 41, where the selection signal SEL="1", only a total of two coupling capacitances $C_c$ are formed as in the REF circuit of the tenth preferred embodiment. Accordingly, the second reference capacitance CR2 can be obtained from the following equation (34):

$$CR2 = 2C_c + \beta \quad (34)$$

Then, by solving the equations (31) to (34) as in the tenth preferred embodiment, the coupling capacitance $C_{sti}$ between adjacent diffusion regions 13 can be obtained with accuracy.

TWELFTH PREFERRED EMBODIMENT

Figure 42:
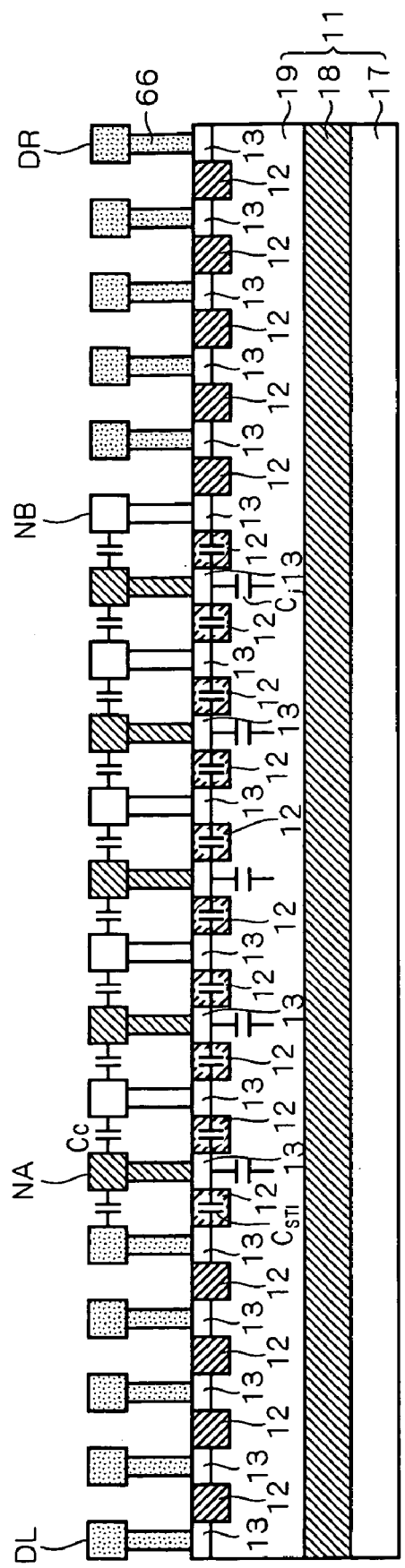
FIG. 42 is a cross-sectional view showing a first state of a target capacitance forming part of a TEST circuit according to a twelfth preferred embodiment of the present invention.
Figure 43:
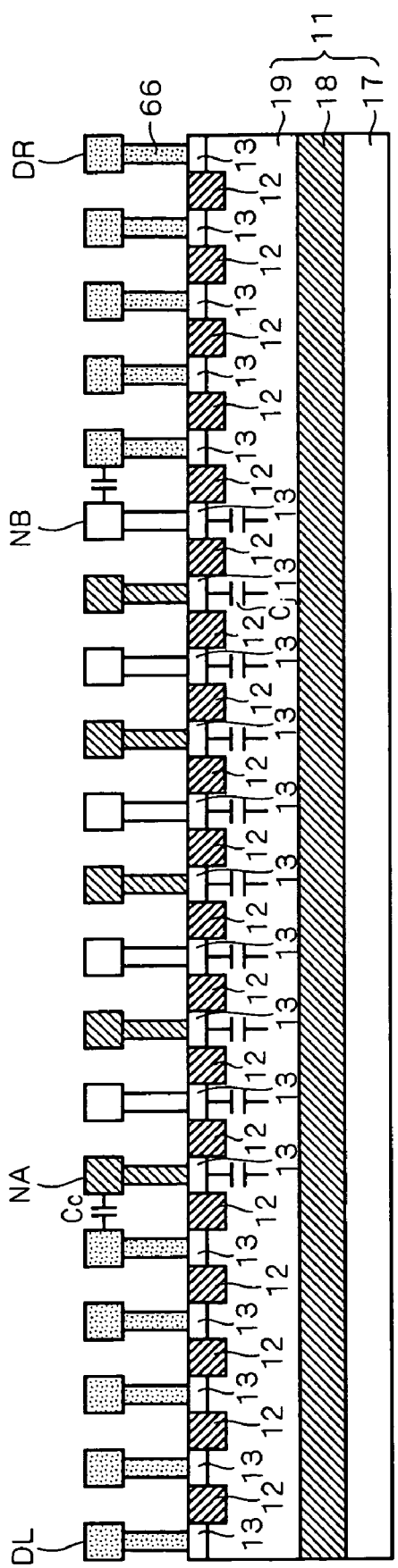
FIG. 43 is a cross-sectional view showing a second state of the target capacitance forming part of the TEST circuit according to the twelfth preferred embodiment.

FIGS. 42 and 43 are cross-sectional views showing a cross-sectional configuration of the TEST circuit in a CBCM circuit according to a twelfth preferred embodiment of the present invention. The plan configuration thereof is identical to that shown in FIG. 32. FIGS. 42 and 43 show a cross-section taken along line C—C of FIG. 32; more specifically, FIG. 42 shows the case where the selection signal SEL="0" and FIG. 43 shows the case where the selection signal SEL="1".

As shown in these drawings, this TEST circuit differs from the TEST circuit of the eleventh preferred embodiment in that the silicon substrate 10 is replaced by an SOI substrate 11. The SOI substrate 11 has a multilayer structure formed of a silicon substrate 17, a buried insulating layer 18 and an SOI layer 19. Thus, as in the TEST circuit of the eleventh preferred embodiment, the diffusion regions 13 and the STI regions 12 are formed in the surface of the SOI layer 19. The other parts of the configuration are identical to those of the TEST circuit of the eleventh preferred embodiment shown in FIGS. 38 and 39.

Figure 44:
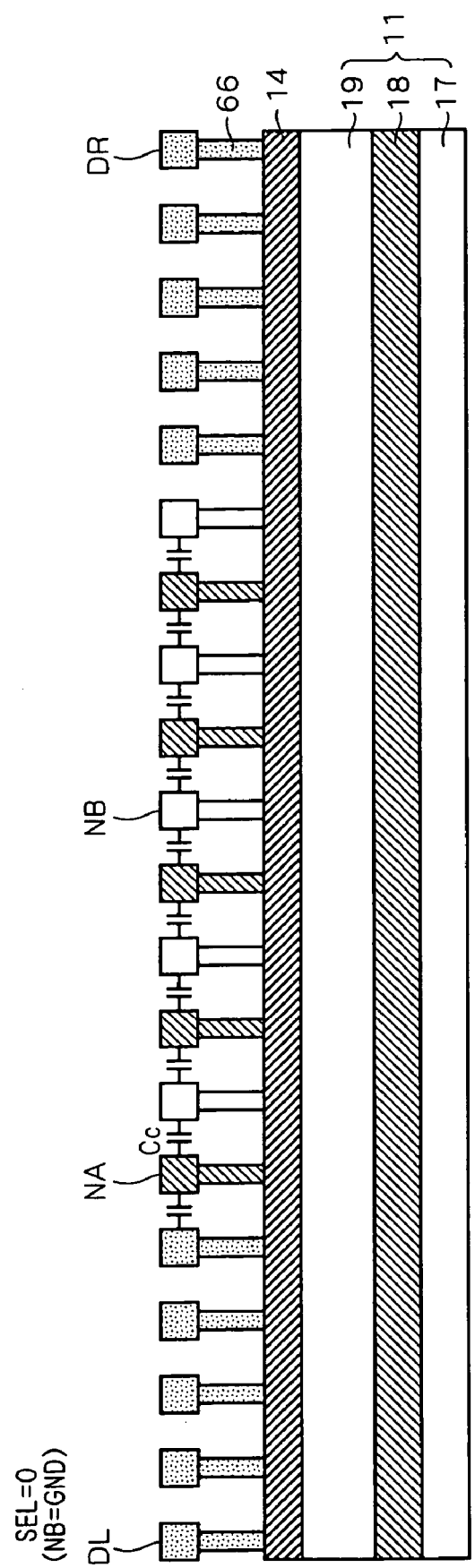
FIG. 44 is a cross-sectional view showing a first state of a target capacitance forming part of a REF circuit according to the twelfth preferred embodiment.
Figure 45:
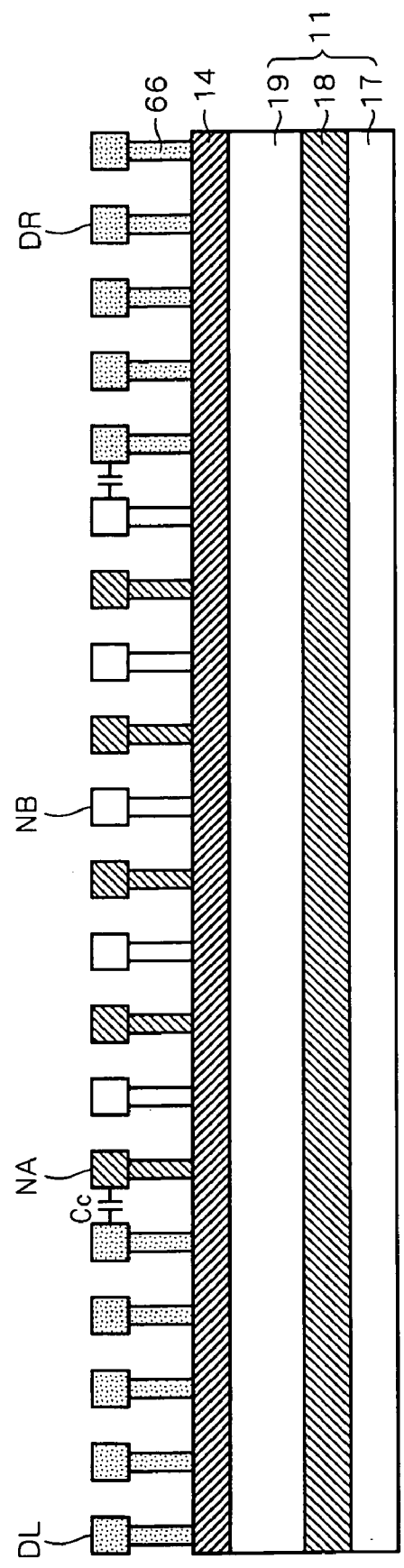
FIG. 45 is a cross-sectional view showing a second state of the target capacitance forming part of the REF circuit according to the twelfth preferred embodiment.

FIGS. 44 and 45 are cross-sectional views showing cross-sectional configurations of the REF circuit in the CBCM circuit according to the twelfth preferred embodiment of the present invention. The plan configuration thereof is identical to that shown in FIG. 35. FIGS. 44 and 45 show a cross-section taken along line D—D of FIG. 35; more specifically, FIG. 44 shows the case where the selection signal SEL="0" and FIG. 45 shows the case where the selection signal SEL="1".

As shown in these drawings, this REF circuit is identical in configuration to that of the eleventh preferred embodiment except that the silicon substrate 10 is replaced by the SOI substrate 11.

Hereinbelow, we describe a method of measuring capacitance values using the CBCM circuit according to the twelfth preferred embodiment. First, measurements using the TEST circuit are carried out.

As shown in FIG. 42, where the selection signal SEL="0", ten coupling capacitances $C_c$, five junction capacitances $C_j$ and ten coupling capacitances $C_{sti}$ are formed as in the TEST circuit of the twelfth preferred embodiment. Accordingly, the first test capacitance CT1 can be obtained from the following equation (35):

$$CT1 = 10C_c + 10C_{sti} + 5C_j + \alpha \quad (35)$$

In the twelfth preferred embodiment, the junction capacitance Cj refers to capacitances at PN junctions formed in the interface between the diffusion regions 13 and the SOI layer 19.

As shown in FIG. 43, where the selection signal SEL="1", two coupling capacitances $C_c$ and ten junction capacitances $C_j$ are formed as in the TEST circuit of the eleventh preferred embodiment. Accordingly, the second test capacitance CT2 can be obtained from the following equation (36):

$$CT2 = 2C_c + 10C_j + \beta \quad (36)$$

Next, measurements using the REF circuit are carried out.

As shown in FIG. 44, where the selection signal SEL="0", only ten coupling capacitances $C_c$ are formed as in the REF circuit of the tenth preferred embodiment. Accordingly, the first reference capacitance CR1 can be obtained from the following equation (37):

$$CR1 = 10C_c + \alpha \quad (37)$$

As shown in FIG. 45, where the selection signal SEL="1", only two coupling capacitances $C_c$ are formed as in the REF circuit of the tenth preferred embodiment. Accordingly, the second reference capacitance CR2 can be obtained from the following equation (38):

$$CR2 = 2C_c + \beta \quad (38)$$

Then, by solving the equations (35) to (38) as in the tenth preferred embodiment, the coupling capacitance $C_{sti}$ between adjacent diffusion regions 13 can be obtained with accuracy.

THIRTEENTH PREFERRED EMBODIMENT

Figure 46:
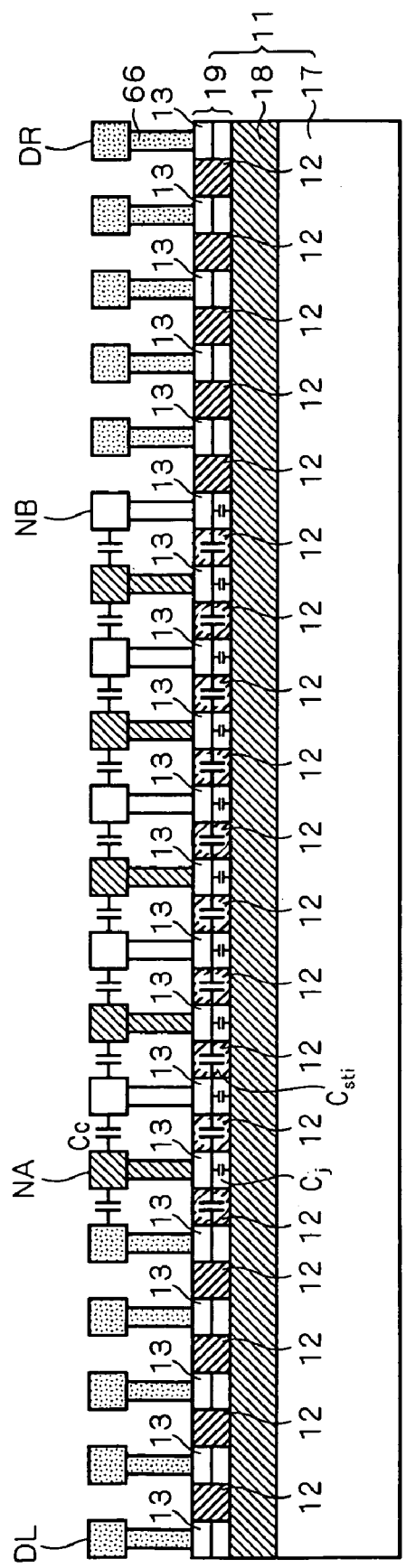
FIG. 46 is a cross-sectional view showing a first state of a target capacitance forming part of a TEST circuit according to a thirteenth preferred embodiment of the present invention.
Figure 47:
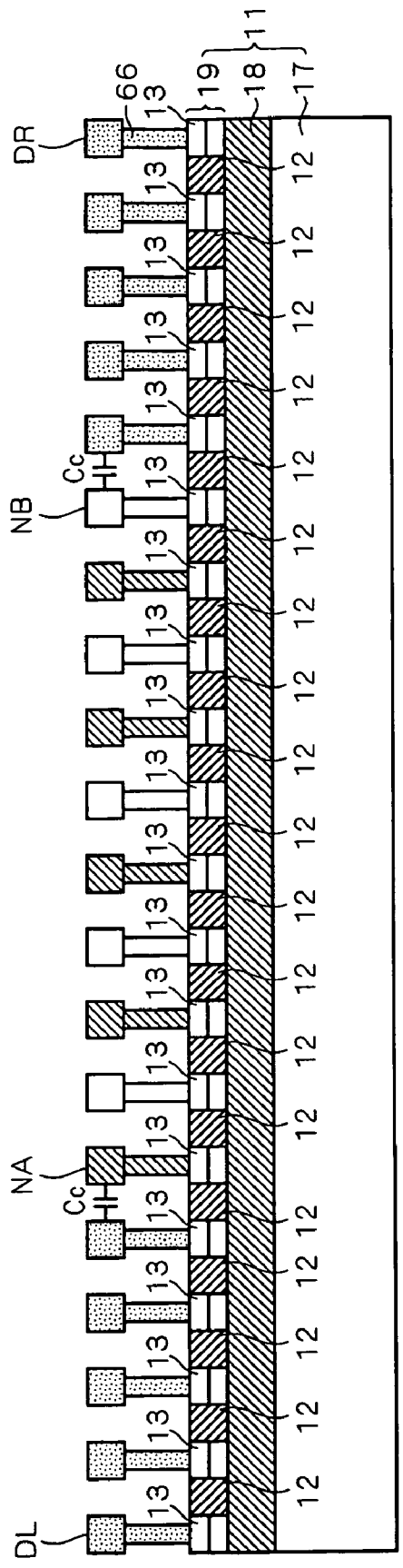
FIG. 47 is a cross-sectional view showing a second state of the target capacitance forming part of the TEST circuit according to the thirteenth preferred embodiment.

FIGS. 46 and 47 are cross-sectional views showing a cross-sectional configuration of the TEST circuit in a CBCM circuit according to a thirteenth preferred embodiment of the present invention. The plan configuration thereof is identical to that shown in FIG. 32. FIGS. 46 and 47 show a cross-section taken along line C—C of FIG. 32; more specifically, FIG. 46 shows the case where the selection signal SEL="0" and FIG. 47 shows the case where the selection signal SEL="1".

As shown in these drawings, this TEST circuit differs from that of the twelfth preferred embodiment in that each of the STI regions 12 is formed to extend to the buried insulating layer 18. That is, each of the diffusion regions 13 is completely isolated by the STI regions 12 and the buried insulating layer 18.

The other parts of the configuration are identical to those of the TEST circuit of the twelfth preferred embodiment shown in FIGS. 42 and 43.

Figure 48:
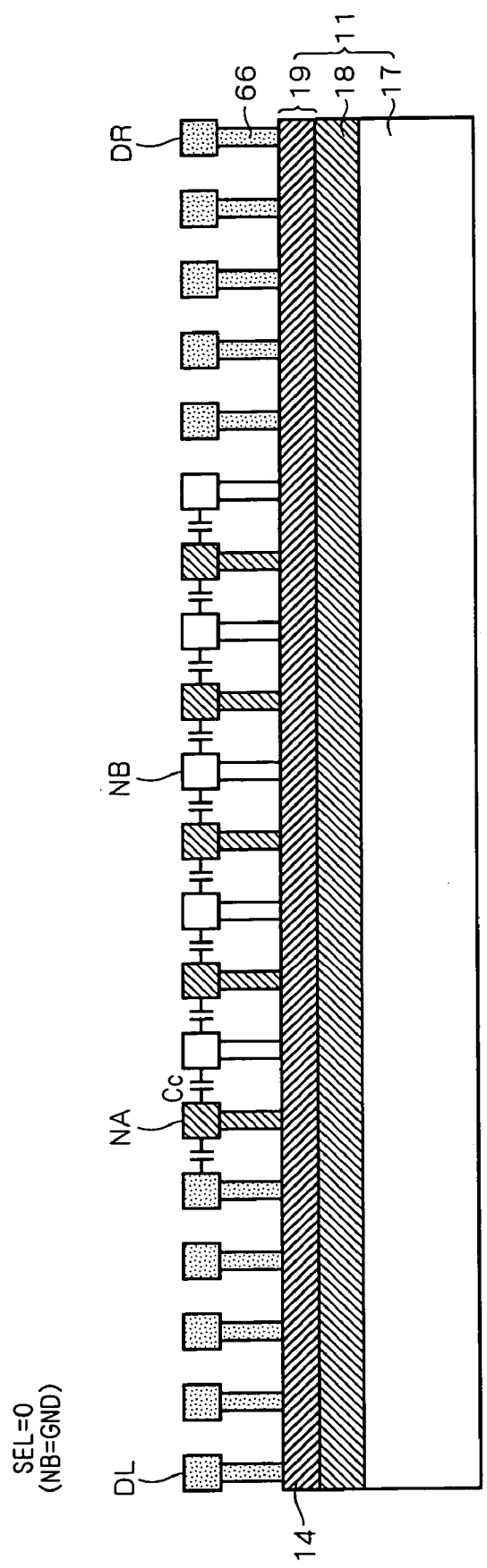
FIG. 48 is a cross-sectional view showing a first state of a target capacitance forming part of a REF circuit according to the thirteenth preferred embodiment.
Figure 49:
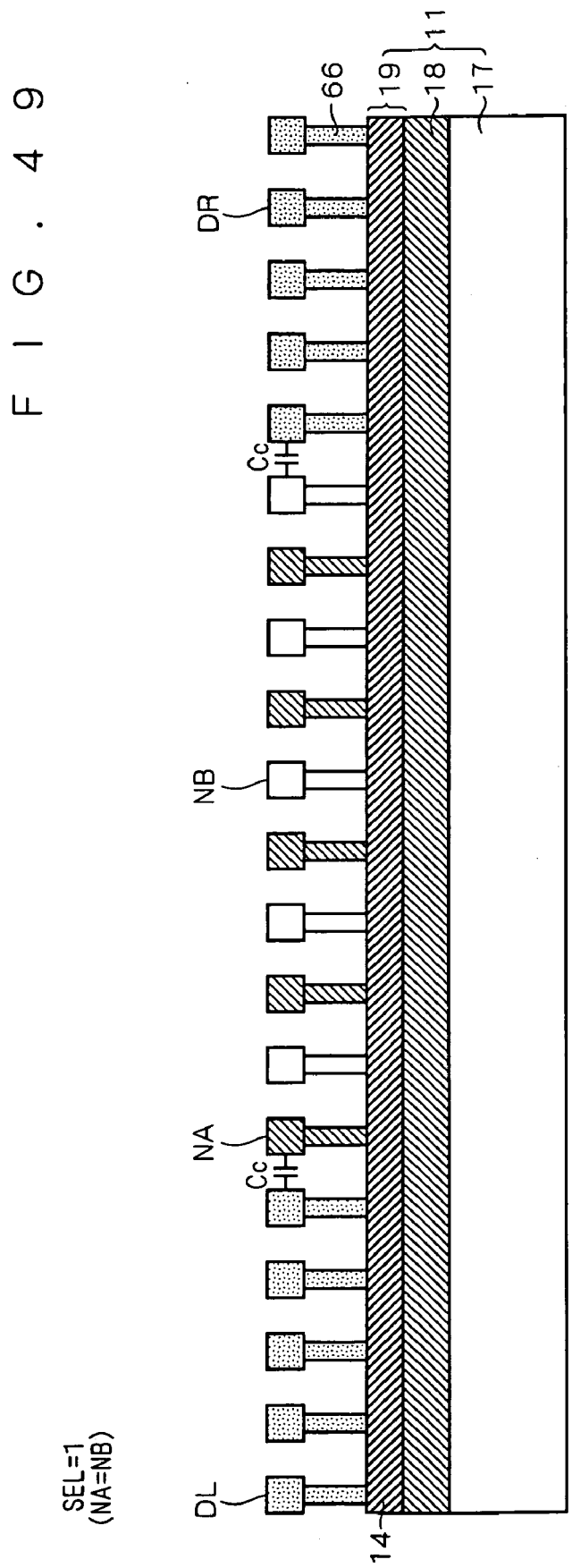
FIG. 49 is a cross-sectional view showing a second state of the target capacitance forming part of the REF circuit according to the thirteenth preferred embodiment.

FIGS. 48 and 49 are cross-sectional views showing a cross-sectional configuration of the REF circuit in the CBCM circuit according to the thirteenth preferred embodiment of the present invention. The plan configuration thereof is identical to that shown in FIG. 35. FIGS. 48 and 49 show a cross-section taken along line D—D of FIG. 35; more specifically, FIG. 48 shows the case where the selection signal SEL="0" and FIG. 49 shows the case where the selection signal SEL="1".

As shown in these drawings, this REF circuit is identical in configuration to that of the twelfth preferred embodiment except that the STI region 14 is formed in the whole SOI layer 19.

Hereinbelow, we describe a method of measuring capacitance values using the CBCM circuit according to the thirteenth preferred embodiment. First, measurements using the TEST circuit are carried out.

As shown in FIG. 46, where the selection signal SEL="0", ten coupling capacitances $C_c$, five junction capacitances $C_j$ and ten coupling capacitances $C_{sti}$ are formed as in the TEST circuit of the eleventh preferred embodiment. Accordingly, the first test capacitance CT1 can be obtained from the following equation (39):

$$CT1=10C_c+10C_{sti}+5C_j+\alpha \quad (39)$$

As shown in FIG. 47, where the selection signal SEL="1", two coupling capacitances $C_c$ and ten junction capacitances $C_j$ are formed as in the TEST circuit of the eleventh preferred embodiment. Accordingly, the second test capacitance CT2 can be obtained from the following equation (40):

$$CT2=2C_c+10C_j+\beta \quad (40)$$

Next, measurements using the REF circuit are carried out.

As shown in FIG. 48, where the selection signal SEL="0", only ten coupling capacitances $C_c$ are formed as in the REF circuit of the tenth preferred embodiment. Accordingly, the first reference capacitance CR1 can be obtained from the following equation (41):

$$CR1=10C_c+\alpha \quad (41)$$

As shown in FIG. 49, where the selection signal SEL="1", only two coupling capacitances $C_c$ are formed as in the REF circuit of the tenth preferred embodiment. Accordingly, the second reference capacitance CR2 can be obtained from the following equation (42):

$$CR2=2C_c+\beta \quad (42)$$

Then, by solving the equations (39) to (42) as in the tenth preferred embodiment, the coupling capacitance $C_{sti}$ between adjacent diffusion regions 13 can be obtained with accuracy.

FOURTEENTH PREFERRED EMBODIMENT

Figure 50:
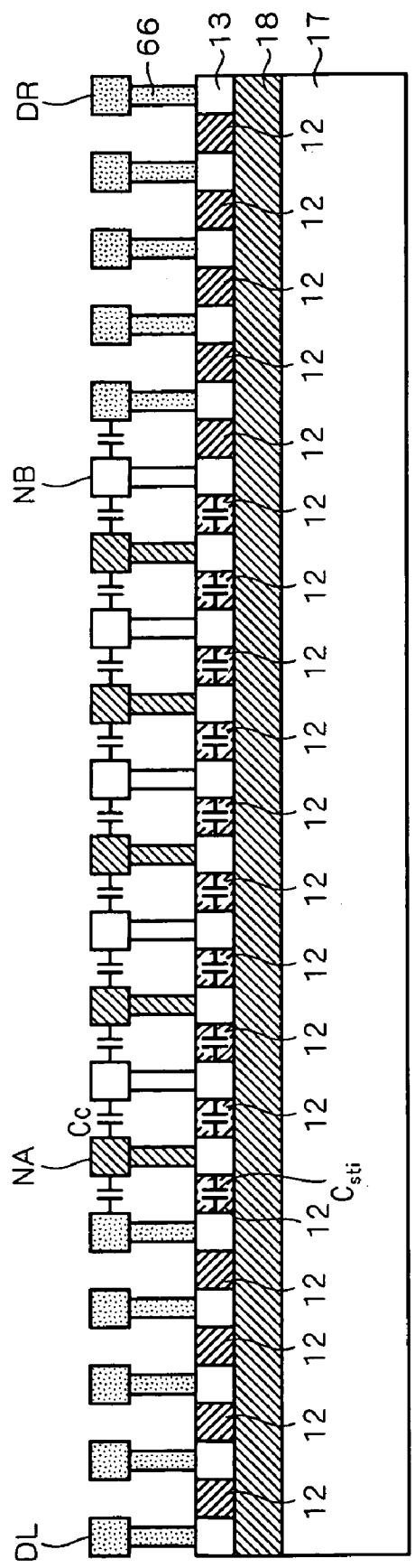
FIG. 50 is a cross-sectional view showing a first state of a target capacitance forming part of a TEST circuit according to a fourteenth preferred embodiment of the present invention.
Figure 51:
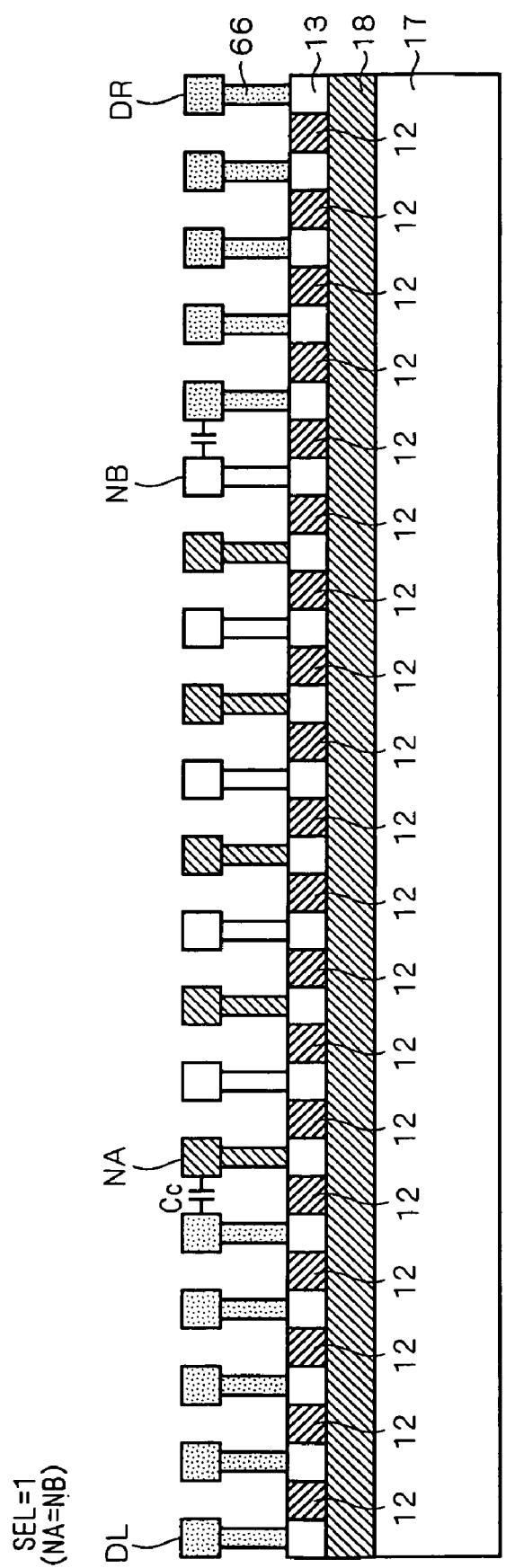
FIG. 51 is a cross-sectional view showing a second state of the target capacitance forming part of the TEST circuit according to the fourteenth preferred embodiment.

FIGS. 50 and 51 are cross-sectional views showing a cross-sectional configuration of the TEST circuit in a CBCM circuit according to a fourteenth preferred embodiment of the present invention. The plan configuration thereof is identical to that shown in FIG. 32. FIGS. 50 and 51 show a cross-section taken along line C—C of FIG. 32; more specifically, FIG. 50 shows the case where the selection signal SEL="0" and FIG. 51 shows the case where the selection signal SEL="1".

As shown in these drawings, this TEST circuit differs from that of the thirteenth preferred embodiment in that each of the diffusion regions 13 is formed to extend to the buried insulating layer 18. Thus, no PN junction is formed in the diffusion regions 13. The other parts of the configuration are identical to that of the TEST circuit of the thirteenth preferred embodiment shown in FIGS. 46 and 47.

Figure 52:
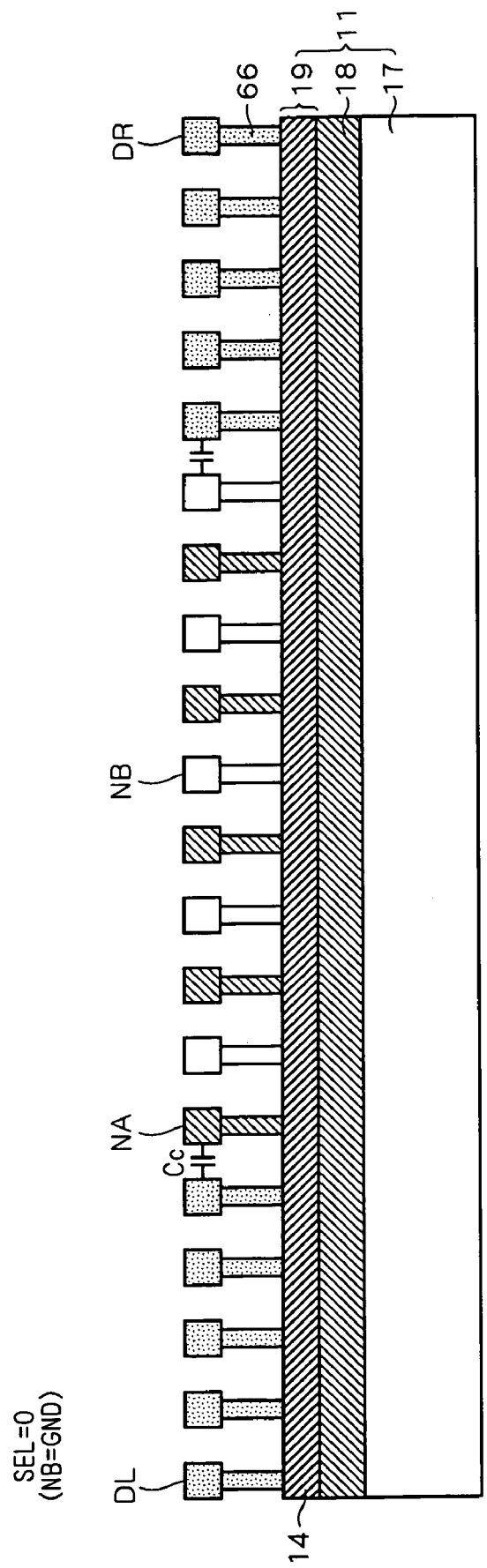
FIG. 52 is a cross-sectional view showing a first state of a target capacitance forming part of a REF circuit according to the fourteenth preferred embodiment.
Figure 53:
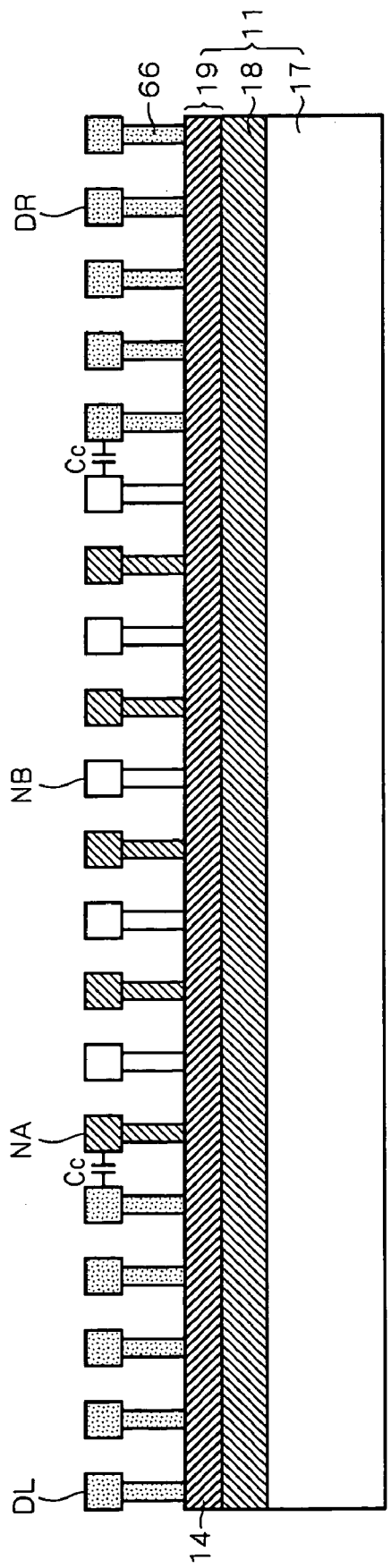
FIG. 53 is a cross-sectional view showing a second state of the target capacitance forming part of the REF circuit according to the fourteenth preferred embodiment.

FIGS. 52 and 53 are cross-sectional views showing a cross-sectional configuration of the REF circuit in the CBCM circuit according to the fourteenth preferred embodiment of the present invention. The plan configuration thereof is identical to that shown in FIG. 35. FIGS. 52 and 53 show a cross-section taken along line D—D of FIG. 35; more specifically, FIG. 52 shows the case where the selection signal SEL="0" and FIG. 53 shows the case where the selection signal SEL="1".

As shown in these drawings, the REF circuit of the fourteenth preferred embodiment is identical in configuration to that of the thirteenth preferred embodiment.

Hereinbelow, we describe a method of measuring capacitance values using the CBCM circuit according to the fourteenth preferred embodiment. First, measurements using the TEST circuit are carried out.

As shown in FIG. 50, where the selection signal SEL="0", ten coupling capacitances $C_c$ and ten coupling capacitances $C_{sti}$ are formed as in the TEST circuit of the eleventh preferred embodiment. However, no junction capacitance $C_j$ is formed because no PN junction is formed at any interface in the diffusion regions 13. Accordingly, the first test capacitance CT1 can be obtained from the following equation (43):

$$CT1=10C_c+10C_{sti}+\alpha \quad (43)$$

As shown in FIG. 51, where the selection signal SEL="1", two coupling capacitances $C_c$ are formed as in the TEST circuit of the eleventh preferred embodiment. However, for the same reason as above described, no junction capacitance $C_j$ is formed. Accordingly, the second test capacitance CT2 can be obtained from the following equation (44):

$$CT2=2C_c+\beta \quad (44)$$

Next, measurements using the REF circuit are carried out.

As shown in FIG. 52, where the selection signal SEL="0", only ten coupling capacitances $C_c$ are formed as in the REF circuit of the tenth preferred embodiment. Accordingly, the first reference capacitance CR1 can be obtained from the following equation (45):

$$CR1=10C_c+\alpha \quad (45)$$

As shown in FIG. 53, where the selection signal SEL="1", only two coupling capacitances $C_c$ are formed as in the REF circuit of the tenth preferred embodiment. Accordingly, the second reference capacitance CR2 can be obtained from the following equation (46):

$$CR2=2C_c+\beta \quad (46)$$

Then, by solving the equations (43) to (46) as in the tenth preferred embodiment, the coupling capacitance $C_{sti}$ between adjacent diffusion regions 13 can be obtained with accuracy.

Since the equations (44) and (46) are exactly the same, there is no harm in placing the measuring target node NB at a ground level in the REF circuit of the fourth preferred embodiment. In this case, the transfer gates 46, 47 and the inverter 48 shown in FIG. 35 are unnecessary, which simplifies the circuit configuration.

FIFTEENTH PREFERRED EMBODIMENT

Figure 54:
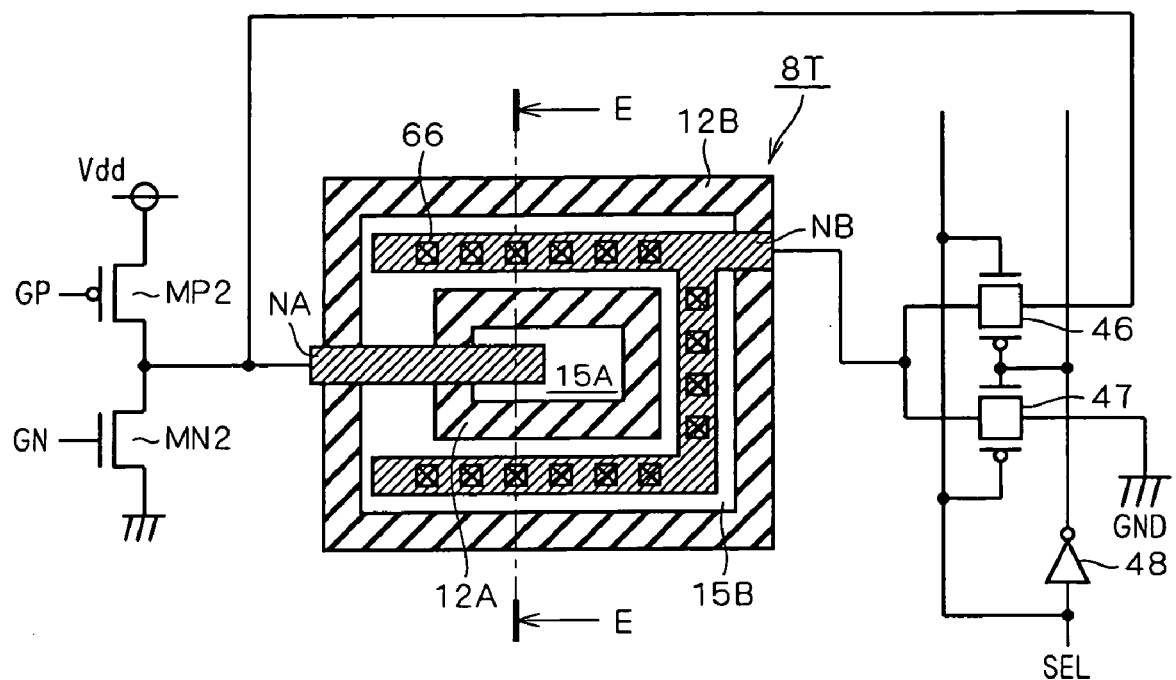
FIG. 54 is an explanatory diagram schematically showing a circuit configuration of a TEST circuit in a CBCM circuit according to a fifteenth preferred embodiment of the present invention.
Figure 55:
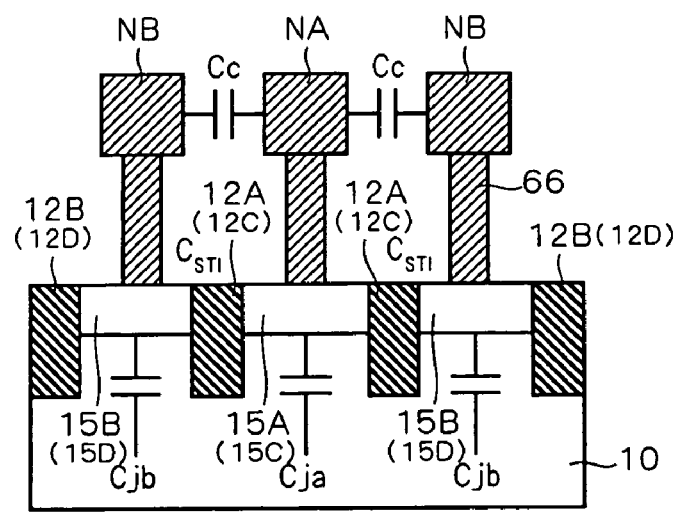
FIG. 55 is a cross-sectional view taken along line E—E of FIG. 54.

FIG. 54 is an explanatory diagram schematically showing a circuit configuration of the TEST circuit in a CBCM circuit according to a fifteenth preferred embodiment of the present invention. FIG. 55 is a cross-sectional view taken along line E—E of FIG. 54.

As shown in the drawings, this CBCM circuit differs from that according to the eighth preferred embodiment in that the target capacitance forming part 3 is replaced by a target capacitance forming part 8T.

The target capacitance forming part 8T (illustrated in plan configuration in FIG. 54) is formed in the silicon substrate 10, wherein a rectangular diffusion region 15A is formed in the center, an STI region 12A is formed to surround the diffusion region 15A, a diffusion region 15B is formed to surround the STI region 12A, and an STI region 12B is formed to surround the diffusion region 15B.

The measuring target node NA serving as an interconnect layer has a rectangular shape laterally extending to the diffusion region 15A and is electrically connected through a contact hole 66 to the diffusion region 15A. The measuring target node NB serving as an interconnect layer is formed to extend above three sides of the diffusion region 15B and is electrically connected through a plurality of contact holes 66 to the diffusion region 15B.

Let LA be the perimeter of the diffusion region 15A, and SA and SB be the areas of the diffusion regions 15A and 15B, respectively.

As shown in FIG. 55, two coupling capacitances $C_c$ are formed between the measuring target nodes NA and NB, a junction capacitance $C_{ja}$ is formed in the diffusion region 15A, and junction capacitances $C_{jb}$ are formed in the diffusion region 15B. Further, coupling capacitances $C_{sti}$ are formed between the diffusion regions 15A and 15B which sandwich the STI region 12A.

Figure 56:
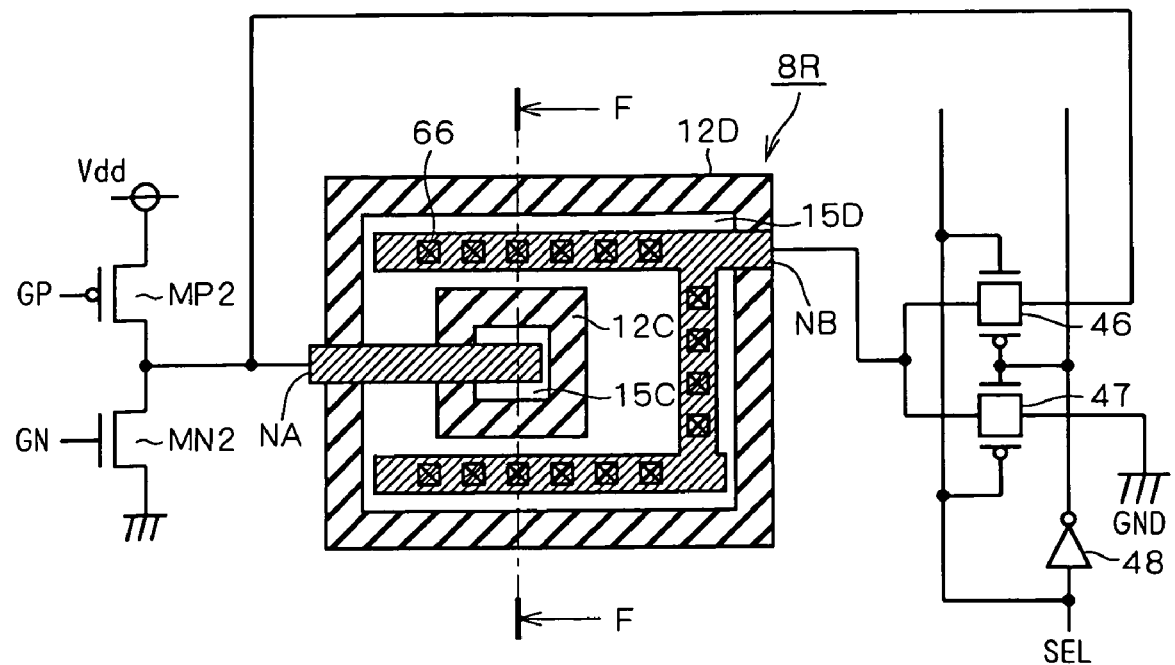
FIG. 56 is an explanatory diagram schematically showing a circuit configuration of a REF circuit in the CBCM circuit according to the fifteenth preferred embodiment.

FIG. 56 is an explanatory diagram schematically showing a circuit configuration of the REF circuit in the CBCM circuit according to the fifteenth preferred embodiment of the present invention. FIG. 55 corresponds also to a cross-sectional configuration taken along line F—F of FIG. 56.

Like the target capacitance forming part 8T, a target capacitance forming part 8R (illustrated in plan configuration in FIG. 56) is formed in the silicon substrate 10, wherein a rectangular diffusion region 15C is formed in the center, an STI region 12C is formed to surround the diffusion region 15C, a diffusion region 15D is formed to surround the STI region 12C, and an STI region 12D is formed to surround the diffusion region 15D.

The measuring target node NA has a rectangular shape laterally extending to the diffusion region 15C and is electrically connected through a contact hole 66 to the diffusion region 15C. The measuring target node NB is formed to extend above three sides of the diffusion region 15D and is electrically connected through a plurality of contact holes 66 to the diffusion region 15D.

Let LC be the perimeter of the diffusion region 15C, and SC and SD be the areas of the diffusion regions 15C and 15D, respectively.

The target capacitance forming part 8R differs from the target capacitance forming part 8T in that the area SC of the diffusion region 15C is smaller than the area SA of the diffusion region 15A and the area SD of the diffusion region 15D is larger than the area SB of the diffusion region 15B.

Hereinbelow, we describe a method of measuring capacitance values using the CBCM circuit according to the fifteenth preferred embodiment. First, measurements using the TEST circuit are carried out. Here, the junction capacitances $C_{ja}$ and $C_{jb}$ each refer to a capacitance per unit area and the coupling capacitance $C_{sti}$ refers to a capacitance per unit length.

Where the selection signal SEL="0", the coupling capacitances $C_c$ are formed between the measuring target nodes NA and NB, the junction capacitance $C_{ja}$ is formed in the diffusion region 15A, and the coupling capacitances $C_{sti}$ are formed between the diffusion regions 15A and 15B. The minor capacitance α such as interconnect lines forming a circuit is also formed. Accordingly, the first test capacitance CT1 can be obtained from the following equation (47):

$$CT1 = C_c + C_{sti} \times LA + C_{ja} \times SA + \alpha \qquad (47)$$

Where the selection signal SEL="1", because the measuring target nodes NA and NB are short-circuited, no coupling capacitance $C_c$ is formed and only the junction capacitances $C_{ja}$ and $C_{jb}$ are formed in the diffusion regions 15A and 15B, respectively. The minor capacitance β such as interconnect lines forming a circuit is also formed. Accordingly, the second test capacitance CT2 can be obtained from the following equation (48):

$$CT2 = C_{ja} \times SA + C_{jb} \times SB + \beta \qquad (48)$$

Next, measurements using the REF circuit are carried out.

Where the selection signal SEL="0", the coupling capacitances $C_c$ and $C_{sti}$ and the junction capacitance $C_{ja}$ are formed as in the case of the TEST circuit. The minor capacitance α such as interconnect lines forming a circuit is also formed. Accordingly, the first reference capacitance CR1 can be obtained from the following equation (49):

$$CT1 = C_c + C_{sti} \times LC + C_{ja} \times SC + \alpha \qquad (49)$$

Where the selection signal SEL="1", the junction capacitances $C_{ja}$ and $C_{jb}$ are formed as in the case of the TEST circuit. The minor capacitance β such as interconnect lines forming a circuit is also formed. Accordingly, the second reference capacitance CR2 can be obtained from the following equation (50):

$$CT2 = C_{ja} \times SC + C_{jb} \times SD + \beta \qquad (50)$$

Then, by solving the equations (47) to (50) as in the tenth preferred embodiment, the coupling capacitance $C_{sti}$ between the diffusion regions 15A and 15B can be obtained with accuracy.

In this way, the coupling capacitance $C_{sti}$ and the junction capacitances $C_{ja}$ and $C_{jb}$ can be obtained by changing the areas of the diffusion regions formed below the measuring target nodes NA and NB.

Further, it is also possible to measure the coupling capacitance $C_{sti}$ and the junction capacitances $C_{ja}$ and $C_{jb}$ which vary with appropriate changes in the widths of the STI regions 12A to 12D.

SIXTEENTH PREFERRED EMBODIMENT

Figure 57:
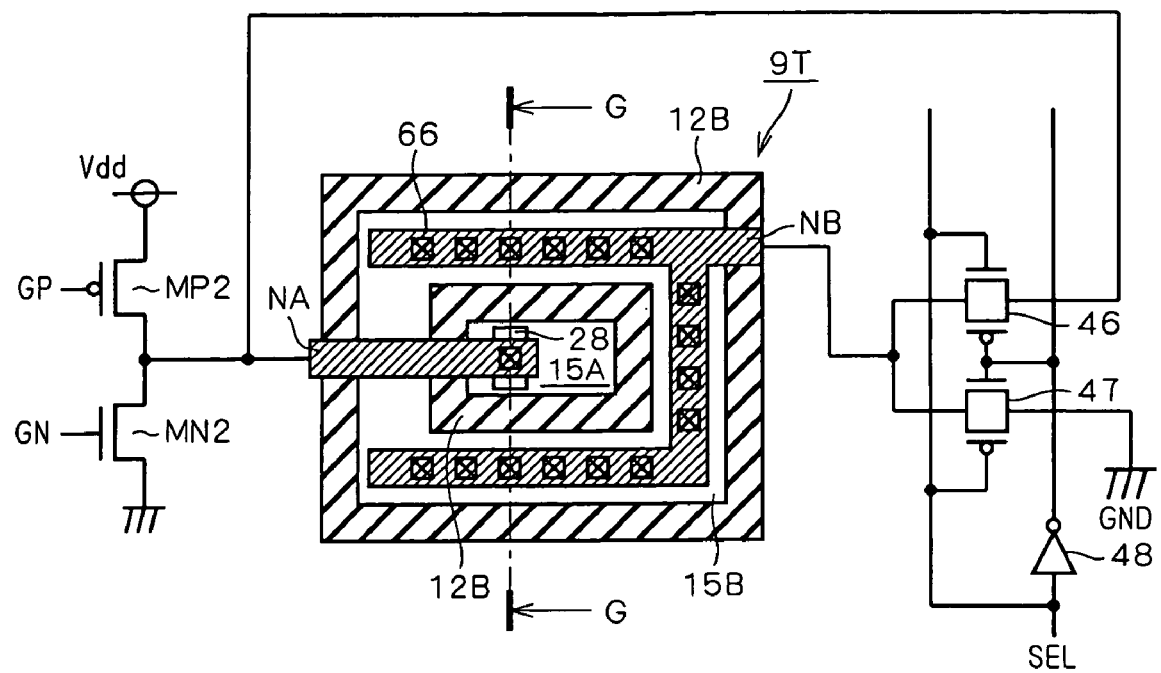
FIG. 57 is an explanatory diagram schematically showing a circuit configuration of a TEST circuit in a CBCM circuit according to a sixteenth preferred embodiment of the present invention.
Figure 58:
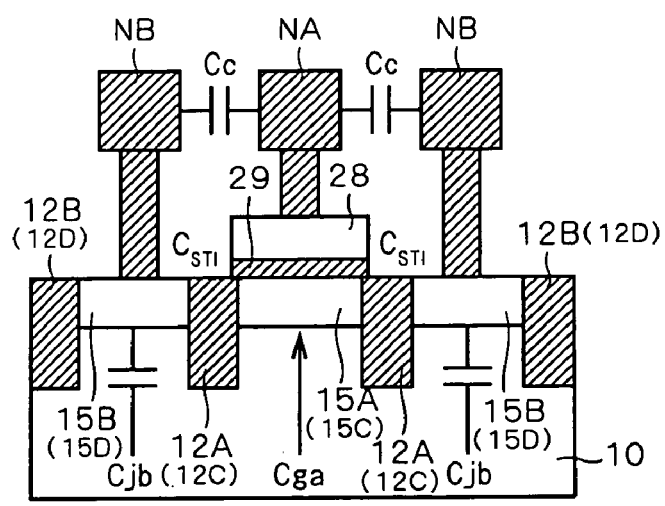
FIG. 58 is a cross-sectional view taken along line G—G of FIG. 57.

FIG. 57 is an explanatory diagram schematically showing a circuit configuration of the TEST circuit in a CBCM circuit according to a sixteenth preferred embodiment of the present invention. FIG. 58 is a cross-sectional view taken along line G—G of FIG. 57.

As shown in the drawings, this TEST circuit differs from that of the fifteenth preferred embodiment shown in FIGS. 54 and 55 in that the target capacitance forming part 8T is replaced by a target capacitance forming part 9T.

In the target capacitance forming part 9T (illustrated in plan configuration in FIG. 57), a gate electrode 28 is selectively formed on the diffusion region 15A with a gate insulating film 29 sandwiched in between. At this time, the surface of the diffusion region 15A immediately below the gate electrode 28 forms a channel region.

The measuring target node NA is electrically connected through a contact hole 66 to the gate electrode 28. Thus, in the diffusion region 15A immediately below the gate electrode 28 is formed not the junction capacitance $C_{ja}$ but a gate capacitance $C_{ga}$. The other parts of the configuration are identical to those of the target capacitance forming part 8T according to the fifteenth preferred embodiment and thus not described herein.

Figure 59:
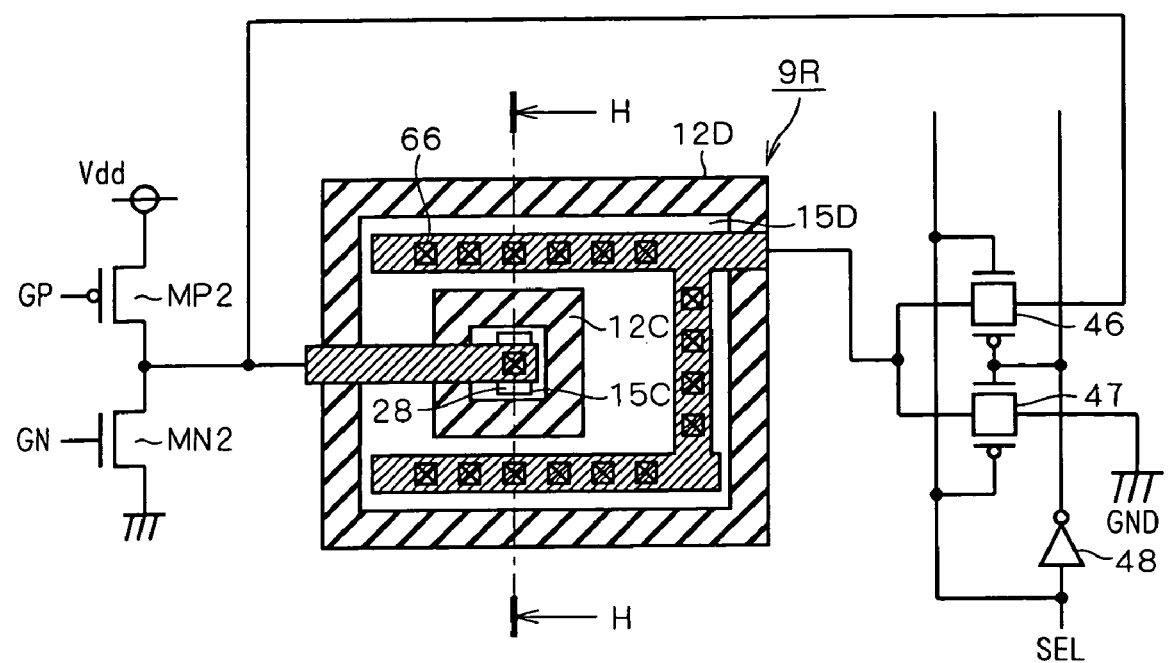
FIG. 59 is an explanatory diagram schematically showing a circuit configuration of a REF circuit in the CBCM circuit according to the sixteenth preferred embodiment.

FIG. 59 is an explanatory diagram schematically showing a circuit configuration of the REF circuit in the CBCM circuit according to the sixteenth preferred embodiment of the present invention. FIG. 58 corresponds also to a cross-sectional configuration taken along line H—H of FIG. 59.

In a target capacitance forming part 9R (illustrated in plan configuration in FIG. 59), the gate electrode 28 is selectively formed on a diffusion region 15C with the gate insulating film 29 sandwiched in between. The measuring target node NA is electrically connected through a contact hole 66 to the gate electrode 28. Thus, in the diffusion region 15C immediately below the gate electrode 28 is formed not the junction capacitance $C_{ja}$ but the gate capacitance $C_{ga}$. The other parts of the configuration are identical to those of the target capacitance forming part 8R according to the fifteenth preferred embodiment and thus not described herein.

Hereinbelow, we describe a method of measuring capacitance values using the CBCM circuit according to the sixteenth preferred embodiment. First, measurements using the TEST circuit are carried out. Here, the gate capacitance $C_{ga}$ refers to a capacitance per unit area. The other capacitances are identical to those in the fifteenth preferred embodiment.

Where the selection signal SEL="0", the coupling capacitances $C_c$ are formed between the measuring target nodes NA and NB, the gate capacitance $C_{ga}$ is formed in the diffusion region 15A, and the coupling capacitances $C_{sti}$ are formed between the diffusion regions 15A and 15B. The minor capacitance α such as interconnect lines forming a circuit is also formed. Accordingly, the first test capacitance CT1 can be obtained from the following equation (51):

$$CT1 = C_c + C_{sti} \times LA + C_{ga} \times SA + \alpha \tag{51}$$

Where the selection signal SEL="1", because the measuring target nodes NA and NB are short-circuited, no coupling capacitance $C_c$ is formed and only the gate capacitance $C_{ga}$ and the junction capacitances $C_{jb}$ are formed in the diffusion regions 15A and 15B, respectively. The minor capacitance β such as interconnect lines forming a circuit is also formed. Accordingly, the second test capacitance CT2 can be obtained from the following equation (52):

$$CT2 = C_{ga} \times SA + C_{jb} \times SB + \beta \tag{52}$$

Next, measurements using the REF circuit are carried out.

Where the selection signal SEL="0", the coupling capacitances $C_c$ and $C_{sti}$ and the gate capacitance $C_{ga}$ are formed as in the case of the TEST circuit. The minor capacitance α is also formed. Accordingly, the first reference capacitance CR1 can be obtained from the following equation (53):

$$CT1 = C_c + C_{sti} \times LA + C_{ga} SC + \alpha \tag{53}$$

Where the selection signal SEL="1", the gate capacitance $C_{ga}$ and the junction capacitances $C_{jb}$ are formed as in the case of the TEST circuit. The minor capacitance β is also formed. Accordingly, the second reference capacitance CR2 can be obtained from the following equation (54):

$$CT2 = C_{ga} \times SC + C_{jb} \times SD + \beta \tag{54}$$

Then, by solving the equations (51) to (54) as in the tenth preferred embodiment, the coupling capacitance $C_{sti}$ between the diffusion regions 15A and 15B can be obtained with accuracy.

In this way, the coupling capacitance $C_{sti}$ can be obtained by changing the areas of the diffusion regions formed below the measuring target nodes NA and NB.

In the fifteenth and sixteenth preferred embodiments, the perimeters LA and LC of the diffusion regions 15A and 15C and the areas SA to SD of the diffusion regions 15A to 15D may be set to any value with the designer's intension.

SEVENTEENTH PREFERRED EMBODIMENT (Prerequisite Technique)

It is known that the finished shape of copper interconnect lines depends on a pitch between interconnect lines and on the interconnect area proportion of the surroundings. This is because OPC (Optical Proximity Correction) and CMP (Chemical Mechanical Polishing) depend on the interconnect area proportion. Differences in pitch between interconnect lines and in interconnect area proportion change the average of finished values of interconnect lines, and variations in finished values at the same time.

Thus, the average of finished interconnect widths has a dependence on an interconnect spacing if the interconnect widths are equal on a mask for formation of interconnect lines. Further, if the interconnect spacings are equal on the mask, the average of finished interconnect spacings (or spacings between adjacent interconnect lines) has a dependence on the interconnect width. An interconnect resistance is proportional to the interconnect width. An interconnect capacitance between identical layers (e.g., capacitance between a first metal interconnect line and its adjacent first metal interconnect line) which is dominant over an interconnect parasitic capacitance is inversely proportional to the interconnect spacing. Therefore, the interconnect resistance and interconnect capacitance obtained by TEG (Test Element Group) measurement depend on the interconnect pitch and the interconnect area proportion.

For extraction of circuit information (parameters) for circuit simulation containing active elements such as transistors and passive elements such as interconnect resistance and interconnect capacitance from a layout by the use of an LPE (Layout Parameter Extraction) tool, it is necessary to previously provide, to the LPE (tool), information for calculation of the interconnect resistance and interconnect capacitance in accordance with the interconnect pitch (the interconnect spacing inclusive of the interconnect lines themselves) drawn in the layout and the interconnect area proportion. Interconnect structures including the finished interconnect spacings for various interconnect pitches and for various interconnect area proportions are required as the information to be provided to the LPE.

A conventional technique for extraction of these interconnect structures includes: creating interconnect structures by dividing various interconnect pitches and various interconnect area proportions therebetween; taking SEM (Scanning Electron Microscope) photographs of cross sections of the interconnect structures; and then extracting dimensions of the interconnect structures. However, because the interconnect width varies with location when the interconnect lines are observed from above a wafer, there arises a problem such that the average interconnect width is not accurately extracted from a limited number of SEM photographs of the cross sections. For example, a first metal layer exhibits a phenomenon known as line edge roughness in which interconnect lines have periodically wavy ends, and has different interconnect widths depending on the location thereof. Accurate extraction of the average of the interconnect widths requires a multiplicity of SEM photographs of the cross sections, which are, however, very difficult to take. The conventional technique presents another problem to be described below. Although the interconnect widths can be obtained with SEM when observed from above the wafer, it is very difficult for SEM to extract the interconnect widths for providing the interconnect capacitance having an accuracy required by LPE because the ends of the interconnect lines change depending on SEM measurement conditions.

Thus, there has conventionally been no accurate technique for extracting the interconnect structures dependent on the various interconnect pitches and the various interconnect area proportions to reproduce both the interconnect resistance and the interconnect capacitance. An interconnection characteristics analysis method to be described below according to a seventeenth preferred embodiment of the present invention is made to solve the above-mentioned problems. The method of the seventeenth preferred embodiment provides a technique for accurate extraction of interconnect structures in consideration for the dependence of the interconnect capacitance and interconnect resistance on the interconnect pitch and the interconnect area proportion.

(Interconnection Characteristics Analysis Method)

The interconnection characteristics analysis method according to the sixth preferred embodiment shown in FIG. 23 is the method of obtaining the accurate estimates of the film thickness and permittivity of the insulating layer for isolation of the multilayer interconnect lines. The interconnection characteristics analysis method according to the seventeenth preferred embodiment can estimate a more accurate interconnect shape by measuring the interconnect resistance in addition to the interconnect capacitance.

Figure 60:
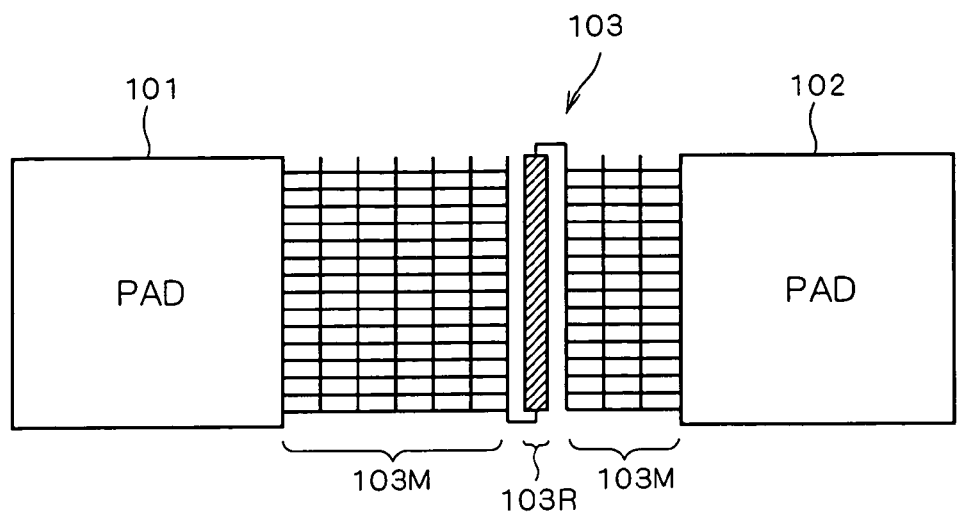
FIG. 60 illustrates a target resistance forming part to be measured in a CBCM method according to a seventeenth preferred embodiment of the present invention.

FIG. 60 illustrates a target resistance forming part to be measured in a CBCM method according to the seventeenth preferred embodiment. As shown in FIG. 60, an interconnect resistance pattern 103 is provided between pads 101 and 102. The interconnect resistance pattern 103 has a resistance portion 103R in a middle part thereof, and mesh interconnect portions 103M in other regions.

The interconnect resistance pattern 103 corresponds to the interconnect line (predetermined interconnect line) indicated by the node N1 shown in FIG. 21. The existing Kelvin method (four-terminal method) is used to measure the interconnect resistance of the interconnect resistance pattern 103.

Figure 61:
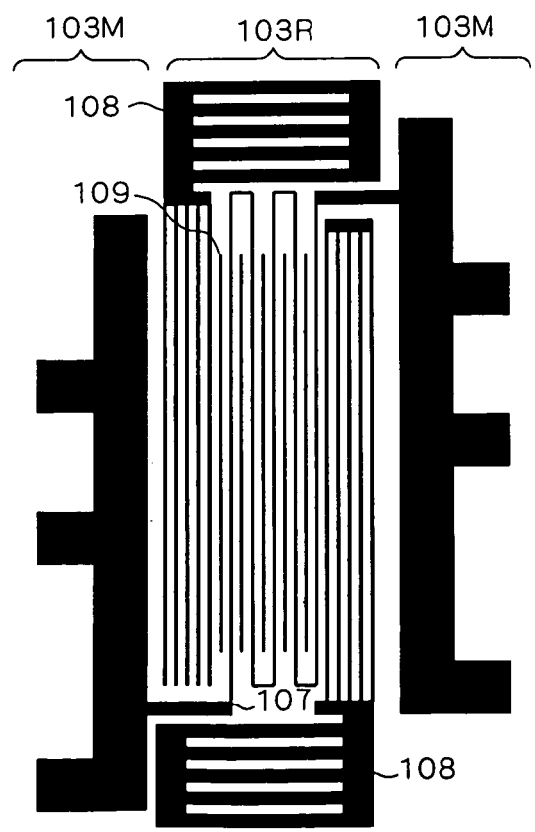
FIG. 61 illustrates the details of a resistance portion shown in FIG. 60.

FIG. 61 illustrates the details of the resistance portion 103R. As shown in FIG. 61, the resistance portion 103R includes a target interconnect pattern 107 for measurement and dummy patterns 108 and 109.

The target interconnect pattern 107 has an interconnect width sufficiently smaller than that of the mesh interconnect portions 103M, and has a serpentine and meandering shape to attain a desired interconnect length. The target interconnect pattern 107 is electrically connected to the left-hand and right-hand mesh interconnect portions 103M adjacent thereto. Since the interconnect width of the mesh interconnect portions 103M is sufficiently greater than that of the target interconnect pattern 107, the resistance of the mesh interconnect portions 103M is sufficiently negligible as compared with that of the target interconnect pattern 107, and is not involved in resistance measurement. This improves the measurement accuracy of the target interconnect pattern 107.

The dummy patterns 108 and 109 are formed so as to be electrically floating and isolated from the target interconnect pattern 107 and the interconnect resistance pattern 103. The dummy patterns 108 are disposed around the target interconnect pattern 107, and the dummy pattern 109 is formed in a spacing between portions of the target interconnect pattern 107.

The interconnect length W1, the interconnect width WL, the interconnect spacing WS and the interconnect film thickness WH of the target interconnect pattern 107 which are target resistance conditions are made equal to those of the interconnect line of the node N1 used in the target capacitance forming part 2. Thus, a structure equivalent to the node N1 of the target capacitance forming part 2 is attained as the target interconnect pattern 107 for resistance measurement. This allows resistance measurement appropriate to the interconnect line of the node N1 of the target capacitance forming part 2.

Figure 62:
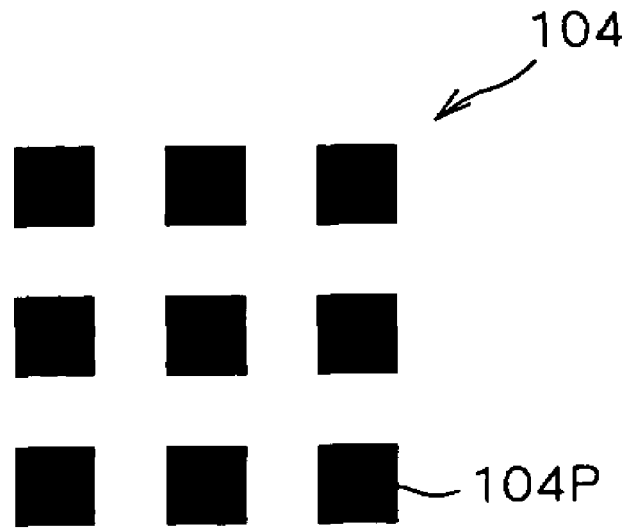
FIG. 62 illustrates a CMP dummy pattern in the target capacitance forming part.

FIG. 62 illustrates a spotty dummy pattern associated with a CMP process in the target capacitance forming part 2. The CMP dummy pattern 104 refers to a dummy pattern formed around an interconnect pattern in the target capacitance forming part 2.

Figure 63:
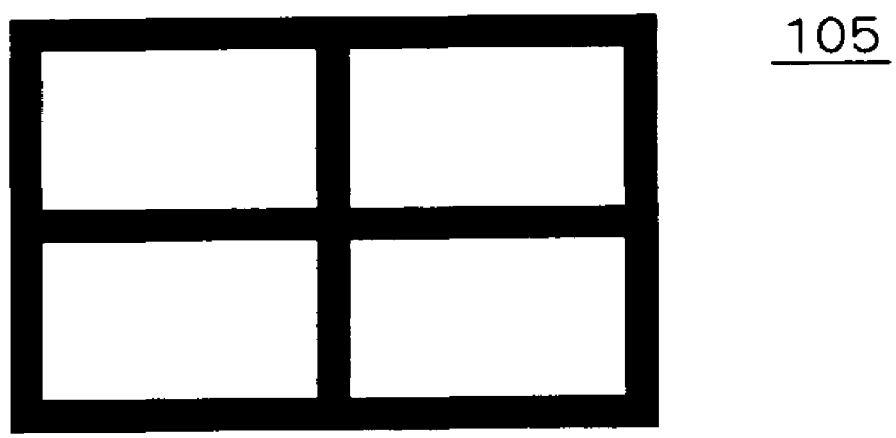
FIG. 63 illustrates a mesh interconnect pattern.

FIG. 63 illustrates a mesh interconnect pattern 105 in the mesh interconnect portions 103M. The interconnect area percentage of the mesh interconnect pattern 105 is set to about the same as the area percentage of the CMP dummy pattern in the target capacitance forming part 2. For example, when the CMP dummy pattern 104 shown in FIG. 62 includes spots 104p having a 2 by 2 (μm) square shape and spaced at a pitch of 3.5 μm and has an interconnect area percentage of 32%, the mesh interconnect pattern 105, for example, with an area of 6 μm (horizontal) by 4 μm (vertical) and a width of 1 μm has an interconnect area percentage of 31%. This achieves an approximately equal area percentage to allow more accurate measurement of the interconnect resistance.

Although not shown, first to fifth auxiliary resistance patterns are formed which correspond to the nodes N21 to N25 of the target capacitance forming part 2 of the sixth preferred embodiment shown in FIG. 20. The positional relationship between the first to fifth auxiliary resistance patterns and the interconnect resistance pattern 103 is identical with the positional relationship between the nodes N21 to N25 and the node N1. The first to fifth auxiliary resistance patterns are formed in equivalent shape to the interconnect lines of the nodes N21 to N25, respectively.

Such formation of the target resistance forming part including the interconnect resistance pattern 103 and the first to fifth auxiliary resistance patterns under the same conditions regarding interconnect lines as the target capacitance forming part 2 makes the two forming parts precisely equal in interconnect film thickness and in insulating film thickness. Further, the reduction in resistance parasitic on other than the resistance portion 103R of the target resistance forming part improves the accuracy of resistance measurement. When the first to fifth auxiliary resistance patterns are not provided, the accuracy of resistance measurement is more or less decreased, but the target resistance forming part can perform its original function if the target resistance forming part includes at least the interconnect resistance pattern 103 structured to have the same target resistance conditions as the interconnect line of the node N1.

Figure 64:
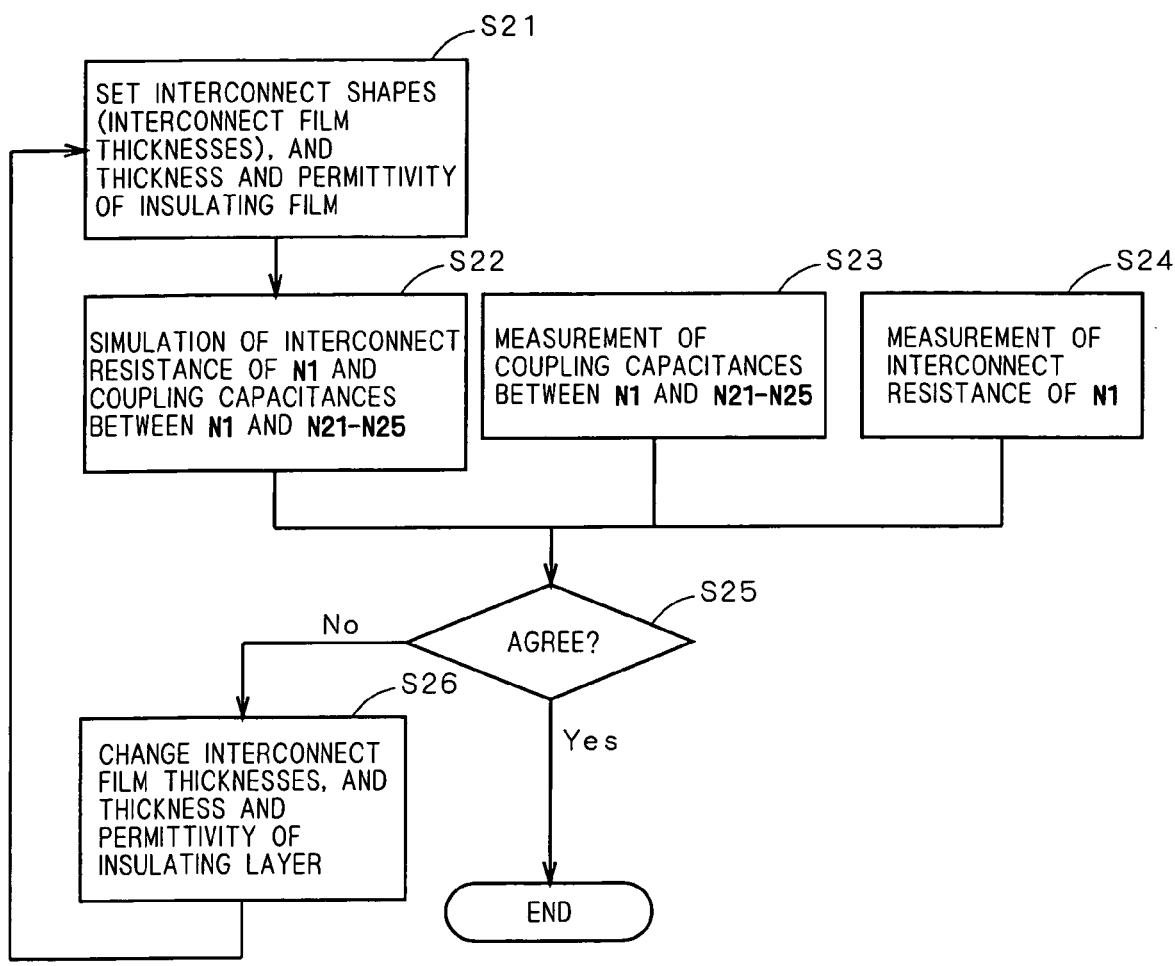
FIG. 64 is a flowchart showing an interconnection characteristics analysis method according to the seventeenth preferred embodiment.

FIG. 64 is a flowchart showing the interconnection characteristics analysis method according to the seventeenth preferred embodiment. The capacitance of the target capacitance forming part 2 shown in FIG. 21 is measured using the CBCM circuit of the sixth preferred embodiment shown in FIG. 20.

Referring to FIG. 64, step S21 is to set interconnection characteristics including the interconnect shapes of the nodes N1 and N21 to N25 (including a line-to-line distance between different interconnect lines), the film thickness of the insulating layer 67 formed between upper and lower interconnect layers, e.g., between the nodes N1 and N21, the (relative) permittivity of the insulating layer 67, and interconnect film thicknesses. Although the insulating layer 67 is shown as a single layer in FIG. 21, it usually has a multilayer structure having different insulating layers formed between interconnect layers, and the effective permittivity of the insulating layer 67 varies depending on the height thereof.

In step S22, a predetermined simulation is performed based on the interconnection characteristics set in step S21 to obtain the coupling capacitances $C_{c1}$ to $C_{c5}$ between the node N1 and the nodes N21 to N25, respectively, and the interconnect resistance of the node N1 by means other than measurement.

In step S23, on the other hand, the coupling capacitances $C_{c1}$ to $C_{c5}$ are obtained by measurement in the manner as described in the sixth preferred embodiment, using the CBCM circuit according to the sixth preferred embodiment in which the target capacitance forming part 2 has the multilayer interconnect structure shown in FIG. 21.

In step S24, the resistance of the interconnect resistance pattern 103 shown in FIG. 60 is measured using the existing Kelvin method (four-terminal method).

In step S25, comparisons (first comparison) are made between the simulated values of the coupling capacitances $C_{c1}$ to $C_{c5}$ obtained in step S22 and the measured values of the coupling capacitances $C_{c1}$ to $C_{c5}$ obtained in step S23, and a comparison (second comparison) is made between the simulated value of the interconnect resistance obtained in step S22 and the measured value of the interconnect resistance obtained in Step S24.

If both of the first and second comparison results of step S25 show agreement, the values set in step S21 are judged as being correct and the process is completed. If disagree, the process goes to step S26.

In step S26, the interconnection characteristics such as the film thickness and permittivity of the insulating layer 67 between upper and lower interconnect layers, and the interconnect film thickness are changed and reset in step S21.

Hereinafter, steps S21, S22, S25 and S26 are repeated until the comparisons of step S25 result in agreement. The measurement of steps S23 and S24 should be performed only once.

Accordingly, when agreement is obtained in step S25, accurate estimates of the interconnect film thickness of the node N1 in addition to the film thickness and permittivity of the insulating layer 67 can be obtained. This results in high-precision analysis of the interconnection characteristics.

As described above, the interconnection characteristics analysis method according to the seventeenth preferred embodiment achieves the high-precision analysis of the interconnection characteristics including the interconnect film thicknesses.

Figure 65:
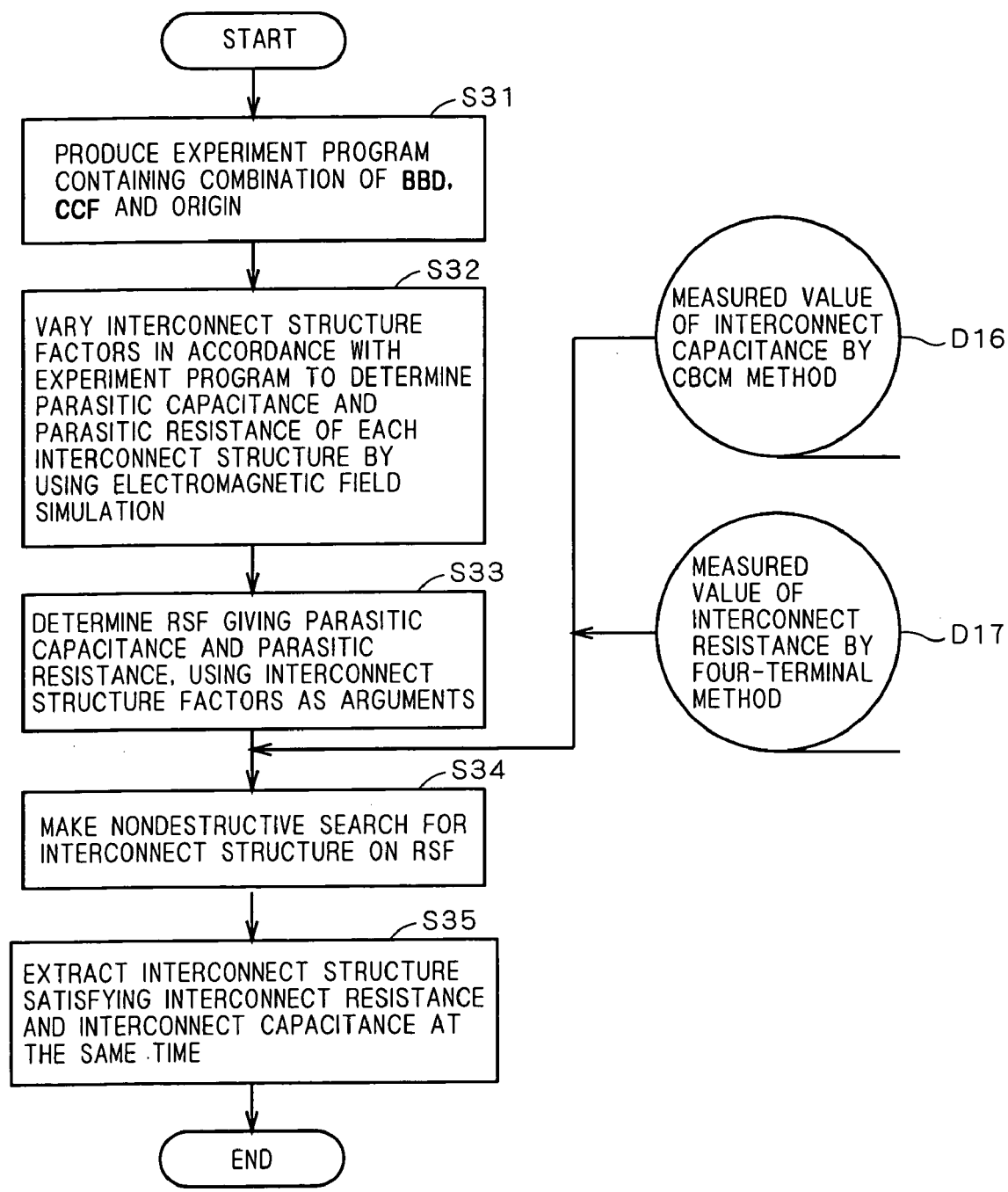
FIG. 65 is a flowchart showing an example of a changing process step shown in FIG. 64.

FIG. 65 is a flowchart showing an example of the changing process of step S26 of FIG. 64. A predetermined procedure thereof will be described with reference to FIG. 65.

Step S31 is to produce an experiment program containing a combination of a Box-Behnken design (BBD) which is one type of the experiment programs, a Central Composite Factorial (CCF) design and an origin (all factors are at level 0).

The levels may be three levels $\{-1, 0, 1\}$, five levels $\{-2, -1, 0, 1, 2\}$ or seven levels $\{-3, -2, -1, 0, 1, 2, 3\}$. The number of levels is not limited. The level 0 is a design value, and is generally a value listed in a design manual. The levels indicate deviations from the design value. The sign indicates whether the deviation from the design value is positive or negative, i.e., whether each level is greater or smaller than the design value. For example, assuming that the percentage of variation for one level is 5% when the five levels $\{-2, -1, 0, 1, 2\}$ are used, levels $-2, -1, 0, +1, +2$ correspond to $-10\%, -5\%, 0\%, +5\%, +10\%$, respectively.

Figure 66:
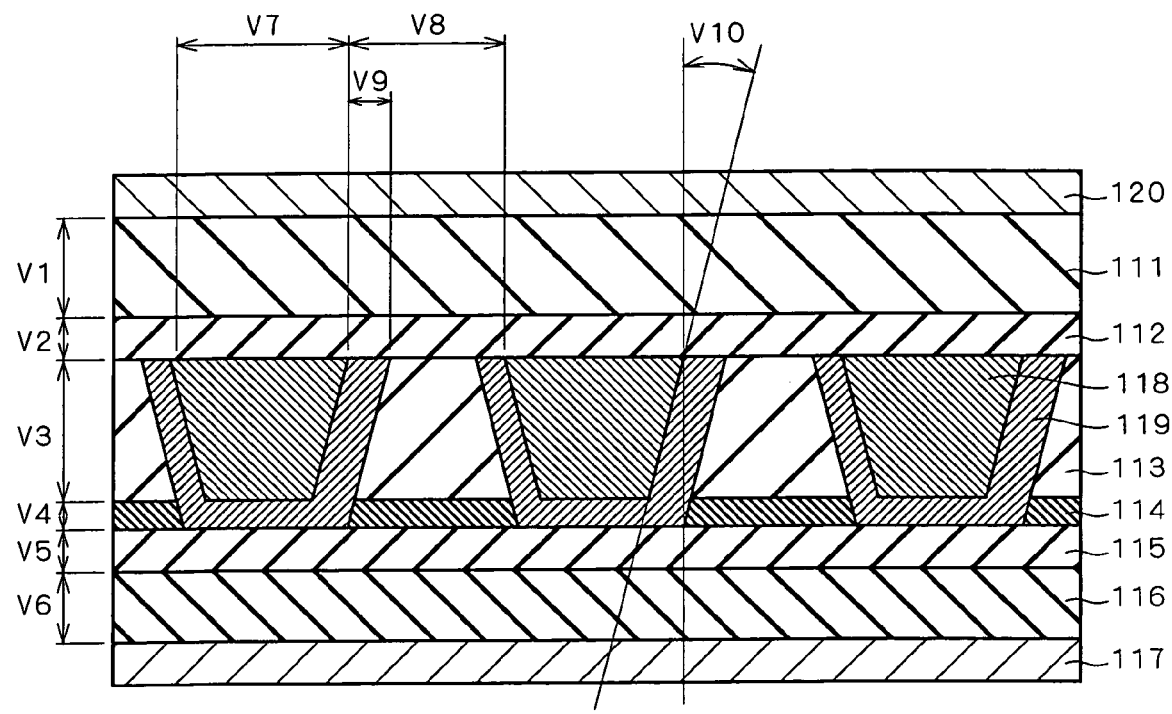
FIG. 66 schematically illustrates a cross-section of an interconnect structure.

FIG. 66 schematically illustrates a cross-section of an interconnect structure. As shown in FIG. 66, insulating films 116 to 111 are formed in order on a lower electrode 117, and an upper electrode 120 is formed on the insulating film 111. Interconnect layers 118 are formed in the insulating film 113, and are tapered so that an upper portion thereof is greater in interconnect width than a lower portion thereof. The upper portions of the interconnect layers 118 are in contact with the insulating film 112.

Barrier metal layers 119 are formed in the insulating films 113 and 114 so as to cover the side and bottom surfaces of the respective interconnect layers 118. Each of the barrier metal layers 119 has an upper surface in contact with the insulating film 112, and a lower surface in contact with the insulating film 115.

With such an arrangement, factors V1 to V10 are determined as follows: the insulating film thickness V1 is the thickness of the insulating film 111; the insulating film thickness V2 is the thickness of the insulating film 112; the insulating film thickness V3 is the thickness of the insulating film 113; the insulating film thickness V4 is the thickness of the insulating film 114; the insulating film thickness V5 is the thickness of the insulating film 115; the insulating film thickness V6 is the thickness of the insulating film 116; the interconnect width V7 is the interconnect width of the interconnect layers 118; the interconnect spacing V8 is a spacing between upper portions of adjacent interconnect layers 118; the barrier metal film thickness V9 is the film thickness of the barrier metal layers 119; and the taper angle V10 is the angle of a side surface of the interconnect layers 118 extending from the lower surface to the upper surface.

As described above, the factors representing the interconnect structure include the interconnect width, the interconnect spacing, the interconnect film thickness, the taper angle of the interconnect lines, the barrier metal film thickness, and the insulating film thicknesses and permittivities (relative permittivities). As an example, the relative permittivities are fixed values herein, and other factors are denoted as V1 to V10 as described above.

Next, the process goes to step S32 of determining a parasitic capacitance and a parasitic resistance. In step S32, the ten factors V1 to V10 shown in FIG. 66 are varied in accordance with the experiment program, the details of which will be described below.

FIG. 67 illustrates the experiment program based on the three-level, ten-factor Box-Behnken design. The experiment program shown in FIG. 67 is used in step S32.

Assuming that the percentage of variation for one level is 10%, the factors V1 and V2 are thicknesses deviated by $-10\%$ from the design values, the factors V3, V4, V6, V8, V9 and V10 remain at the design values, and the factors V5 and V7 are thicknesses deviated by $-10\%$ from the design values, for example, in the interconnect structure 1 listed in the experiment program of FIG. 67. The interconnect structures are produced in accordance with the experiment program, and the parasitic capacitance and parasitic resistance corresponding thereto are calculated, for example, by using an electromagnetic field simulation.

Next, a response surface function (RSF) which gives the parasitic capacitance and the parasitic resistance is determined using the interconnect structure factors as arguments in step S33. For example, the response surface function in the form of a polynomial of the second degree is given by $$RSF = a_0 + \sum_{i=1}^{n}(a_i x_i + a_{ij} x_i^2) + \sum_{i<j}^{n}(a_{ij} x_i x_j) \tag{55}$$

where $a_0, \ldots, a_i, \ldots, a_{ij}, \ldots$ are coefficients of the response surface function, and $x_i$, $x_j$ are factors normalized using the design value. Therefore, $x_i$ varies in the range from $-1$ to $+1$. For normalization of the factors, for example, during the determination of the response surface function of the interconnect capacitance, the inverse of the normalized value is used for the factors regarding the thicknesses V1, V2, V5 and V6 of the interlayer insulating films and the factor V8 regarding the interconnect spacing shown in FIG. 66. Specifically, $x_1$=D1/V1, $x_2$=D2/V2, $x_5$=D5/V5, $x_6$=D6/V6, and $x_8$=D8/V8 where D1, D2, D5, D6 and D8 are design values. This is because the interconnect capacitance is inversely proportional to the distance between electrodes. On the other hand, the factors V3 and V4 regarding the insulating films in which the interconnect lines are formed are normally normalized. Specifically, $x_3$=V3/D3 and $x_4$=V4/D4 where D3 and D4 are design values. This is because the interconnect capacitance between identical layers is proportional to the interconnect film thickness (=V3+V4).

Other factors may be arbitrarily normalized. It is empirically known that the RSF accuracy is higher when the factors are determined in the above-mentioned manner of normalization than when all factors are determined by conventional normalization. Another normalization may be used to determine the response surface function of the interconnect resistance.

The coefficient a of the RSF is extracted so as to represent the simulated value of the interconnect capacitance or the interconnect resistance for each interconnect structure. The extraction algorithm used herein is a commonly used one. For example, a nonlinear least squares method (Modified Levenberg-Marquardt method) is used herein as the extraction algorithm.

Next, step S34 is to give the measured value D16 of the interconnect capacitance by the CBCM method and the measured value D17 of the interconnect resistance by the four-terminal method to the left-hand side of the response surface function RSF of the interconnect resistance and the interconnect capacitance in accordance with each interconnect structure to make a search for the interconnect structure factors V1 to V10 satisfying both of them at the same time. The term "nondestructive" in step S34 means that the interconnect structure is extracted from the interconnect resistance and the interconnect capacitance without breaking the wafer, unlike the extraction of the film thicknesses of the interconnect lines, the interconnect width, the interconnect spacing, the film thickness of the barrier metal, and the taper angle of the interconnect lines from the SEM photographs of the cross sections of the interconnect structure.

A known optimization algorithm may be used as a search engine. For example, simulated annealing or genetic algorithm is used as the search engine.

Next, the interconnect structure factors V1 to V10 satisfying the interconnect resistance and the interconnect capacitance at the same time are extracted in a collective manner in step S35.

Although the structure search for one pattern (a combination of the interconnect width and the interconnect spacing) of one interconnect layer is described in the above example, a collective interconnect structure search may be performed on a plurality of patterns when one interconnect layer includes the plurality of patterns which in turn are present in a plurality of interconnect layers.

(Advantage of Collective Extraction of Interconnect Resistance and Interconnect Capacitance)

FIG. 68 illustrates adjacent interconnect models. As shown in FIG. 68, two metal interconnect lines 121 and 122 are formed, with the interconnect spacing WS therebetween. The interconnect resistance R of the metal interconnect line 122 is given by $$R = \rho \frac{WL \times WH}{W1} \tag{56}$$

where WL is the interconnect width, WS is the interconnect spacing, WH is the interconnect film thickness, W1 is the interconnect length (in the depth direction), and $\rho$ is the resistivity.

It is found from the equation (56) that the interconnect resistance R among the interconnect structure factors has a high sensitivity in proportion to the interconnect width WL and the interconnect film thickness WH.

On the other hand, the interconnect capacitance C between identical layers which is dominant among the interconnect parasitic capacitances is given by $$C = \varepsilon \frac{WH \times W1}{WS} \tag{57}$$

where $\varepsilon$ is the permittivity.

It is found from the equation (57) that the interconnect capacitance C has a high sensitivity in proportion to the interconnect film thickness WH and in inverse proportion to the interconnect spacing WS.

The interconnect capacitance C is insensitive to only the interconnect width WL among the interconnect structure factors WL, WH and WS, and the extraction accuracy of the interconnect width WL is lowered. This means that the calculation of the interconnect resistance using the interconnect structure extracted from only the interconnect capacitance lowers the accuracy of reproduction of the measured interconnect resistance.

The interconnect resistance, on the other hand, is insensitive to only the interconnect spacing WS, and the extraction accuracy of the interconnect spacing WS is lowered. This means that the calculation of the interconnect capacitance using the interconnect structure extracted from only the interconnect resistance lowers the accuracy of reproduction of the measured interconnect capacitance.

For accurate extraction of all of the interconnect structure factors WL, WH and WS, it is better to extract the interconnect structure factors in a collective manner so as to satisfy the interconnect resistance and the interconnect capacitance at the same time.

The technique of extracting the interconnect structure which accurately reproduces the measured interconnect capacitance and interconnect resistance is applicable to compound semiconductor substrates such as a SOI (Silicon On Insulator) substrate, a SON (Silicon On Nothing) substrate, a GaN substrate, a GaAs substrate, and an InP substrate in place of the silicon substrate in the seventeenth preferred embodiment.

EIGHTEENTH PREFERRED EMBODIMENT (Prerequisite)

With the size reduction of semiconductor elements, the AC verification accuracy of SPICE (Simulation Program with Integrated Circuit Emphasis) parameters for use in a SPICE which is one of the circuit simulators is lowered in some cases by various impediments. Examples of the impediments include the increase in parasitic capacitance of other than transistors (a first impediment), and the increase in error factors (a second impediment) resulting from deviations (including mask misalignment) of transistor shapes (such as active region, gate, contact shapes) from ideal values.

The interconnect capacitance (a capacitance between multilayer interconnect lines, a capacitance between a contact and a multilayer interconnect line, and a contact-to-gate capacitance) forms a significantly increasing proportion of a standard cell.

For example, in the 90-nm technology generation, this proportion is 20 to 50% although it depends also on the driving capability of the cell.

To be precise, the observation of the transistor shapes necessitates the use of the cross-sectional SEM. This is, however, disadvantageous in involving the need to destroy the wafer and in requiring much time for analysis.

The AC verification of the SPICE parameters is generally performed by using a ring oscillator to verify the oscillation frequency thereof, and the like. The loads on the ring oscillator include three parasitic capacitances: (A) a driving cell drain junction capacitance; (B) an interconnect capacitance (a capacitance between multilayer interconnect lines, a capacitance between a contact and a multilayer interconnect line, and a contact-to-gate capacitance) which connects a driving cell drain and a load cell gate; and (C) a load cell gate capacitance. The parasitic capacitance denoted by (B) corresponds to the first impediment, and the parasitic capacitances denoted by (A) and (C) correspond to the second impediment. If information about the degree of deviations of the measurements of the total capacitance of (A), (B) and (C) from the model (SPICE/LPE (Layout Parameter Extraction)) is obtained, the AC verification of the SPICE parameters can be performed with high accuracy based on the information without the need to separately measure the three parasitic capacitances (A), (B) and (C).

(CBCM Circuit According to Eighteenth Preferred Embodiment)

Figure 69:
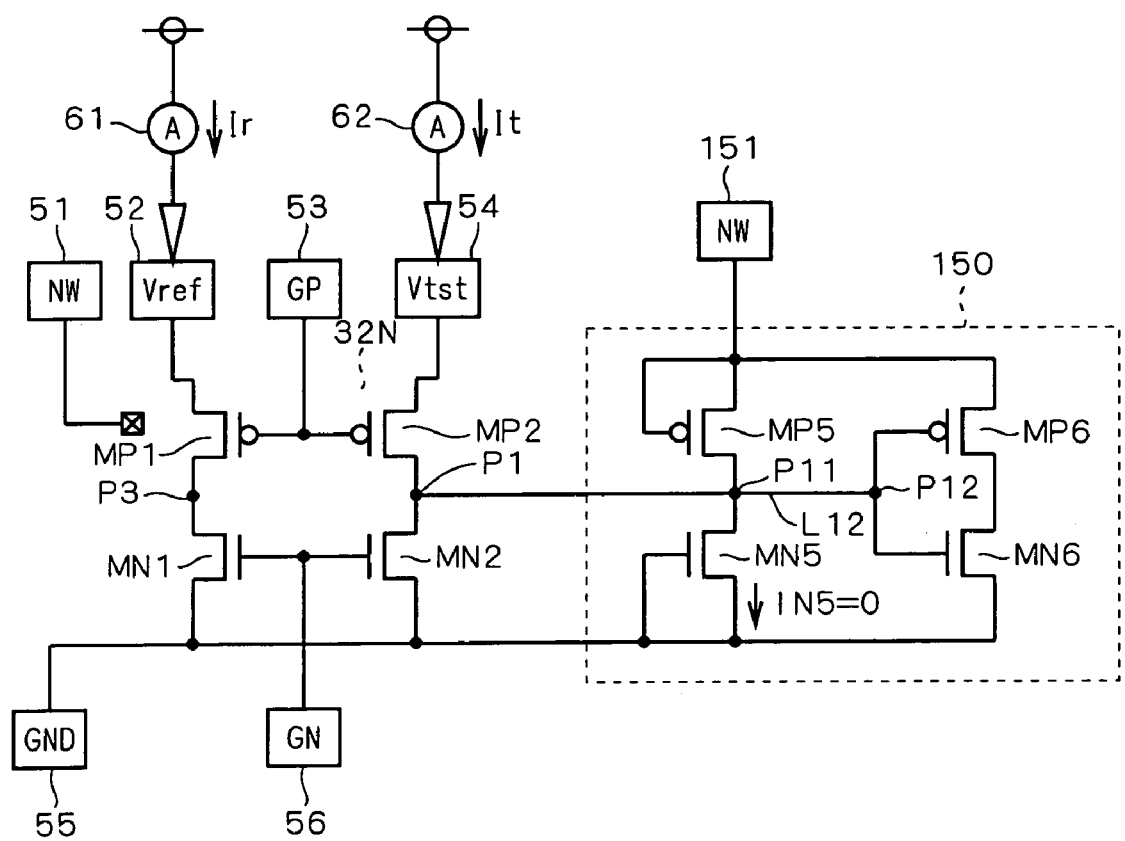
FIG. 69 is a circuit diagram showing a CBCM circuit according to an eighteenth preferred embodiment of the present invention.

FIG. 69 is a circuit diagram showing a CBCM circuit according to an eighteenth preferred embodiment of the present invention. As shown in FIG. 69, a ring load part 150 constituting a ring oscillator is connected to the terminal P1 between the drain of the PMOS transistor MP2 and the drain of the NMOS transistor MN2 in the CBCM circuit according to the eighteenth preferred embodiment.

The ring load part 150 includes a first inverter having a PMOS transistor MP5 and an NMOS transistor MN5, and a second inverter having a PMOS transistor MP6 and an NMOS transistor MN6.

The source and gate of the PMOS transistor MP5 are electrically connected to a pad 151, and the source and gate of the NMOS transistor MN5 are connected to the pad 55. A terminal P11 between the drain of the PMOS transistor MP5 and the drain of the NMOS transistor MN5 is connected to a terminal P12 which is a common gate terminal of the PMOS transistor MP6 and the NMOS transistor MN6. The source of the PMOS transistor MP6 is connected to the pad 151, and the source of the NMOS transistor MN6 is connected to the pad 55. The potential NW (fixed at the power source potential $V_{dd}$) is applied to the pad 151. The pad 51 may be used in place of the pad 151.

The PMOS transistors MP1, MP2, the NMOS transistors MN1, MN2, the pads 51 to 56, the current meters 61 and 62 and the like according to the eighteenth preferred embodiment are identical with those of the CBCM circuit according to the first preferred embodiment shown in FIG. 1, and will not be described. A dummy capacitance (not shown in FIG. 69) accompanies the terminal P3, as in the first preferred embodiment.

The ring load part 150, which is formed to measure the three above-mentioned parasitic capacitances (A), (B) and (C), is not of such a circuit configuration that an actual ring oscillator is used to provide an odd number of inverters and the output of the inverter at the last stage is fed back to the input of the inverter at the first stage.

In such a configuration, the gate of the PMOS transistor MP5 constituting the first inverter is fixed at the power source potential $V_{dd}$ by the pad 151, and the gate of the NMOS transistor MN5 is fixed at the ground potential by the pad 55.

Thus, a current IN5 flowing through the NMOS transistor MN5 does not flow except leakage current, and may be regarded as substantially zero.

In the conventional technique, it is a common practice to connect the gates of the PMOS transistor MP5 and the NMOS transistor MN5 in common to each other to form a driving part of the ring load part in a floating state. This causes a problem to be described below. When the potential NW rises to the power source potential $V_{dd}$ during the capacitance measurement by the CBCM method, the gate-source capacitance of the PMOS transistor MP5 and the NMOS transistor MN5 causes the gate potential to transiently follow the potential NW. As a result, the gate terminals of the PMOS transistor MP5 and the NMOS transistor MN5 are at an intermediate potential, which causes the current IN5 that is not zero to flow through the NMOS transistor MN5.

The eighteenth preferred embodiment, however, solves the above-mentioned problem because the current IN5 flowing through the NMOS transistor MN5 is substantially zero as discussed above.

Therefore, using the CBCM method, the eighteenth preferred embodiment accurately detects the parasitic capacitance accompanying the ring load part 150, that is, the sum of the drain junction capacitance (the driving-side drain junction capacitance) of the PMOS transistor MP5 and the NMOS transistor MN5 in the ring load part 150, the interconnect capacitance between the terminals P11 and P12 (the interconnect capacitance connecting the driving-side drain and the load-side gate), and the gate capacitance (the load-side gate capacitance) of the PMOS transistor MP6 and the NMOS transistor MN6, thereby achieving the high-accuracy AC verification of the SPICE parameters.

Figure 70:
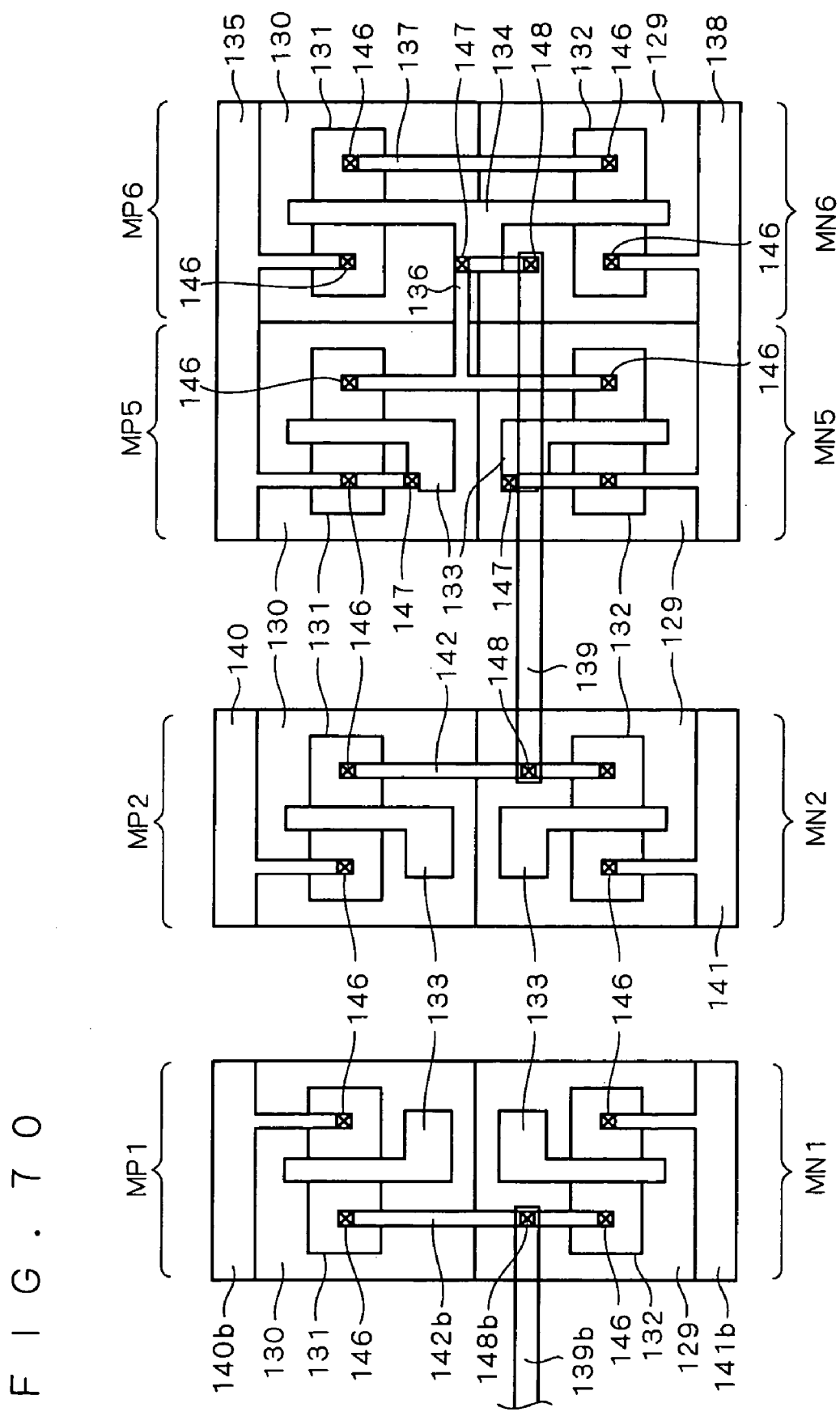
FIG. 70 illustrates a layout configuration for implementing the CBCM circuit shown in FIG. 69.

FIG. 70 illustrates a layout configuration for implementing the CBCM circuit shown in FIG. 69. As shown in FIG. 70, the PMOS transistors MP5 and MP6 are formed in an N well region 130, and the NMOS transistors MN5 and MN6 are formed in a P well region 129 in the ring load part 150.

The PMOS transistor MP5 is formed by a P-type active region 131 and a gate electrode region 133 formed in the N well region 130. The source and the gate electrode region 133 of the PMOS transistor MP5 are electrically connected through contact holes 146 and 147 in common to a first-level interconnect region 135. The drain of the PMOS transistor MP5 is electrically connected through a contact hole 146 to a first-level interconnect region 136. The first-level interconnect region 136 is electrically connected through a contact hole 148 to a second-level interconnect region 139.

The PMOS transistor MP6 is formed by a P-type active region 131 and a gate electrode region 134 formed in the N well region 130. The source of the PMOS transistor MP6 is electrically connected through a contact hole 146 to the first-level interconnect region 135. The gate electrode region 134 of the PMOS transistor MP6 is electrically connected through a contact hole 147 to the first-level interconnect region 136. The drain of the PMOS transistor MP6 is electrically connected through a contact hole 146 to a first-level interconnect region 137.

The NMOS transistor MN5 is formed by an N-type active region 132 and a gate electrode region 133 formed in the P well region 129. The source and the gate electrode region 133 of the NMOS transistor MN5 are electrically connected through contact holes 146 and 147 in common to a first-level interconnect region 138. The drain of the NMOS transistor MN5 is electrically connected through a contact hole 146 to the first-level interconnect region 136.

The NMOS transistor MN6 is formed by an N-type active region 132 and a gate electrode region 134 formed in the P well region 129. The source of the NMOS transistor MN6 is electrically connected through a contact hole 146 to the first-level interconnect region 138. The NMOS transistor MN6 shares the gate electrode region 134 with the PMOS transistor MP6. The drain of the NMOS transistor MN6 is electrically connected through a contact hole 146 to the first-level interconnect region 137.

The PMOS transistor MP2 is formed in an N well region 130, and is constructed by a P type active region 131 and a gate electrode region 133. The source of the PMOS transistor MP2 is electrically connected through a contact hole 146 to a first-level interconnect region 140. The drain of the PMOS transistor MP2 is electrically connected through a contact hole 146 to a first-level interconnect region 142.

The NMOS transistor MN2 is formed in a P well region 129, and is constructed by an N type active region 132 and a gate electrode region 133. The source of the NMOS transistor MN2 is electrically connected through a contact hole 146 to a first-level interconnect region 141. The drain of the NMOS transistor MN2 is electrically connected through a contact hole 146 to the first-level interconnect region 142. The first-level interconnect region 142 is electrically connected through a contact hole 148 to the second-level interconnect region 139.

The PMOS transistor MP1 and the NMOS transistor MN1 are basically similar in layout structure to the PMOS transistor MP2 and the NMOS transistor MN2. First-level interconnect regions 140b, 141b, 142b and a second-level interconnect region 139b correspond to the first-level interconnect regions 140, 141, 142 and the second-level interconnect region 139. A configuration for connecting the gates of the PMOS transistors MP1 and MP2 in common to each other and a configuration for connecting the gates of the NMOS transistors MN 1 and MN2 in common to each other are not shown in FIG. 70.

Although not shown in FIG. 70, a layout configuration equivalent to the PMOS transistors MP5 and MP6 and the NMOS transistors MN5 and MN6 may be formed as a dummy pattern on the side of the second-level interconnect region 139b of the PMOS transistor MP1 and the NMOS transistor MN1 so as not to be electrically connected to the second-level interconnect region 139b. This allows a dummy parasitic capacitance similar to that on the terminal P1 side to accompany the terminal P3 side.

The adoption of such a layout configuration implements the CBCM circuit shown in FIG. 69. This layout structure is implemented by separation of the gate structures in contrast to the conventional layout structure in which the gate is shared between the PMOS transistor MP5 and the NMOS transistor MN5. In other words, the layout structure is implemented by changing the gate structure of the PMOS transistor MP5 and the NMOS transistor MN5 and its associated contact hole positions from the conventional layout structure.

Furthermore, if an interconnect line (corresponding to an interconnect portion L12 of FIG. 69 and the first-level interconnect region 136 of FIG. 70) connecting the first and second inverters of the ring oscillator is long, an interconnect shape characterizing (extracting) facility capable of inserting a TEG for interconnect resistance between the terminals P11 and P12 may be mounted on the same chip as the CBCM circuit, thereby producing the effect of theoretically making the LPE accuracy zero.

SUPPLEMENTAL REMARKS

In the aforementioned tenth and other preferred embodiments, even if the silicon substrate 10 is replaced by other semiconductor substrates such as an SiC substrate, an SON (Silicon On Nothing) substrate, a GaN substrate, a GaAs substrate and an InP substrate, capacitance values such as the coupling capacitance $C_{sti}$ can be measured in a similar manner.

Further, while MOS transistors are employed as transistors constituting the CBCM circuits, they may be substituted by any other elements as long as the elements have a switching function, and the materials thereof are not a problem. For example, transistors formed into carbon nanotubes may be employed. Further, while the STI regions are employed as element isolation regions, the element isolation regions may be formed by any other element isolation techniques such as the LOCOS technique. In the present invention, parasitic capacitances that are formed between element isolation regions can be measured, irrespective of the types of the element isolation structure.

Still further, while in the aforementioned preferred embodiments, the diffusion regions are employed as active regions isolated by the STI regions, the diffusion regions may be either N-type impurity diffusion regions or P-type impurity diffusion regions (irrespective of the presence or absence of PN junctions at the interface). As another alternative, no impurity diffusion regions may be formed as active regions. Further, it goes without saying that the effect of the present invention can be achieved without forming metal silicide (such as $NiSi_2$, $CoSi_2$, $TiSi_2$, $PtSi_2$, $MoSi_2$, $ZrSi_2$) on the impurity diffusion regions.

While the invention has been shown and described in detail, the foregoing description is in all aspects illustrative and not restrictive. It is therefore understood that numerous modifications and variations can be devised without departing from the scope of the invention.

What is claimed is:

1. A capacitance measurement circuit comprising:
   first, second and third terminals, said first terminal being accompanied by a first capacitance including first and second capacitance components to be measured and a non-target capacitance component not to be measured, said third terminal being accompanied by a dummy capacitance operating as a dummy of said non-target capacitance component;
   a first current detector detecting a first current supplied to said first terminal;
   a second current detector detecting a second current induced from said second terminal;
   a third current detector detecting a third current supplied to said third terminal;
   a target capacitance forming section formed between said first terminal and said second terminal so that said first terminal is accompanied by said first capacitance component, said target capacitance forming section, said first to third terminals, and said first to third current detectors comprising a capacitance measurement section; and
   means coupled to the capacitance measurement section for providing a capacitance value of the second capacitance component by calculating the outputs of said first to third current detectors.

2. The capacitance measurement circuit according to claim 1, wherein said first to third current detectors include at least one transistor, said at least one transistor including a transistor which has a transistor characteristic of being less apt to cause a leakage current than an ordinary transistor which constitutes a logic circuit.

3. The capacitance measurement circuit according to claim 1, wherein said first to third current detectors include at least one transistor of a first conductivity type, said at least one transistor being formed in a well region of a second conductivity type, said well region being selectively formed in an upper layer of a bottom region of the first conductivity type.

4. The capacitance measurement circuit according to claim 1, wherein said first to third current detectors include first and second transistors of different conductivity types, said first and second transistors being formed in a semiconductor layer of an SOI substrate which is formed of a buried insulating layer and said semiconductor layer formed on said buried insulating layer, said first and second transistors being isolated from each other by an element isolation region which extends to said buried insulating layer.

5. The capacitance measurement circuit according to claim 1, wherein said capacitance measurement section includes first and second circuits, said first and second circuits each comprising said first to third terminals and said first to third current detectors, said first and second circuits respectively including, as said target capacitance forming section, first and second target capacitance forming sections which are different from each other, said first capacitance component includes first and second partial capacitance components, said first target capacitance forming section substantially includes said first and second partial capacitance components, and said second target capacitance forming section substantially includes only said second partial capacitance component.

6. The capacitance measurement circuit according to claim 5, wherein said first and second target capacitance forming sections include first and second measurement transistors, respectively, said first and second measurement transistors each having a gate electrode and a pair of electrode regions, said gate electrode being electrically connected to said second terminal, one of said pair of electrode regions being electrically connected to an interconnect layer which is electrically connected to said first terminal, said first partial capacitance component includes a coupling capacitance formed between said contact hole and said gate electrode, said second partial capacitance component includes a coupling capacitance formed between said gate electrode and said interconnect layer, in said first measurement transistor, a distance from said gate electrode to said contact hole is set to a length with which said first partial capacitance component is effective, and in said second measurement transistor, a distance from said gate electrode to said contact hole is set to a length with which said first partial capacitance component is ineffective.

7. The capacitance measurement circuit according to claim 5, wherein said first and second target capacitance forming sections include first and second measurement transistors, respectively, said first and second measurement transistors each having a gate electrode, and first and second electrode regions which are electrically connected through first and second contact holes to first and second interconnect layers which are electrically connected to said first and second terminals, respectively, said first partial capacitance component includes a coupling capacitance formed between said first and second contact holes, said second partial capacitance component includes a coupling capacitance formed between said first and second electrode regions, in said first measurement transistor, said first and second contact holes are formed such that said first partial capacitance component is effective, and in said second measurement transistor, at least one of said first and second contact holes is formed such that said first partial capacitance component is zero.

8. The capacitance measurement circuit according to claim 1, wherein the dummy capacitance has the same capacitance value as said non-target capacitance component.

* * * * *